(12) United States Patent
Yang et al.

(10) Patent No.: US 12,396,257 B2
(45) Date of Patent: Aug. 19, 2025

(54) INTEGRATED CIRCUIT INCLUDING INTEGRATED STANDARD CELL STRUCTURE

(71) Applicant: SAMSUNG ELECTRONICS CO., LTD., Suwon-si (KR)

(72) Inventors: Gi Young Yang, Seoul (KR); Hyeon Gyu You, Hwaseong-si (KR); Ga Room Kim, Hwaseong-si (KR); Jin Young Lim, Seoul (KR); In Gyum Kim, Bucheon-si (KR); Hak Chul Jung, Seoul (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 141 days.

(21) Appl. No.: 18/344,794

(22) Filed: Jun. 29, 2023

(65) Prior Publication Data

US 2023/0343788 A1  Oct. 26, 2023

Related U.S. Application Data

(62) Division of application No. 17/029,475, filed on Sep. 23, 2020, now Pat. No. 11,735,592.

(30) Foreign Application Priority Data

Dec. 20, 2019 (KR) .................. 10-2019-0171535
Jun. 8, 2020 (KR) .................. 10-2020-0069127

(51) Int. Cl.
*G11C 5/06* (2006.01)
*G06F 30/392* (2020.01)
(Continued)

(52) U.S. Cl.
CPC ......... *H10D 84/907* (2025.01); *G06F 30/392* (2020.01); *G11C 5/06* (2013.01);
(Continued)

(58) Field of Classification Search
CPC .... H10D 84/907; H10D 89/10; G06F 30/392; G11C 11/412
See application file for complete search history.

(56) References Cited

U.S. PATENT DOCUMENTS 8,816,402 B2 *  8/2014  Becker .................. H10B 10/00
                                                    257/211
9,367,654 B2    6/2016  Chang et al.
(Continued)

FOREIGN PATENT DOCUMENTS

KR    1020160025056 A    3/2016
KR    1020180038239 A    4/2018
(Continued)

OTHER PUBLICATIONS

US 9,886,540 B2, 02/2018, Sahu et al. (withdrawn)
Notice of Allowance in Korean Appln. No. 10-2020-0069127, mailed on Dec. 24, 2024, 6 pages (with English translation).

*Primary Examiner* — Jeff W Natalini
*Assistant Examiner* — Alexander Belousov
(74) *Attorney, Agent, or Firm* — Fish & Richardson P.C.

(57) ABSTRACT

An integrated circuit including a first active region and a second active region extending in a first direction and spaced apart from each other in a second direction intersecting the first direction; a power rail and a ground rail extending in the first direction and spaced apart from the first and second active regions and each other in the second direction; source/drain contacts extending in the second direction on at least a portion of the first or second active region, gate structures extending in the second direction and on at least a portion of the first and second active regions, a power rail configured to supply power through source/drain contact vias, and a ground rail configured to supply a ground voltage through source/drain contact vias.

14 Claims, 44 Drawing Sheets

(51) Int. Cl.
   *G11C 11/412*   (2006.01)
   *H01L 23/528*   (2006.01)
   *H10D 84/90*    (2025.01)
   *H10D 89/10*    (2025.01)

(52) U.S. Cl.
   CPC .......... *G11C 11/412* (2013.01); *H01L 23/528* (2013.01); *H10D 89/10* (2025.01)

(56) References Cited

U.S. PATENT DOCUMENTS

| | | |
|---|---|---|
| 9,837,353 B2 | 12/2017 | Shen et al. |
| 9,859,898 B1 | 1/2018 | Anderson et al. |
| 10,043,571 B1 | 8/2018 | Liaw |
| 10,068,806 B2 | 9/2018 | Pritchard et al. |
| 10,146,900 B2 | 12/2018 | Sahu et al. |
| 10,170,422 B2 | 1/2019 | Chen et al. |
| 10,510,688 B2 | 12/2019 | Sio et al. |
| 2014/0003133 A1 | 1/2014 | Lin et al. |
| 2016/0300839 A1 | 10/2016 | Kim et al. |
| 2017/0083653 A1 | 3/2017 | Sahu et al. |
| 2017/0154848 A1 | 6/2017 | Fan et al. |
| 2017/0236823 A1 | 8/2017 | Lee et al. |
| 2018/0108646 A1 | 4/2018 | Lee et al. |
| 2018/0158811 A1* | 6/2018 | Subhash ................ H10D 89/10 |
| 2019/0096891 A1 | 3/2019 | Liaw |
| 2019/0122987 A1 | 4/2019 | Chen et al. |
| 2019/0198491 A1 | 6/2019 | Do et al. |
| 2019/0206459 A1 | 7/2019 | Lu et al. |
| 2019/0319022 A1 | 10/2019 | Song et al. |
| 2019/0393205 A1 | 12/2019 | Lee et al. |
| 2020/0058681 A1 | 2/2020 | Lai et al. |
| 2020/0105768 A1 | 4/2020 | Liaw |
| 2020/0135741 A1 | 4/2020 | Liaw |
| 2020/0194058 A1 | 6/2020 | Hsu et al. |
| 2020/0321355 A1 | 10/2020 | Jeong et al. |
| 2020/0328216 A1 | 10/2020 | Liaw |
| 2021/0035986 A1 | 2/2021 | Yu et al. |
| 2021/0098466 A1 | 4/2021 | Liaw |
| 2021/0193683 A1 | 6/2021 | Yang et al. |

FOREIGN PATENT DOCUMENTS

| | | |
|---|---|---|
| KR | 1020180075017 A | 7/2018 |
| KR | 1020180101698 A | 9/2018 |

* cited by examiner

S_C(R3_3)

ize of patterns in a standard cell may be reduced,
INTEGRATED CIRCUIT INCLUDING INTEGRATED STANDARD CELL STRUCTURE This application is a division of U.S. application Ser. No. 17/029,475, filed Sep. 23, 2020, which claims priority from Korean Patent Application No. 10-2019-0171535 filed on Dec. 20, 2019, in the Korean Intellectual Property Office and from Korean Patent Application No. 10-2020-0069127 filed on Jun. 8, 2020, in the Korean Intellectual Property Office, the disclosures of which are incorporated herein by reference in their entireties.

BACKGROUND

1. Field of the Disclosure

The present disclosure relates to integrated circuits including an integrated standard cell structure.

2. Description of the Related Art

An integrated circuit may be designed based on standard cells. In more detail, a layout of the integrated circuit may be generated by arranging the standard cells according to data defining the integrated circuit and routing the arranged standard cells. Such standard cells are predesignated and stored in a cell library.

As semiconductor manufacturing processes are miniaturized, the size of patterns in a standard cell may be reduced, and the size of the standard cell may also be reduced.

SUMMARY

The present disclosure is directed to providing integrated circuits allowing the density of a layout to be improved, the stability of a process for manufacturing a semiconductor device to be improved, and the performance and reliability of a designed semiconductor device to be improved by routing source/drain through source/drain contacts.

However, aspects of the present inventive concepts are not restricted to the one set forth herein. The above and other aspects of the present inventive concepts will become more apparent to one of ordinary skill in the art to which the present inventive concepts pertains by referencing the detailed description of the present inventive concepts given below.

According to some example embodiments, there is provided an integrated circuit comprising a first active region and a second active region extending in a first direction and spaced apart from each other in a second direction intersecting the first direction; a power rail extending in the first direction and spaced apart from the first active region in the second direction; a ground rail extending in the first direction and spaced apart from the second active region and the power rail in the second direction; a first source/drain contact extending in the second direction, on at least a portion of the first active region, and configured to receive power from the power rail through a first source/drain contact via; a second source/drain contact extending in the second direction, on at least a portion of the second active region spaced apart from the first source/drain contact in the second direction, and connected to the ground rail through a second source/drain contact via to be grounded; a first gate structure extending in the second direction and on at least a portion of the first active region and at least a portion of the second active region spaced apart from the first source/drain contact and the second source/drain contact in the first direction; a third source/drain contact extending in the second direction and on at least a portion of the first active region and at least a portion of the second active region spaced apart from the first gate structure in the first direction; a second gate structure extending in the second direction and on at least a portion of the first active region spaced apart from the third source/drain contact in the first direction; a third gate structure extending in the second direction and on at least a portion of the second active region spaced apart from the third source/drain contact in the first direction and spaced apart from the second gate structure in the second direction; a fourth source/drain contact on at least a portion of the first active region and at least a portion of the second active region spaced apart from the second gate structure and the third gate structure in the first direction; a fourth gate structure extending in the second direction and on at least a portion of the first active region spaced apart from the fourth source/drain contact in the first direction; a fifth gate structure extending in the second direction and on at least a portion of the second active region spaced apart from the fourth source/drain contact in the first direction and spaced apart from the fourth gate structure in the second direction; a fifth source/drain contact on at least a portion of the first active region and at least a portion of the second active region spaced apart from the fourth gate structure and the fifth gate structure in the first direction; a sixth gate structure extending in the second direction and on at least a portion of the first active region and at least a portion of the second active region spaced apart from the fifth source/drain contact in the first direction; a sixth source/drain contact extending in the second direction and on at least a portion of the first active region spaced apart from the sixth gate structure in the first direction; and a seventh source/drain contact extending in the second direction and on at least a portion of the second active region spaced apart from the sixth gate structure in the first direction and spaced apart from the sixth source/drain contact in the second direction.

According to some example embodiments, there is provided an integrated circuit comprising a first inverter including a first p-channel metal-oxide-semiconductor transistor and a first n-channel metal-oxide-semiconductor transistor, which are gated through a first metal line to which a first input voltage is configured to be applied, and configured to output a first inverted voltage by inverting the first input voltage, wherein a drain of the first NMOS transistor and a drain of the first PMOS transistor are routed through a first source/drain contact, a first metal line extends in a first direction, and the first source/drain contact extends in a second direction perpendicular to the first direction; a first transmission gate including a second PMOS transistor gated through a second metal line to which a first active voltage is configured to be applied and a second NMOS transistor gated through a third metal line to which a second active voltage is configured to be applied, wherein a source of the second PMOS transistor and a drain of the second NMOS transistor are routed through the first source/drain contact, and a drain of the second PMOS transistor and a source of the second NMOS transistor are routed through the second source/drain contact; and a first tri-state inverter including a third PMOS transistor gated through a fourth metal line to which the second active voltage is configured to be applied, a third NMOS transistor gated through a fifth metal line to which the first active voltage is configured to be applied, and a fourth PMOS transistor and a fourth NMOS transistor, which are gated through a sixth metal line to which a second input voltage is configured to be applied, and configured to invert the second input voltage, wherein a drain of the third PMOS transistor and a drain of the third NMOS transistor are routed through the second source/drain contact.

According to some example embodiments, there is provided an integrated circuit comprising a first inverter configured to invert a first input voltage and output a first inverted voltage; a first transmission gate configured to receive the first inverted voltage; a second inverter configured to invert a second input voltage and output a second inverted voltage; and a second transmission gate configured to receive the second inverted voltage, wherein the first transmission gate includes a first n-channel metal-oxide-semiconductor transistor and a first p-channel metal-oxide-semiconductor transistor that are spaced apart from each other in a first direction, wherein a drain of the first NMOS transistor and a source of the first PMOS transistor are connected through a first source/drain contact extending in a second direction, which intersects the first direction and the first transmission gate receives the first inverted voltage through the first source/drain contact, the second transmission gate includes a second NMOS transistor and a second PMOS transistor that are spaced apart from each other in the first direction, wherein a drain of the second NMOS transistor and a source of the second PMOS transistor are connected through a second source/drain contact extending in the second direction and the second transmission gate receives the second inverted voltage through the second source/drain contact, a source of the first NMOS transistor, a drain of the first PMOS transistor, a source of the second NMOS transistor, and a drain of the second PMOS transistor are connected to each other through a third source/drain contact extending in the second direction, the first NMOS transistor and the second PMOS transistor are gated by a first active voltage, and the first PMOS transistor and the second NMOS transistor are gated by a second active voltage.

BRIEF DESCRIPTION OF THE DRAWINGS

The above and other aspects and features of the present disclosure will become more apparent by describing example embodiments thereof in detail with reference to the attached drawings, in which.

DETAILED DESCRIPTION

Figure 1:
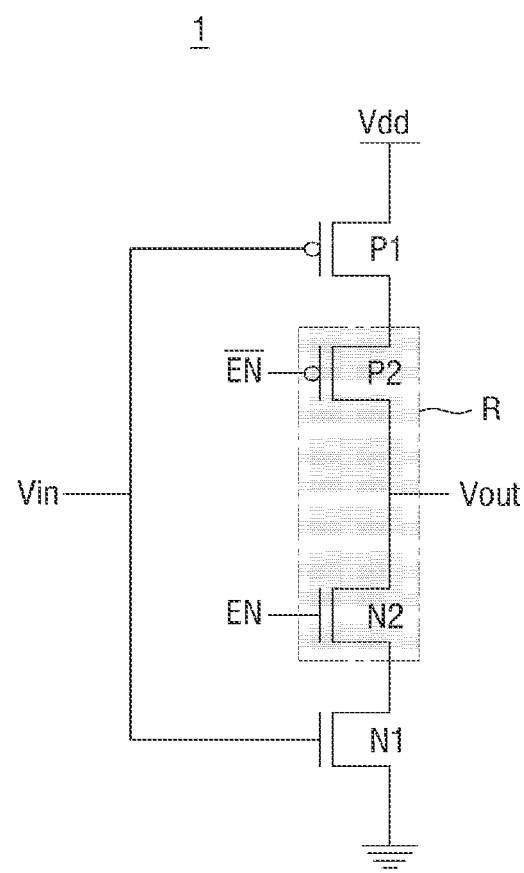
FIG. 1 is a circuit diagram for describing a tri-state inverter according to some example embodiments.

FIG. 1 is a circuit diagram for describing a tri-state inverter according to some example embodiments.

Referring to FIG. 1, a tri-state inverter 1 includes a first p-channel metal-oxide-semiconductor (PMOS) transistor P1, a second PMOS transistor P2, a first n-channel metal-oxide-semiconductor (NMOS) transistor N1, and a second NMOS transistor N2.

A source of the first PMOS transistor P1 is connected to a power voltage VDD, and a drain of the first PMOS transistor P1 is connected to a source of the second PMOS transistor P2. A drain of the second PMOS transistor P2 is connected to a drain of the second NMOS transistor N2, and a source of the second NMOS transistor N2 is connected to a drain of the first NMOS transistor N1. A source of the first NMOS transistor N1 is grounded.

The first PMOS transistor P1 and the first NMOS transistor N1 are gated by an input voltage Vin. The second PMOS transistor P2 is gated by an inverted active signal EN. The second NMOS transistor N2 is gated by an active signal EN.

That is, when the active signal EN is at a logic high level, the tri-state inverter 1 inverts the input voltage and outputs the inverted input voltage as an output voltage Vout. In contrast, when the active signal EN is at a logic low level, the tri-state inverter 1 is in a high impedance as the output voltage Vout.

Figure 2:
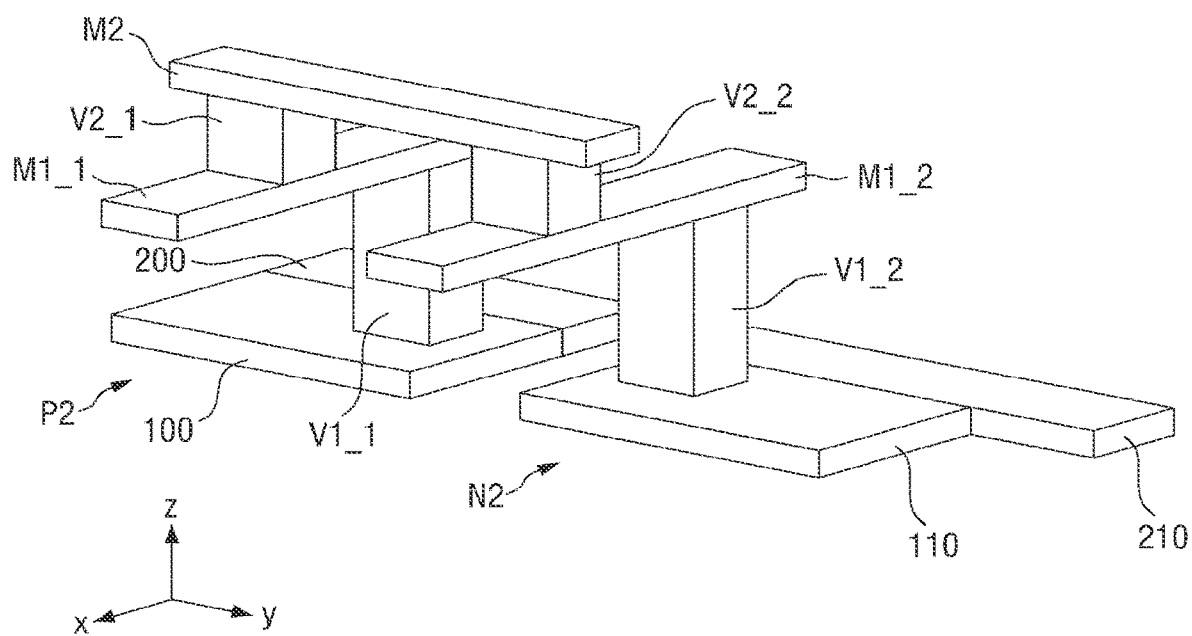
FIG. 2 is a perspective view for describing the region R of the tri-state inverter shown in FIG. 1 according to some example embodiments.
Figure 3:
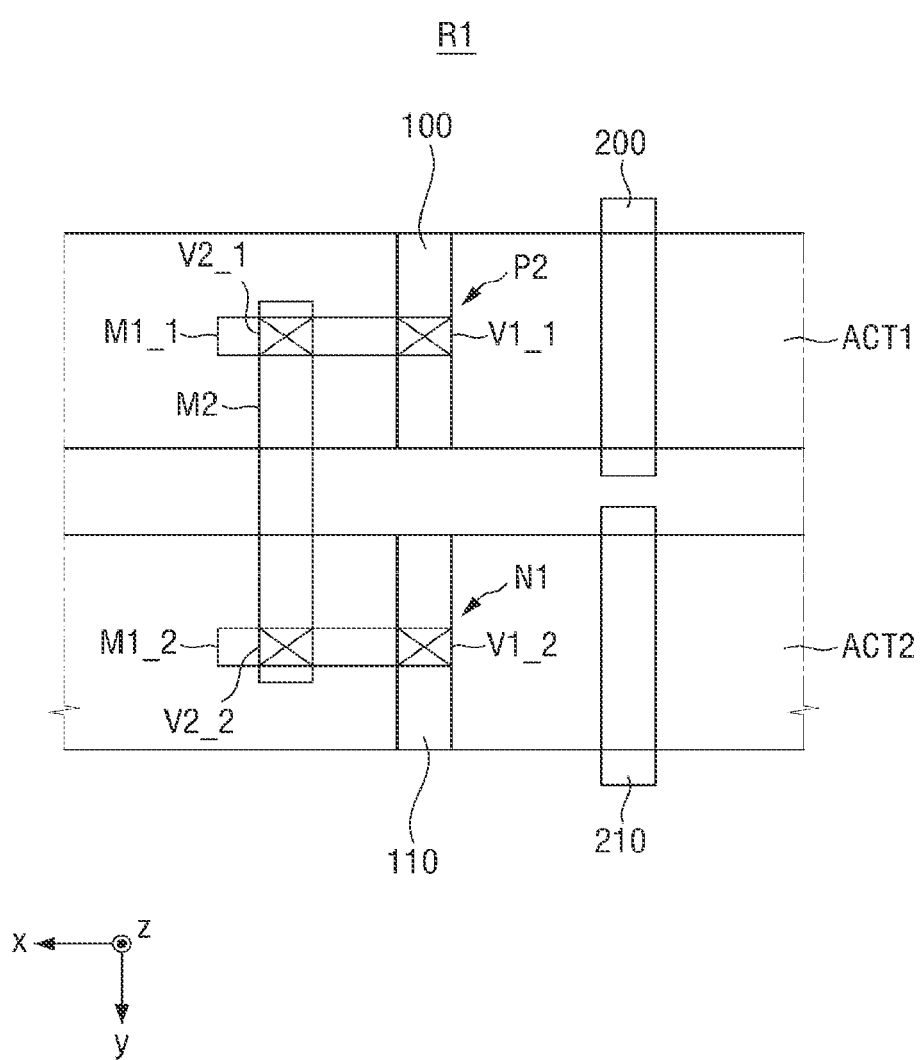
FIG. 3 is a layout diagram for describing the region R of the tri-state inverter shown in FIG. 1 according to some example embodiments.

The drain of the second PMOS transistor P2 is connected to the drain of the second NMOS transistor N2 in anode at which the tri-state inverter 1 outputs the output voltage VOUT, and the region is defined as a region R. Referring to FIGS. 2 and 3, a connection state of the region R will be described.

FIG. 2 is a perspective view for describing the region R of the tri-state inverter shown in FIG. 1 according to some example embodiments.

Referring to FIG. 2, a region R1 for the region R may be largely composed of three layers in a third direction z.

The lowest layer in the third direction z includes a first PMOS transistor gate structure 200 and a first source/drain contact 100 that constitute the second PMOS transistor P2. In addition, the lowest layer includes a first NMOS transistor gate structure 210 and a second source/drain contact 110 that constitute the second NMOS transistor N2.

In order to electrically connect the first source/drain contact 100 to the second source/drain contact 110, a first_first via V1_1 and a first_second via V1_2 extending in the third direction z are disposed in the region R1. The first_first via V1_1 and the first_second via V1_2 are connected to the first source/drain contact 100 and the second source/drain contact 110, respectively.

In order to electrically connect the first source/drain contact 100 to the second source/drain contact 110, a first_first metal line M1_1 and a first_second metal line M1_2 extending in a first direction x are disposed in the region R1 in a middle-height layer in the third direction z. The first_first metal line M1_1 and the first_second metal line M1_2 are connected to the first_first via V1_1 and the first_second via V1_2, respectively.

In order to electrically connect the first source/drain contact 100 to the second source/drain contact 110, a second_first via V2_1 and a second_second via V2_2 extending in the third direction z are disposed in the region R1. The second_first via V2_1 and the second_second via V2_2 are connected to the first_first metal line M1_1 and the first_second metal line M1_2, respectively.

In order to electrically connect the first source/drain contact 100 to the second source/drain contact 110, a second metal line M2 extending in the first direction x is disposed in the region R1 in the highest layer in the third direction z. The second metal line M2 connects the second_first via V2_1 to the second_second via V2_2.

That is, the region R1 for the region R is formed of a total of three layers in the third direction z to allow the drain of the second PMOS transistor P2 to be connected to the drain of the second NMOS transistor N2.

A layout diagram of the region R1 will be described with reference to FIG. 3.

FIG. 3 is a layout diagram for describing the region R of the tri-state inverter shown in FIG. 1.

Referring to FIG. 3, a first active region ACT1 defined by extending in the first direction x is disposed in the region R1. In addition, a second active region ACT2 defined by extending in the first direction x is disposed in the region R1. The first active region ACT1 may be a region in which a p-type transistor is formed. For example, the first active region ACT1 may include a well region doped with n-type impurities. The second active region ACT2 may be a region in which an n-type transistor is formed. For example, the second active region ACT2 may include a well region doped with p-type impurities. The first active region ACT1 and the second active region ACT2 may be disposed to be spaced apart from each other in a second direction y.

The first PMOS transistor gate structure 200 may be disposed on the first active region ACT1 at the lowest height in the third direction z. The first source/drain contact 100 may be disposed to be spaced apart from the first PMOS transistor gate structure 200 in the first direction x. The first_first via V1_1 extending in the third direction z may be disposed on the first source/drain contact 100. The first_first metal line M1_1 extending in the first direction x may be disposed on the first_first via V1_1. The second_first via V2_1 extending in the third direction z is connected to the first_first metal line M1_1.

The first NMOS transistor gate structure 210 may be disposed on the second active region ACT2 at the lowest height in the third direction z. The second source/drain contact 110 may be disposed to be spaced apart from the first NMOS transistor gate structure 210 in the first direction x. The first_second via V1_2 extending in the third direction z may be disposed on the second source/drain contact 110. The first_second metal line M1_2 extending in the first direction x may be disposed on the first_second via V1_2. The second_second via V2_2 extending in the third direction z is connected to the first_second metal line M1_2.

Subsequently, the first source/drain contact 100 is electrically connected to the second source/drain contact 110 by connecting the second_first via V2_1 to the second_second via V2_2 and disposing the second metal line M2 which extends in the second direction y.

As described above with reference to the region R1, in order to connect a plurality of source/drain contacts, a structure connected with the height of largely three layers in the third direction z is required. That is, as the height of the layers increases, the stability of the process of designing a semiconductor integrated circuit may be degraded. In addition, the degree of freedom of a metal line may be reduced, and pin congestion may be increased.

Accordingly, in some example embodiments for the region R as shown in FIG. 1, a plurality of source/drain contacts may be connected while lowering the height of layers like in a region R2 to be described below with reference to FIGS. 4 and 5.

Figure 4:
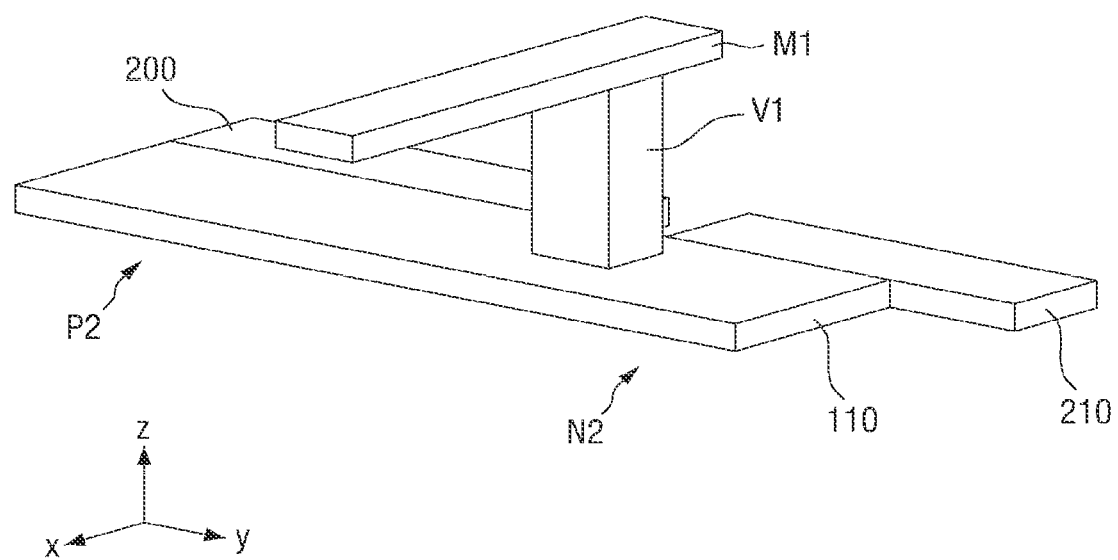
FIG. 4 is a perspective view for describing the region R of the tri-state inverter shown in FIG. 1 according to some example embodiments.

FIG. 4 is a perspective view for describing the region R of the tri-state inverter shown in FIG. 1 according to some example embodiments.

Referring to FIG. 4, a region R2 for the region R may be largely composed of two layers in a third direction z.

The lowest layer in the third direction z includes a first PMOS transistor gate structure 200 constituting the second PMOS transistor P2. In addition, the lowest layer includes a first NMOS transistor gate structure 210 constituting the second NMOS transistor N2.

Unlike the region R1 described above, the region R2 according to some example embodiments connects the second PMOS transistor P2 to the second NMOS transistor N2 through one first source/drain contact 100. Subsequently, a first via V1 extending in the third direction z is disposed in the region R2. A first metal line M1 extending in a first direction x is disposed on the first via V1.

That is, the region R2 for the region R is formed of a total of two layers in the third direction z to allow the drain of the second PMOS transistor P2 to be connected to the drain of the second NMOS transistor N2.

A layout diagram of the region R2 will be described with reference to FIG. 5.

Figure 5:
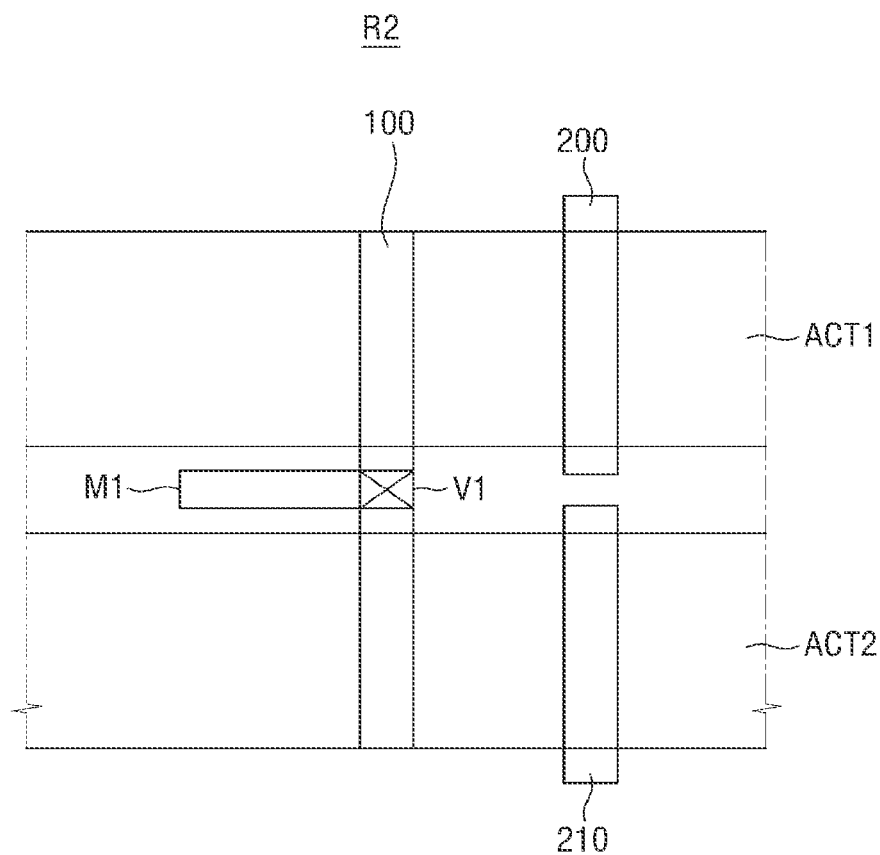
FIG. 5 is a layout diagram for describing the region R of the tri-state inverter shown in FIG. 1 according to some example embodiments.

FIG. 5 is a layout diagram for describing the region R of the tri-state inverter shown in FIG. 1.

Referring to FIG. 5, a first active region ACT1 defined by extending in the first direction x is disposed in the region R2. In addition, a second active region ACT2 defined by extending in the first direction x is disposed in the region R2. The first active region ACT1 may be a region in which a p-type transistor is formed. For example, the first active region ACT1 may include a well region doped with n-type impurities. The second active region ACT2 may be a region in which an n-type transistor is formed. For example, the second active region ACT2 may include a well region doped with p-type impurities. The first active region ACT1 and the second active region ACT2 may be disposed to be spaced apart from each other in a second direction y.

The first PMOS transistor gate structure 200 may be disposed on the first active region ACT1 at the lowest height in the third direction z. The first NMOS transistor gate structure 210 may be disposed on the second active region ACT2 at the lowest height in the third direction z. Subsequently, the second PMOS transistor P2 is connected to the second NMOS transistor N2, and the first source/drain contact 100 extending in the second direction y is disposed. The first source/drain contact 100 may be disposed to be spaced apart from the first PMOS transistor gate structure 200 and the first NMOS transistor gate structure 210 in the first direction x. The first via V1 extending in the third direction z is connected to the first source/drain contact 100. The first metal line M1 extending in the first direction x may be disposed on the first via V1 to electrically connect the second PMOS transistor P2 to the second NMOS transistor N2.

As described above with reference to the region R2, in order to connect a plurality of source/drain contacts, a structure connected with the height of largely two layers in the third direction z is required. That is, as the height of the layers is lowered, the stability of the process of designing a semiconductor integrated circuit may be improved. In addition, the degree of freedom of a metal line may be increased, and pin congestion may be reduced.

Of course, the above-described circuit diagram, layout diagram, and perspective view of the tri-state inverter are not limited to those illustrated in the drawings and may be connected to each other in various ways.

Hereinafter, an integrated circuit according to some example embodiments including the connection method of the region R2 described above will be described.

Figure 6:
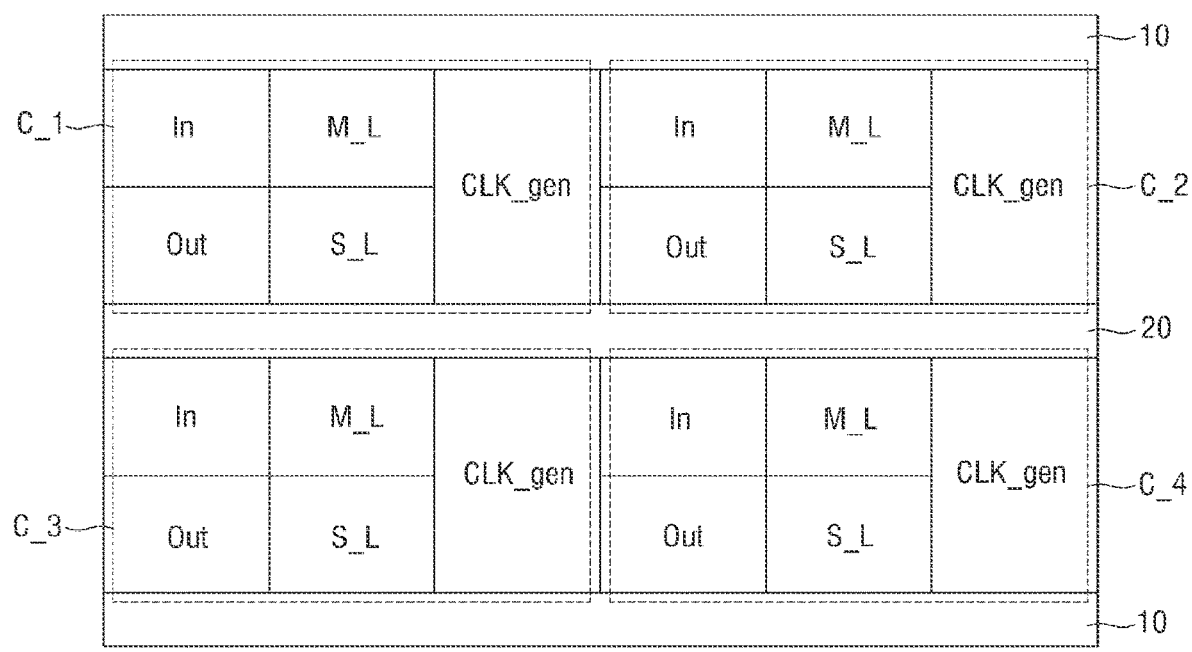
FIG. 6 is a layout diagram including an integrated circuit according to some example embodiments.

FIG. 6 is a layout diagram including an integrated circuit according to some example embodiments.

Referring to FIG. 6, a layout 2 including the integrated circuit according to some example embodiments includes a power rail 10 configured to supply a power voltage and a ground rail 20 connected to a ground power.

The layout 2 according to some example embodiments includes a plurality of cells (e.g., first to fourth cells C_1 to C_4). The number and/or configuration of the plurality of cells is not limited to those illustrated in this drawing.

The first cell C_1 and the second cell C_2 are adjacent to each other and may be disposed between the power rail 10 and the ground rail 20. The third cell C_3 and the fourth cell C_4 are adjacent to each other and may be disposed between the power rail 10 and the ground rail 20.

Each of the first to fourth cells C_1 to C_4 may include an input circuit In, a master latch circuit M_L, a slave latch circuit S_L, an output circuit Out, and a clock generation circuit CLK_gen. That is, although each of the first to fourth cells C_1 to C_4 is illustrated as a master-slave flip-flop, the circuit constituting the first to fourth cells C_1 to C_4 is not limited thereto.

Each of the cells may be supplied with a power voltage through the power rail 10 and grounded through the ground rail 20.

Hereinafter, in order to exclude overlapping descriptions, a layout diagram including the integrated circuit according to some example embodiments will be described in detail by taking the master-slave flip-flop of the first cell C_1 as an example. Of course, the description of the first cell C_1 may also be applied to the remaining cells (the second to fourth cells C_2 to C_4).

Figure 7:
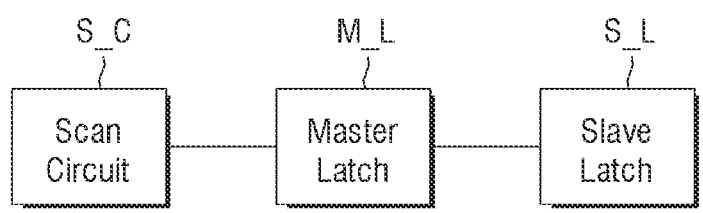
FIG. 7 is a block diagram illustrating the first cell C_1 shown in FIG. 6 according to some example embodiments.
Figure 8:
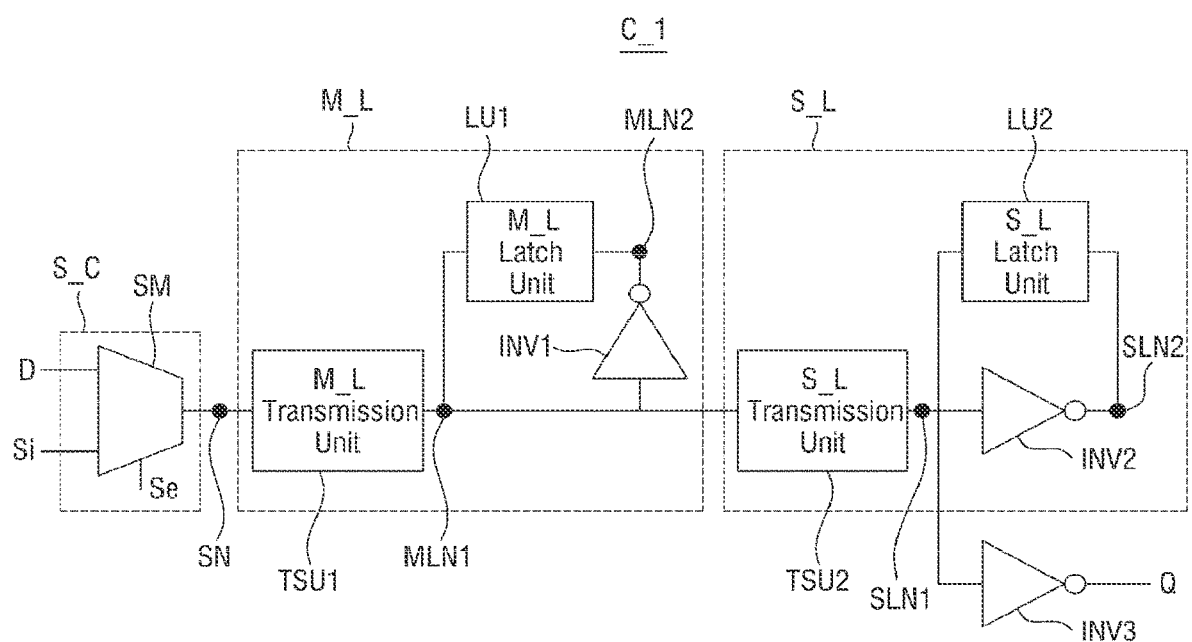
FIG. 8 is a circuit diagram of FIG. 7 according to some example embodiments.

FIG. 7 is a block diagram illustrating the first cell C_1 shown in FIG. 6. FIG. 8 is a circuit diagram of FIG. 7. For reference, only the input circuit In, the master latch circuit M_L, and the slave latch circuit S_L in the master-slave flip-flop of the first cell C_1 will be described as an example for convenience of description.

Referring to FIGS. 7 and 8, the master-slave flip-flop of the first cell C_1 including the integrated circuit according to some example embodiments may include a scan circuit S_C, a master latch M_L, and a slave latch S_L. For reference, the scan circuit S_C may mean the input circuit In shown in FIG. 6.

The scan circuit SS may include a scan multiplexer SM. The scan multiplexer SM may receive a data signal D, a scan active signal Se, and a scan input signal Si and may output any one of the data signal D and the scan input signal Si to a signal node SN according to the control signal.

In more detail, the scan multiplexer SM outputs the scan input signal Si to the signal node SN when the scan active signal SE is at a logic high (H) level. On the other hand, the scan multiplexer SM may output the data signal D to the signal node SN when the scan active signal Se is at a logic low (L) level.

Figure 9:
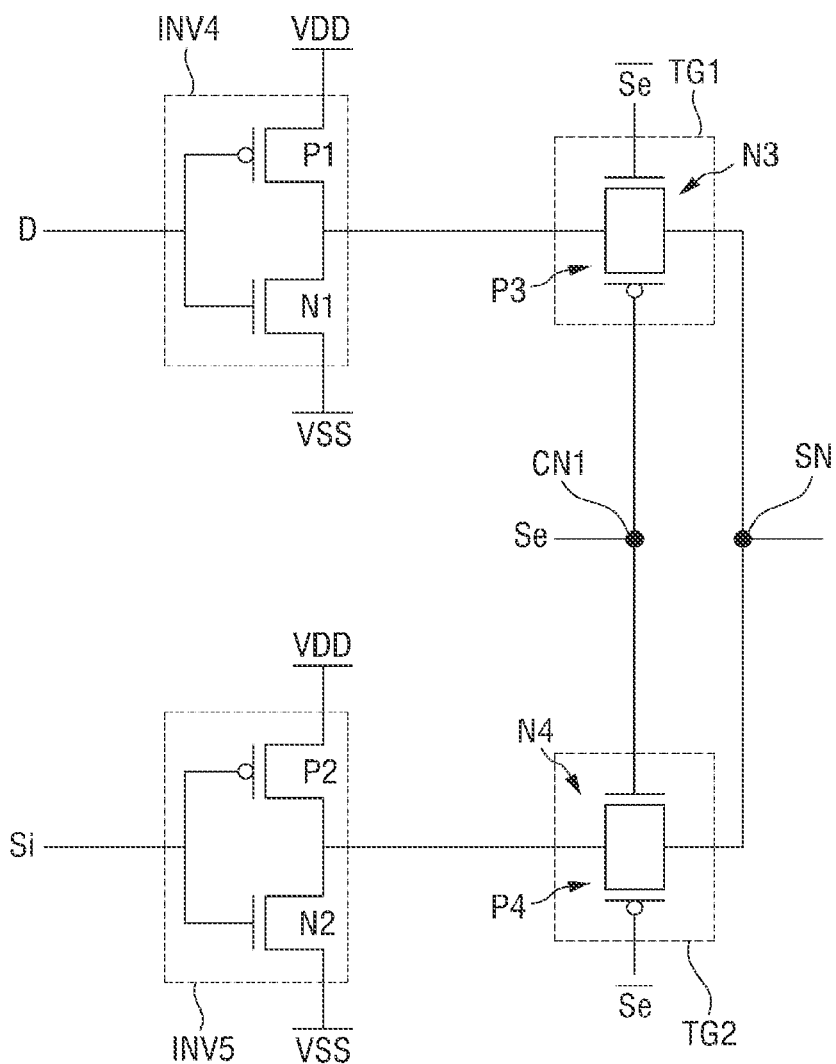
FIG. 9 is a circuit diagram illustrating the scan circuit S_C shown in FIG. 8 according to some example embodiments.
Figure 28:
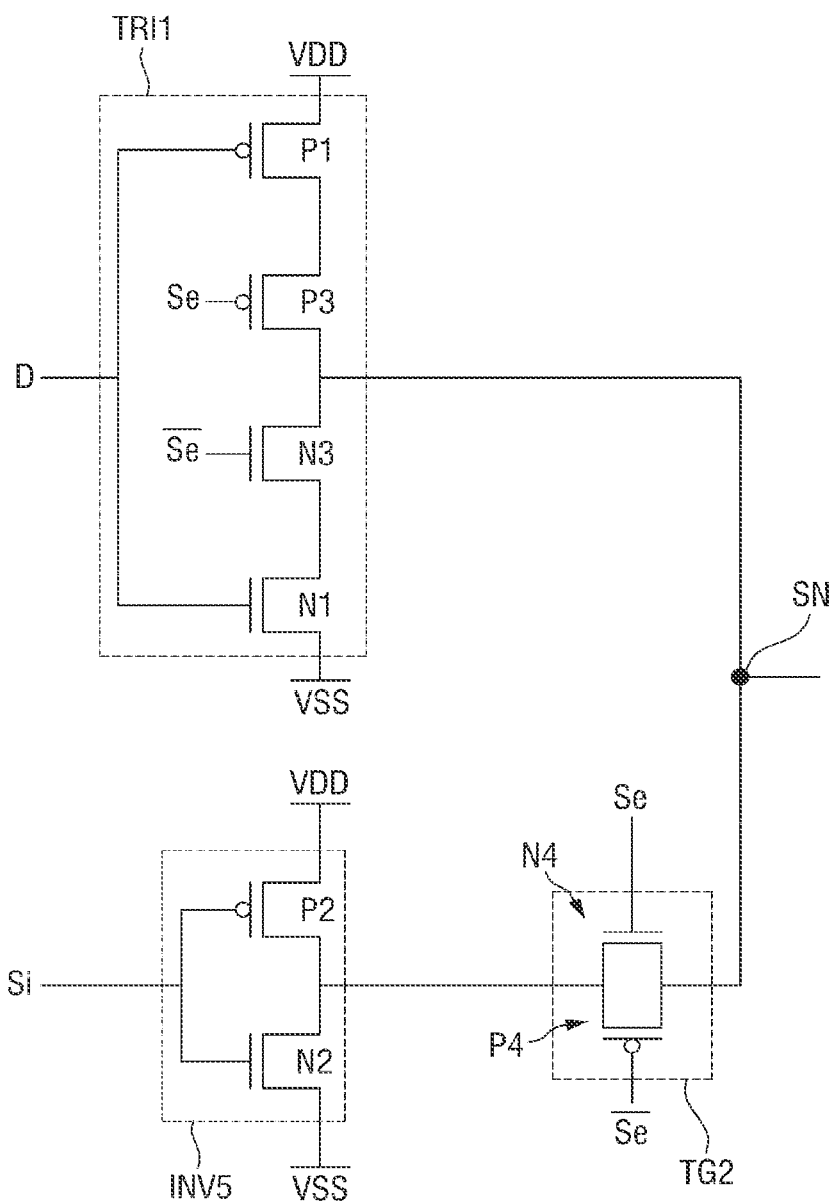
FIG. 28 is a circuit diagram illustrating the scan circuit S_C shown in FIG. 8 according to some example embodiments.
Figure 32:
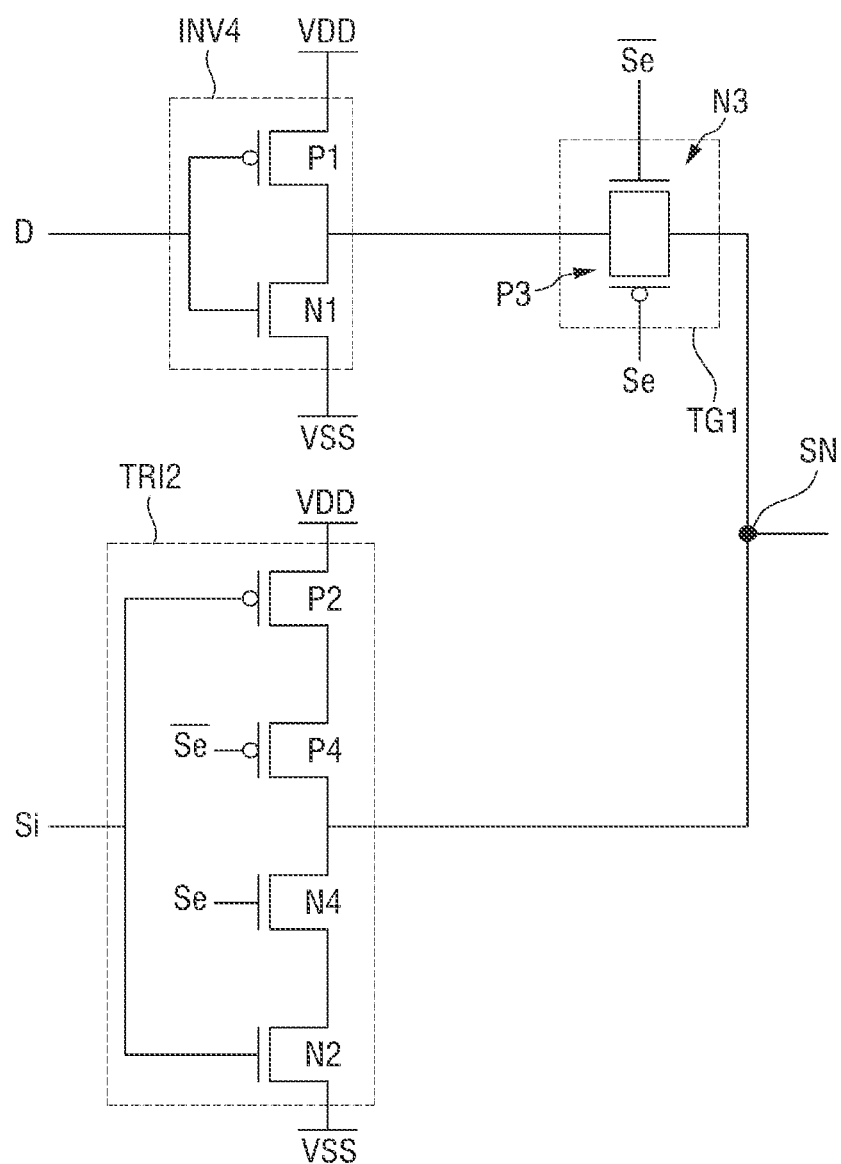
FIG. 32 is a circuit diagram illustrating the scan circuit S_C shown in FIG. 8.

In more detail, the scan multiplexer SM may include a plurality of transmission gates as illustrated in FIG. 9 below, or a tri-state inverter and a transmission gate as illustrated in FIGS. 28 and 32.

Hereinafter, the scan multiplexer SM including the integrated circuit according to some example embodiments will be described with reference to FIGS. 9 to 35.

FIG. 9 is a circuit diagram illustrating the scan circuit S_C shown in FIG. 8.

Referring to FIG. 9, a scan circuit S_C(R3_1) includes a fourth inverter INV4 configured to receive and invert the data signal D, and a fifth inverter INV5 configured to receive and invert the scan input signal Si. In addition, the scan circuit S_C(R3_1) includes a first transmission gate TG1 configured to transfer the inverted data signal D and a second transmission gate TG2 configured to transfer the inverted scan input signal Si.

A third PMOS transistor P3 of the first transmission gate TG1 and a fourth NMOS transistor N4 of the second transmission gate TG2 share a first common node CN1 and may be gated through the scan active signal Se. In addition, the first transmission gate TG1 and the second transmission gate TG2 may output one of the data signal D and the scan input signal Si through the signal node SN.

Here, a drain of each of a first PMOS transistor P1 and a first NMOS transistor N1 constituting the fourth inverter INV4, a drain of a third NMOS transistor N3 constituting the first transmission gate TG1, and a source of the third PMOS transistor P3 constituting the first transmission gate TG1 may be connected through one source/drain contact.

In addition, a drain of each of a second PMOS transistor P2 and a second NMOS transistor N2 constituting the fifth inverter INV5, a drain of the fourth NMOS transistor N4 constituting the first transmission gate TG1, and a source of a fourth PMOS transistor P4 constituting the first transmission gate TG2 may be connected through one source/drain contact.

In the following, a structure in which a plurality of transistors are connected through one source/drain contact will be described with reference to a layout diagram of FIG. 10.

Figure 10:
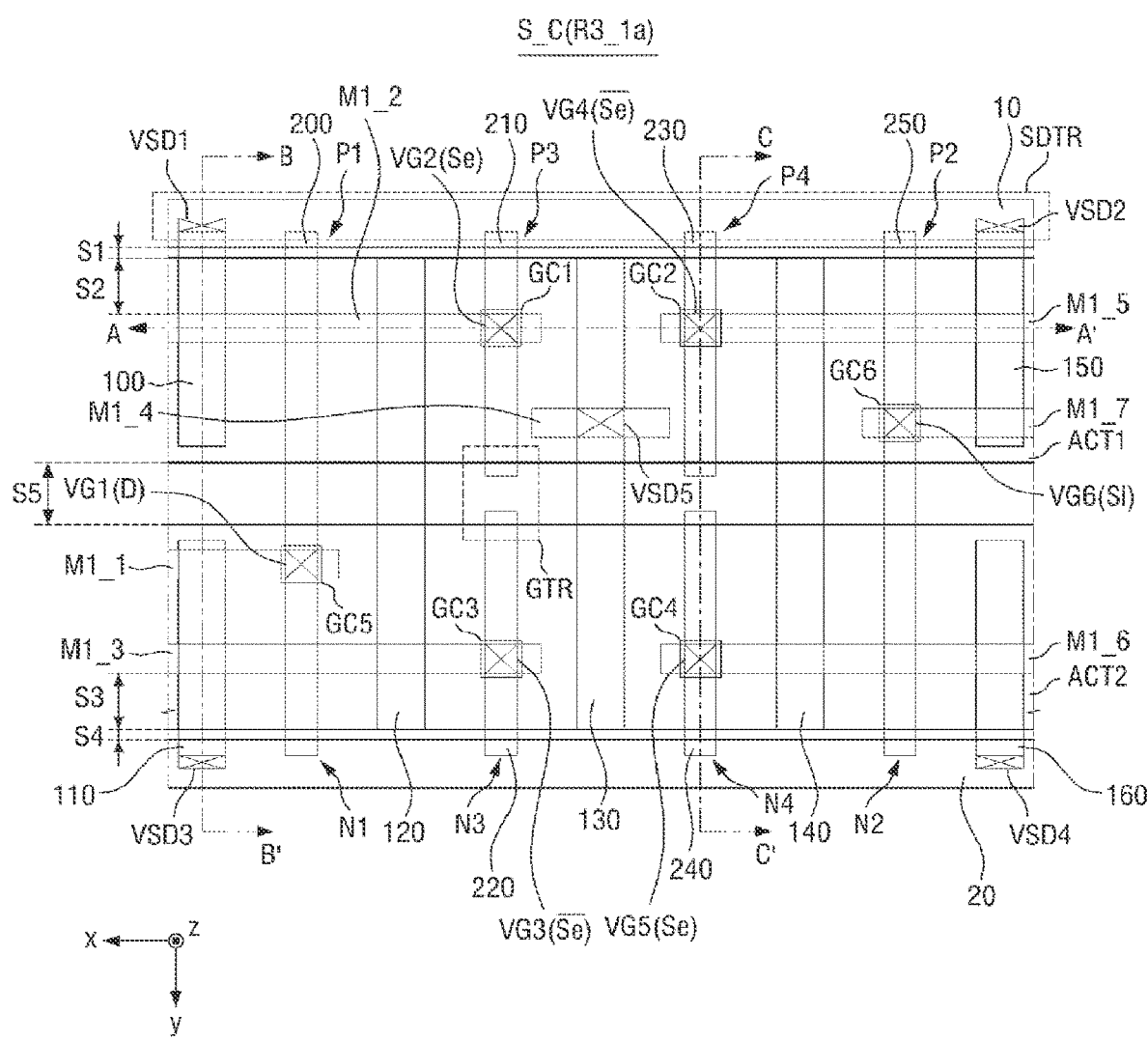
FIG. 10 is a layout diagram of FIG. 9 according to some example embodiments.
Figure 11:
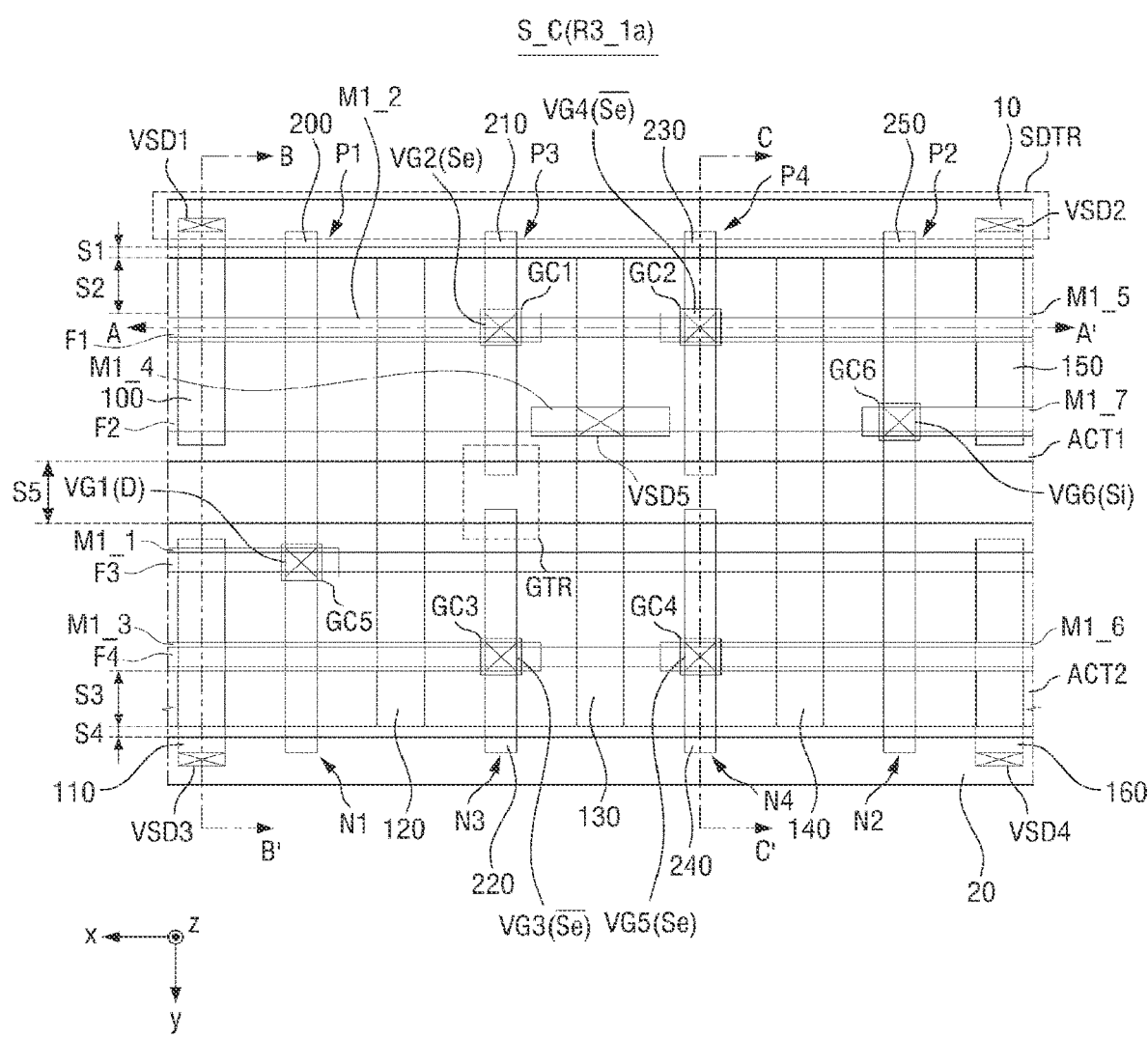
FIGS. 11 to 13 are layout diagrams of FIG. 9 according to some example embodiments.
Figure 12:
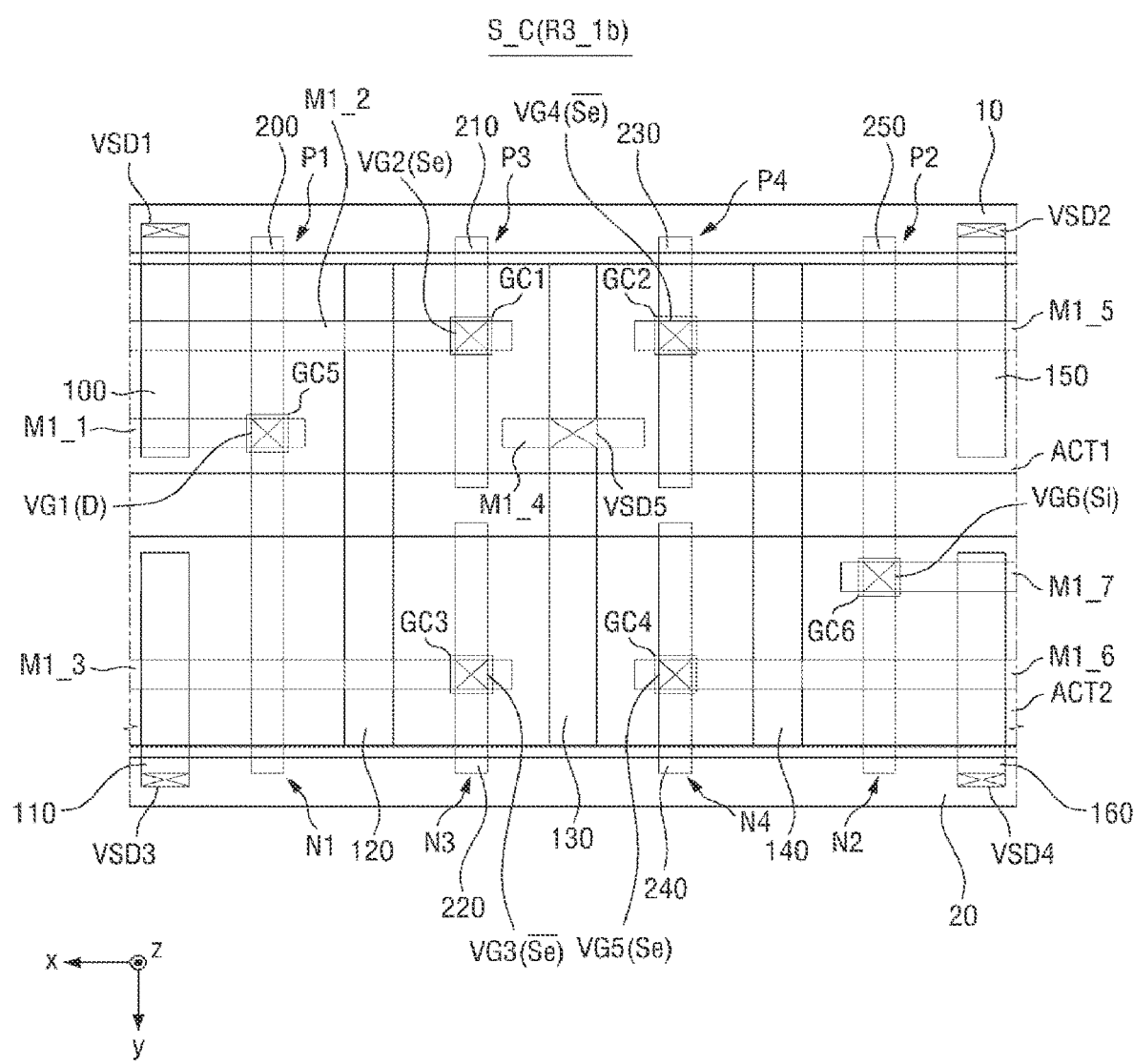
Figure 13:
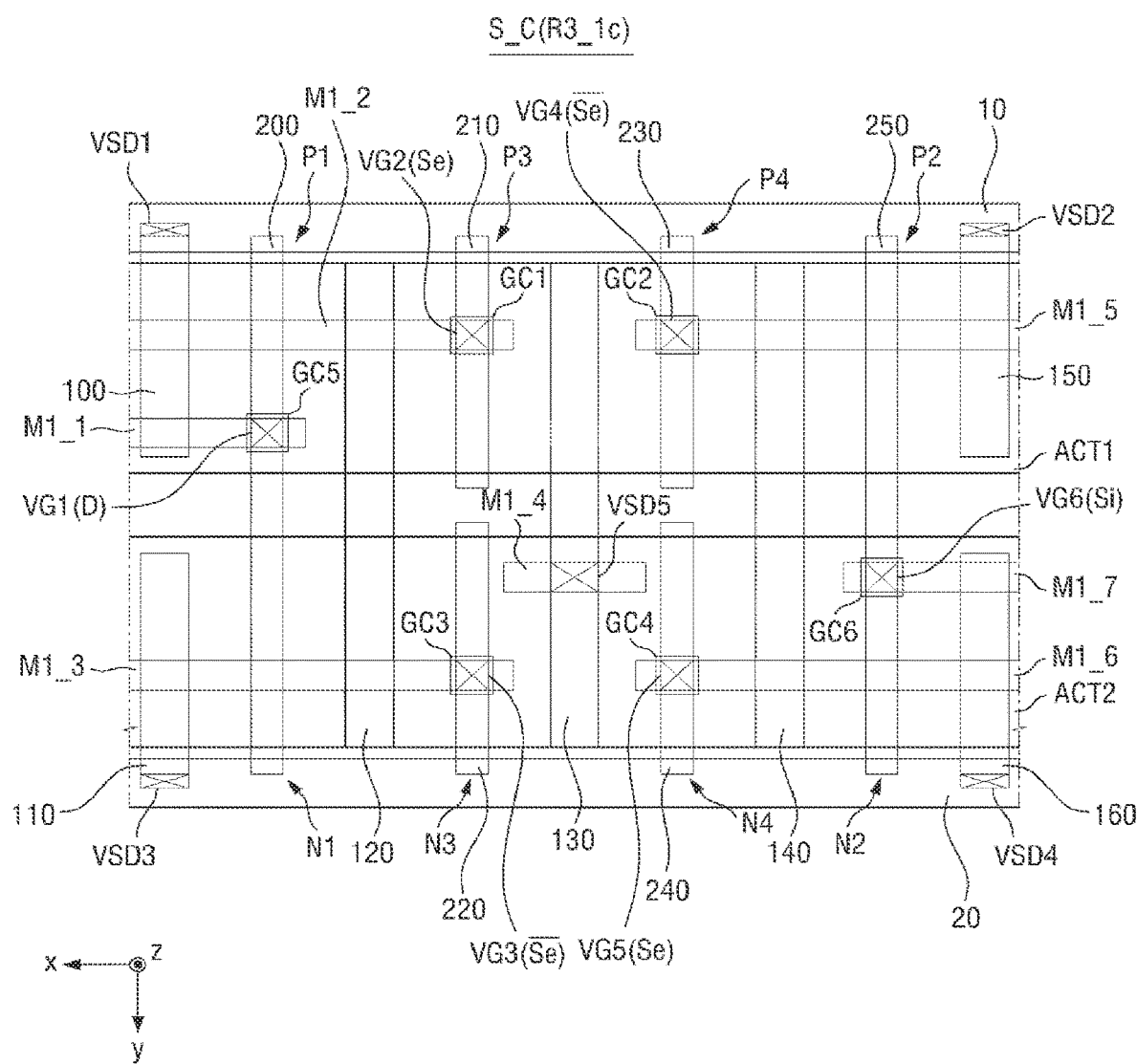

FIG. 10 is a layout diagram of FIG. 9. FIGS. 11 to 13 are layout diagrams of FIG. 9 according to some example embodiments. Hereinafter, in order to avoid duplicate descriptions, the common parts of FIGS. 10 to 13 will be described only through FIG. 10, and only the differences will be briefly described with reference to the corresponding drawings.

Referring to FIG. 10, the first to fourth PMOS transistors P1 to P4 may be formed on a first active region ACT1 extending in a first direction x. Further, the first to fourth NMOS transistors N1 to N4 may be formed on a second active region ACT2 extending in the first direction x and disposed to be spaced apart from the first active region ACT1 in a second direction y.

For reference, as illustrated in FIG. 11, first active fins (e.g., a first fin F1 and a second fin F2) protruding from the first active region ACT1 in a third direction z may be formed on the first active region ACT1. In addition, second active fins (e.g., a third fin F3 and a fourth fin F4) protruding from the second active region ACT2 in the third direction z may be formed on the second active region ACT2. The first active fins (e.g., the first fin F1 and the second fin F2) and the second active fins (e.g., the third fin F3 and the fourth fin F4) may be disposed to be spaced apart from each other in the second direction y. The first active fins (e.g., the first fin F1 and the second fin F2) and the second active fins (e.g., the third fin F3 and the fourth fin F4) may each extend in the first direction x.

Referring to FIG. 10 again, a power rail 10 may be disposed at an upper portion of the first active region ACT1 in the second direction y. In addition, a ground rail 20 may be disposed at a lower portion of the second active region ACT2 in the second direction y.

A scan circuit S_C(R3_1a) including the integrated circuit according to some examine embodiments may include a plurality of gate structures and a plurality of source/drain contacts extending in the second direction y and disposed to be spaced apart from each other in the first direction x.

For example, a first source/drain contact 100 and a second source/drain contact 110 may be disposed on the first active region ACT1 and the second active region ACT2, respectively, to be spaced apart from each other in the second direction y. That is, the first source/drain contact 100 may be connected to the power rail 10 through a first source/drain contact via VSD1 to supply the power voltage to the first PMOS transistor P1. In addition, the second source/drain contact 110 may be connected to the ground rail 20 through a third source/drain contact via VSD3 to ground the first NMOS transistor N1.

A first gate structure 200 is disposed to be spaced apart from the first and second source/drain contacts 100 and 110 in the first direction x. The first gate structure 200 may be disposed on the first active region ACT1 and the second active region ACT2.

A third source/drain contact 120 may be disposed to be spaced apart from the first gate structure 200 in the first direction x. The third source/drain contact 120 may extend in the second direction y and may be disposed on the first active region ACT1 and the second active region ACT2. That is, the drain of the first PMOS transistor P1 and the drain of the first NMOS transistor N1 may be connected to each other through the third source/drain contact 120. In addition, the source of the third PMOS transistor P3 may be connected to the drain of the third NMOS transistor N3 through the third source/drain contact 120. That is, the drain of the first PMOS transistor P1, the drain of the first NMOS transistor N1, the source of the third PMOS transistor P3 and the drain of the third NMOS transistor N3 may be connected to each other through the third source/drain contact 120. By connecting a plurality of transistors through one source/drain contact (e.g., the third source/drain contact 120), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A second gate structure 210 may be disposed on the first active region ACT1 to be spaced apart from the third source/drain contact 120 in the first direction x. In addition, a third gate structure 220 may be disposed on the second active region ACT2 to be spaced apart from the third source/drain contact 120 in the first direction x.

A fourth source/drain contact 130 may be disposed to extend in the second direction y and to be spaced apart from the second gate structure 210 and the third gate structure 220 in the first direction x. A drain of the third PMOS transistor P3 may be connected to a source of the third NMOS transistor N3 through the fourth source/drain contact 130. In addition, a drain of the fourth PMOS transistor P4 may be connected to a source of the fourth NMOS transistor N4 through the fourth source/drain contact 130. That is, the drain of the third PMOS transistor P3, the source of the third NMOS transistor N3, the drain of the fourth PMOS transistor P4, and the source of the fourth NMOS transistor N4 may be connected to each other through the fourth source/drain contact 130. By connecting a plurality of transistors through one source/drain contact (e.g., the fourth source/drain contact 130), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A fourth gate structure 230 may be disposed on the first active region ACT1 to be spaced apart from the fourth source/drain contact 130 in the first direction x. In addition, a fifth gate structure 240 may be disposed on the second active region ACT2 to be spaced apart from the fourth source/drain contact 130 in the first direction x.

A fifth source/drain contact 140 may be disposed to be spaced apart from the fourth gate structure 230 and the fifth gate structure 240 in the first direction x. The fifth source/drain contact 140 may extend in the second direction y and may be disposed on the first active region ACT1 and the second active region ACT2. That is, the source of the fourth PMOS transistor P4 and the drain of the fourth NMOS transistor N4 may be connected to each other through the fifth source/drain contact 140. In addition, the drain of the second PMOS transistor P2 may be connected to the drain of the second NMOS transistor N2 through the fifth source/drain contact 140. That is, the source of the fourth PMOS transistor P4, the drain of the fourth NMOS transistor N4, the drain of the second PMOS transistor P2, and the drain of the second NMOS transistor N2 may be connected to each other through the fifth source/drain contact 140. By connecting a plurality of transistors through one source/drain contact (e.g., the fifth source/drain contact 140), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A sixth gate structure 250 may be disposed on the first active region ACT1 and the second active region ACT2 to be spaced apart from the fifth source/drain contact 140 in the first direction x. Further, a sixth source/drain contact 150 may be disposed on the first active region ACT1 to be spaced apart from the sixth gate structure 250 in the first direction x. The sixth source/drain contact 150 may be connected to the power rail 10 through a second source/drain contact via VSD2 to supply the power voltage to the second PMOS transistor P2. In addition, a seventh source/drain contact 160 may be disposed on the second active region ACT2 to be spaced apart from the sixth gate structure 250 in the first direction x. The seventh source/drain contact 160 may be connected to the ground rail 20 through a fourth source/drain contact via VSD4 to ground the second NMOS transistor N2.

Next, the structure and operation in which the signal is applied, together with structures extending in the third direction z, will be described.

A fifth gate contact GC5 extending in the third direction z may be disposed on the first gate structure 200. In addition, a first gate contact via VG1 extending in the third direction z may be disposed on the fifth gate contact GC5. The first gate contact via VG1 may be connected to a first_first metal line M1_1 extending in the first direction x. That is, the first gate structure 200 may be electrically connected to the first_first metal line M1_1, the first gate contact via VG1, and the fifth gate contact GC5 to receive the data signal D. Thus, the first PMOS transistor P1 and the first NMOS transistor N1 may be gated through the data signal D.

The fifth gate contact GC5 and the first gate contact via VG1, which are electrically connected to the first gate structure 200, are illustrated in this drawing as being disposed on the second active region ACT2, but are not limited thereto, and may be disposed on the first active region ACT1 as illustrated in FIGS. 12 and 13.

A first gate contact GC1 extending in the third direction z may be disposed on the second gate structure 210. In addition, a second gate contact via VG2 extending in the third direction z may be disposed on the first gate contact GC1. The second gate contact via VG2 may be connected to a first_second metal line M1_2 extending in the first direction x. That is, the second gate structure 210 may be electrically connected to the first_second metal line M1_2, the second gate contact via VG2, and the first gate contact GC1 to receive the scan active signal Se. Thus, the third PMOS transistor P3 may be gated through the scan active signal Se.

The positions of the first gate contact GC1 and the second gate contact via VG2, which are electrically connected to the second gate structure 210, are not limited thereto.

A third gate contact GC3 extending in the third direction z may be disposed on the third gate structure 220. In addition, a third gate contact via VG3 extending in the third direction z may be disposed on the third gate contact GC3. The third gate contact via VG3 may be connected to a first_third metal line M1_3 extending in the first direction x. That is, the third gate structure 220 may be electrically connected to the first_third metal line M1_3, the third gate contact via VG3, and the third gate contact GC3 to receive an inverted active signal $\overline{Se}$. Thus, the third NMOS transistor N3 may be gated through the inverted active signal $\overline{Se}$.

The positions of the third gate contact GC3 and the third gate contact via VG3, which are electrically connected to the third gate structure 220, are not limited thereto.

A second gate contact GC2 extending in the third direction z may be disposed on the fourth gate structure 230. In addition, a fourth gate contact via VG4 extending in the third direction z may be disposed on the second gate contact GC2. The fourth gate contact via VG4 may be connected to a first_fifth metal line M1_5 extending in the first direction x. That is, the fourth gate structure 230 may be electrically connected to the first_fifth metal line M1_5, the fourth gate contact via VG4, and the second gate contact GC2 to receive the inverted active signal $\overline{Se}$. Thus, the fourth PMOS transistor P4 may be gated through the inverted active signal $\overline{Se}$.

The positions of the second gate contact GC2 and the fourth gate contact via VG4, which are electrically connected to the fourth gate structure 230, are not limited thereto.

A fourth gate contact GC4 extending in the third direction z may be disposed on the fifth gate structure 240. In addition, a fifth gate contact via VG5 extending in the third direction z may be disposed on the fourth gate contact GC4. The fifth gate contact via VG5 may be connected to a first_sixth metal line M1_6 extending in the first direction x. That is, the fifth gate structure 240 is electrically connected to the first_sixth metal line M1_6, the fifth gate contact via VG5, and the fourth gate contact GC4 to receive the scan active signal Se. Thus, the fourth NMOS transistor N4 may be gated through the scan active signal Se.

The positions of the fourth gate contact GC4 and the fifth gate contact via VG5, which are electrically connected to the fifth gate structure 240, are not limited thereto.

A sixth gate contact GC6 extending in the third direction z may be disposed on the sixth gate structure 250. In addition, a sixth gate contact via VG6 extending in the third direction z may be disposed on the sixth gate contact GC6. The sixth gate contact via VG6 may be connected to a first_seventh metal line M1_7 extending in the first direction x. That is, the sixth gate structure 250 may be electrically connected to the first_seventh metal line M1_7, the sixth gate contact via VG6, and the sixth gate contact GC6 to receive the scan input signal Si. Thus, the second PMOS transistor P2 and the second NMOS transistor N2 may be gated through the scan input signal Si.

The sixth gate contact GC6 and the sixth gate contact via VG6, which are electrically connected to the sixth gate structure 250, are illustrated in this drawing as being disposed on the first active region ACT1, but are not limited thereto, and may be disposed on the second active region ACT2 as illustrated in FIGS. 12 and 13.

A fifth source/drain contact via VSD5 extending in the third direction z may be disposed on the fourth source/drain contact 130. In addition, a first_fourth metal line M1_4 extending in the first direction x may be disposed on the fifth source/drain contact via VSD5 and may be connected to the outside.

The fifth source/drain contact via VSD5, which is electrically connected to the fourth source/drain contact 130, is illustrated in this drawing as being disposed on the first active region ACT1, but is not limited thereto, and may be disposed on the second active region ACT2 as illustrated in FIG. 13.

The plurality of gate structures (e.g., the first to sixth gate structures 200 to 250) and the plurality of source/drain contacts (e.g., the first to seventh source/drain contacts 100 to 160), which are disposed to be adjacent to each other in the first direction x, may be spaced apart from each other by 1 contacted poly pitch (CPP). As an example, the first gate structure 200 and the first source/drain contact 100 adjacent to each other may be spaced apart from each other by 1 CPP.

For example, assume that the first gate structure 200 and the first source/drain contact 100 are adjacent to each other. When the distance between a center line of the first gate structure 200 extending in the second direction y and a center line of the first source/drain contact 100 extending in the second direction y is 1 CPP, it means that the other gate structure or source/drain contact is not disposed between the first gate structure 200 and the first source/drain contact 100.

Further, the metal lines (e.g., the first_first metal line M1_1 to the first_seventh metal line M1_7), which are disposed to be adjacent to each other in the second direction y, may be spaced apart from each other by 1 CPP. As an example, the first_first metal line M1_1 and the first_third metal line M1_3 adjacent to each other may be spaced apart from each other by 1 CPP.

For example, assume that the first_first metal line M1_1 and the first_third metal line M1_3 are adjacent to each other. When the distance between a center line of the first_first metal line M1_1 extending in the first direction x and a center line of the first_third metal line M1_3 extending in the first direction x is 1 CPP, it means that the other metal line is not disposed between the first_first metal line M1_1 and the first_third metal line M13.

For reference, referring to FIG. 11, the first gate structure 200 and the sixth gate structure 250 may surround the first active fins (e.g., the first fin F1, the second fin F2) and the second active fins (e.g., the third fin F3, and the fourth fin F4). In addition, the second gate structure 210 and the fourth gate structure 230 may surround the first active fins (e.g., the first fin F1 and the second fin F2). In addition, the third gate structure 220 and the fifth gate structure 240 may surround the second active fins (e.g., the third fin F3 and the fourth fin F4).

Each of the layout diagrams of FIGS. 10 to 13 is divided into a front-end-of-line (FEOL), a middle-of-line (MOL), and a back-end-of-line (BEOL) and will be described with reference to FIGS. 14 to 17. In order to avoid duplicate descriptions, description will be made with reference to the layout diagram of FIG. 10.

Figure 14:
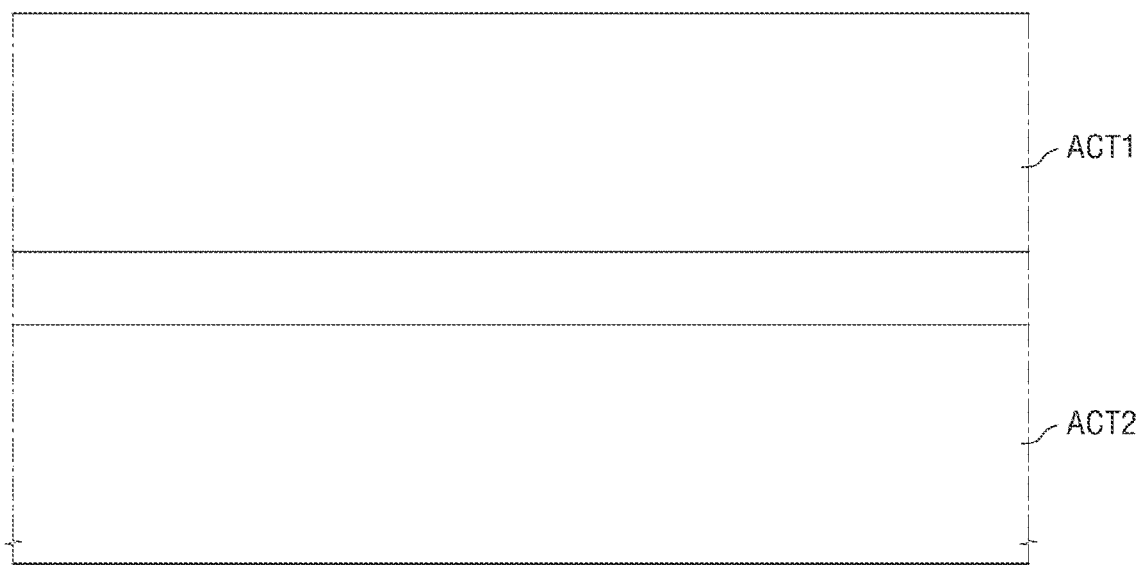
FIG. 14 is a layout diagram illustrating the FEOL of FIG. 10 according to some example embodiments.
Figure 15:
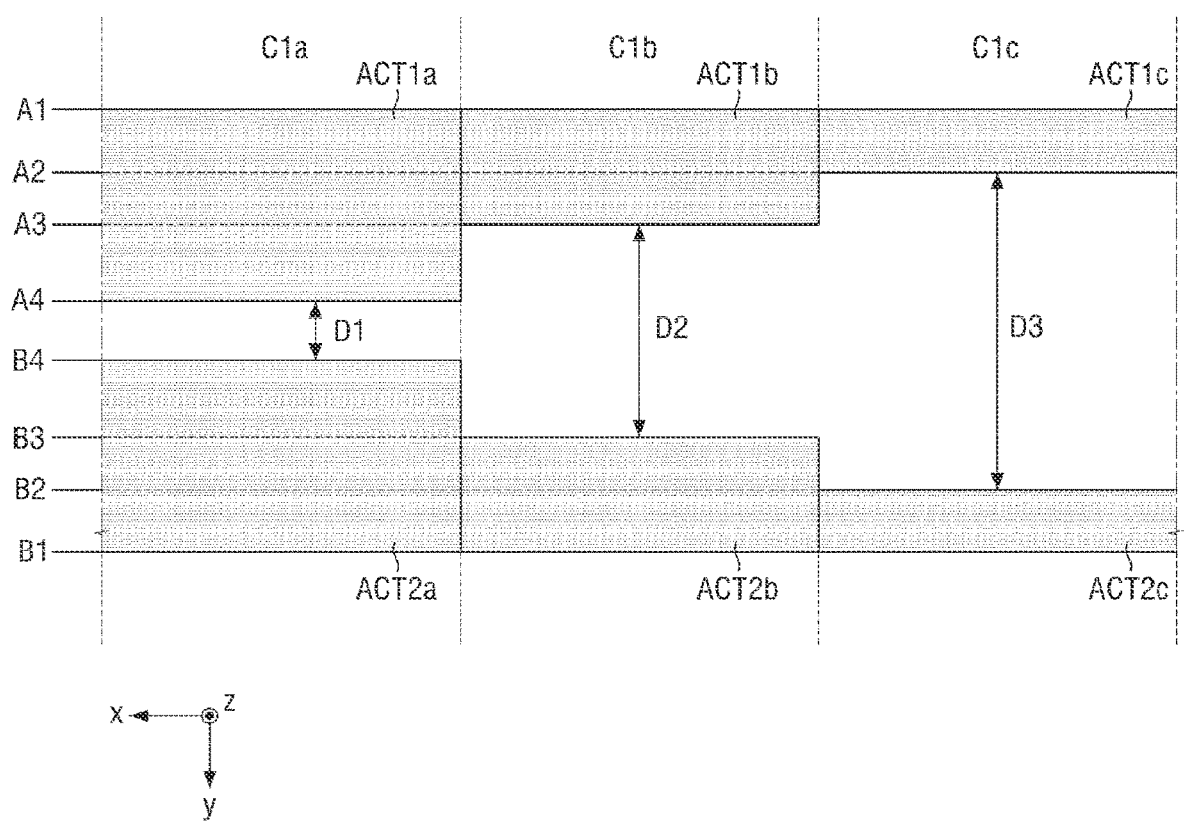
FIG. 15 is a layout diagram of FIG. 15 according to some example embodiments.
Figure 16:
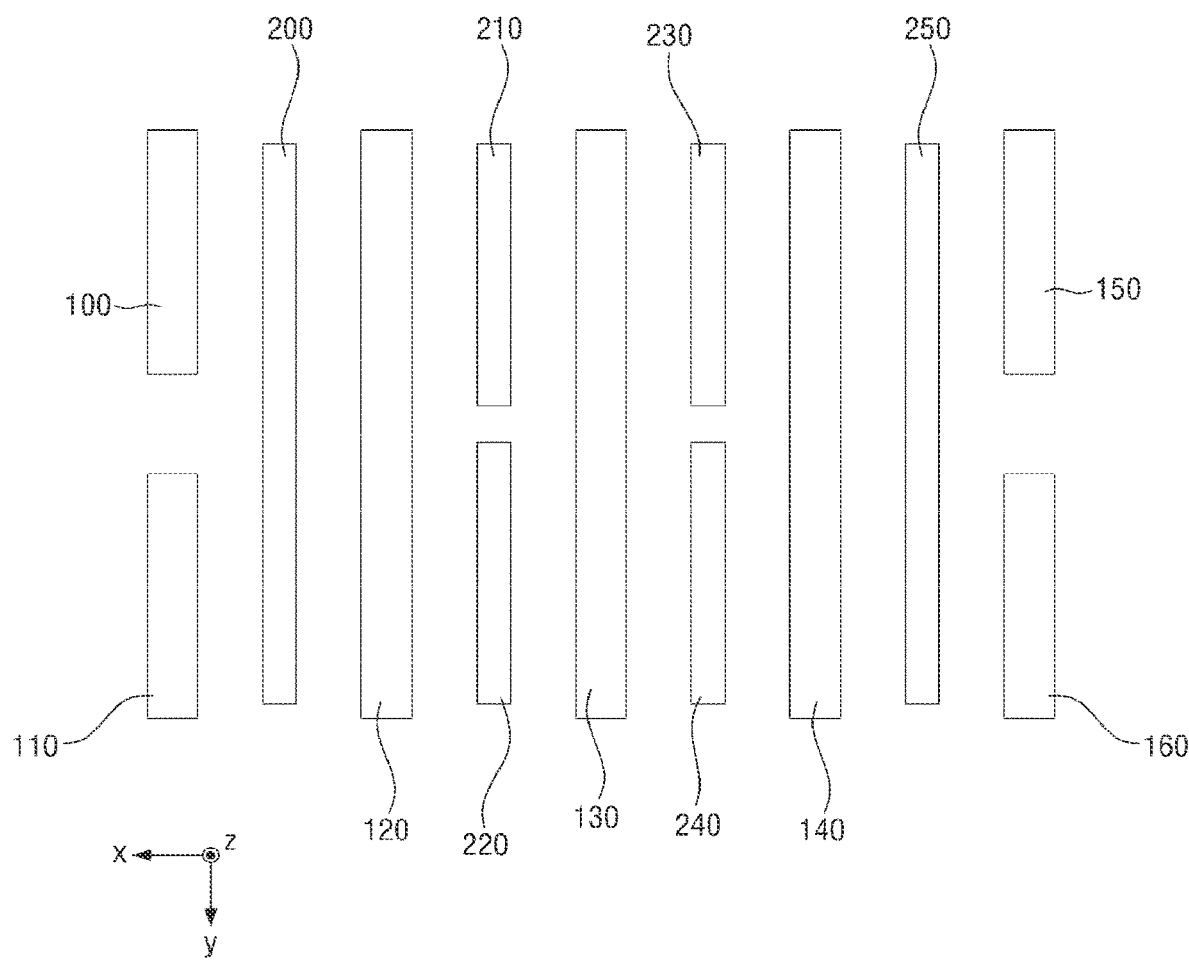
FIG. 16 is a layout diagram illustrating the MOL of FIG. 10 according to some example embodiments.
Figure 17:
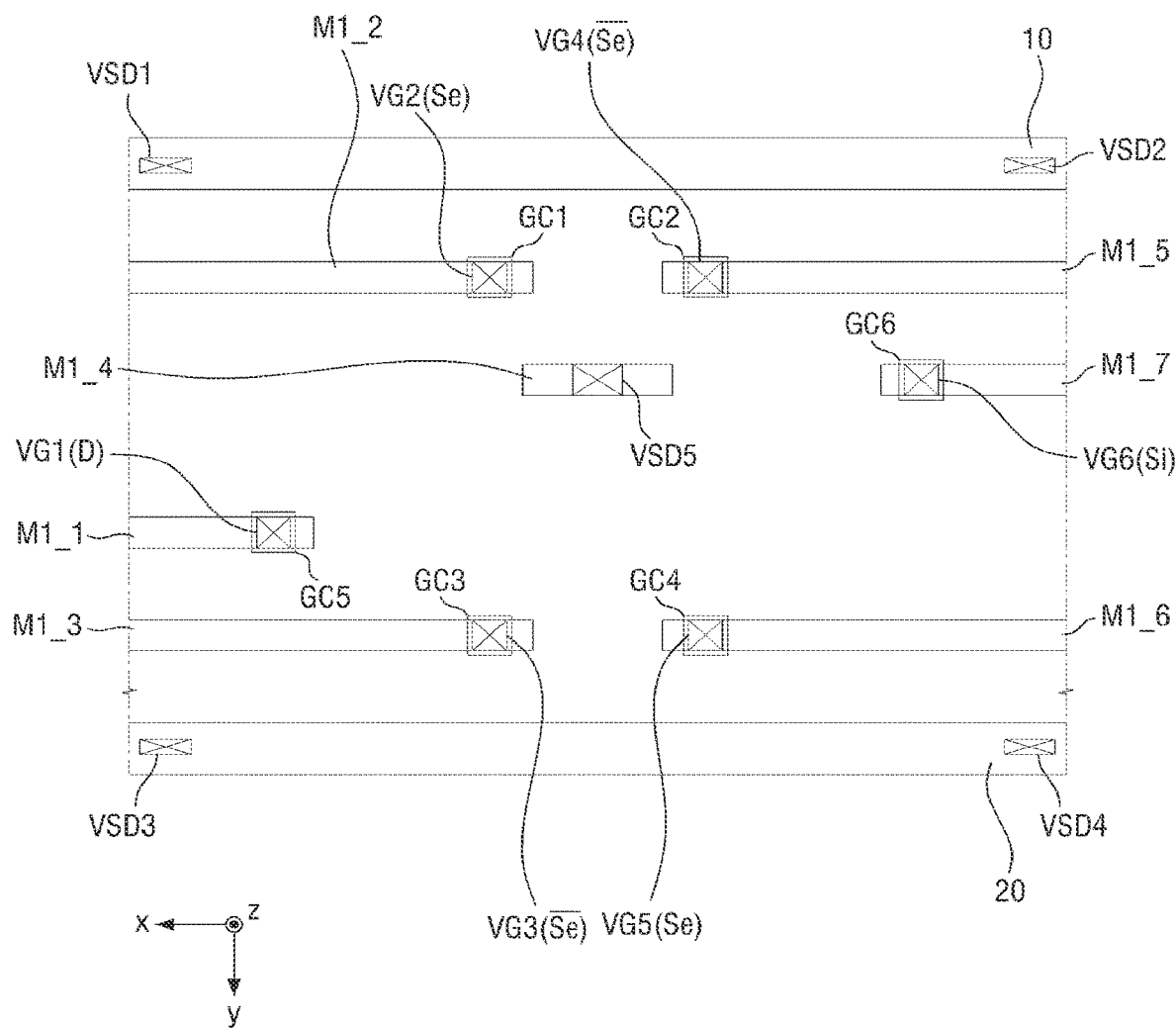
FIG. 17 is a layout diagram illustrating the BEOL of FIG. 10 according to some example embodiments.

FIG. 14 is a layout diagram illustrating the FEOL of FIG. 10. FIG. 15 is another layout diagram according to some example embodiments exemplarily illustrating FIG. 14. FIG. 16 is a layout diagram illustrating the MOL of FIG. 10. FIG. 17 is a layout diagram illustrating the BEOL of FIG. 10.

Referring to FIG. 14, the first active region ACT1 and the second active region ACT2 extending in the first direction x are disposed to be spaced apart from each other in the second direction y.

The first active region ACT1 may be a region in which a p-type transistor is formed. For example, the first active region ACT1 may include a well region doped with n-type impurities. The second active region ACT2 may be a region in which an n-type transistor is formed. For example, the second active region ACT2 may include a well region doped with p-type impurities.

Although not illustrated in the drawing, a first active fin protruding from the first active region ACT1 in the third direction z may be formed on the first active region ACT1. In addition, a second active fin protruding from the second active region ACT2 in the third direction z may be formed on the second active region ACT2. The first active fin and the second active fin may be formed to be spaced apart from each other in the second direction y. In addition, the first active fin and the second active fin may each extend in the first direction x.

Referring to FIG. 15, the thicknesses of active regions in a plurality of cells (e.g., a 1a-th cell C1a, a 1b-th cell C1b, and a 1c-th cell C1c) in the second direction y may be different.

For example, a 1a-th active region ACT1a of the 1a-th cell C1a may be formed from a boundary A1 of the 1a-th cell C1a to a boundary A4 of the 1a-th cell C1a, which is spaced apart from a 2a-th active region ACT2a. Similarly, the 2a-th active region ACT2a of the 1a-th cell C1a may be formed from a boundary B1 of the 1a-th cell C1a to a boundary B4 of the 1a-th cell C1a, which is spaced apart from the 1a-th active region ACT1a. That is, the 1a-th active region ACT1a and the 2a-th active region ACT2a may be disposed to be spaced apart from each other in the second direction y by a first length D1.

A 1b-th active region ACT1b of the 1b-th cell C1b adjacent to the 1a-th cell C1a may be formed from a boundary A1 of the 1b-th cell C1b to a boundary A3 of the 1b-th cell C1b, which is spaced apart from a 2b-th active region ACT2b. Similarly, the 2b-th active region ACT2b of the 1b-th cell C1b may be formed from a boundary B1 of the 1b-th cell C1b to a boundary B3 of the 1b-th cell C1b, which is spaced apart from the 1b-th active region ACT1b. That is, the 1b-th active region ACT1b and the 2b-th active region ACT2b may be disposed to be spaced apart from each other in the second direction y by a second length D2.

A 1c-th active region ACT1c of the 1c-th cell C1c adjacent to the 1b-th cell C1b may be formed from a boundary A1 of the 1c-th cell C1c to a boundary A2 of the 1c-th cell C1c, which is spaced apart from a 2c-th active region ACT2c. Similarly, the 2c-th active region ACT2c of the 1c-th cell C1c may be formed from a boundary B1 of the 1c-th cell C1c to a boundary B2 of the 1c-th cell C1c, which is spaced apart from the 1c-th active region ACT1c. That is, the 1c-th active region ACT1c and the 2c-th active region ACT2c may be disposed to be spaced apart from each other in the second direction y by a third length D3.

The shape and arrangement of the active regions disposed in successive cells is not limited to those illustrated in this drawing.

Referring to FIG. 16, the plurality of source/drain contacts (e.g., the first to seventh source/drain contacts 100 to 160) and the plurality of gate structures (e.g., the first to sixth gate structures 200 to 250) may be disposed to be spaced apart from each other in the first direction x. The plurality of source/drain contacts (e.g., the first to seventh source/drain contacts 100 to 160) and the plurality of gate structures (e.g., the first to sixth gate structures 200 to 250) may each extend in the second direction y.

The plurality of gate structures (e.g., the first to sixth gate structures 200 to 250) and the plurality of source/drain contacts (e.g., the first to seventh source/drain contacts 100 to 160), which are disposed to be adjacent to each other in the first direction x, may be spaced apart from each other by 1 CPP. As an example, the first gate structure 200 and the first source/drain contact 100 adjacent to each other may be spaced apart from each other by 1 CPP.

For example, assume that the first gate structure 200 and the first source/drain contact 100 are adjacent to each other. When the distance between the center line of the first gate structure 200 extending in the second direction y and the center line of the first source/drain contact 100 extending in the second direction y is 1 CPP, it means that the other gate structure or source/drain contact is not disposed between the first gate structure 200 and the first source/drain contact 100.

Referring to FIG. 17, the plurality of metal lines (e.g., the first_first to first_seventh metal lines M1_1 to M1_7), the power rail 10, and the ground rail 20 may be disposed to be spaced apart from each other in the second direction y. The plurality of metal lines (e.g., the first_first to first_seventh metal lines M1_1 to M1_7), the power rail 10, and the ground rail 20 may each extend in the first direction x.

The first source/drain contact via VSD1 and the second source/drain contact via VSD2 for transferring the power voltage to the source/drain contact may be disposed on the power rail 10. In addition, the third source/drain contact via VSD3 and the fourth source/drain contact via VSD4 for grounding the source/drain contact may be disposed on the ground rail 20.

The first_first metal line M1_1, the first_second metal line M1_2, the first_third metal line M13, the first_fifth metal line M15, the first_sixth metal line M16, and the first_seventh metal line M1_7 may be respectively connected to the plurality of gate contacts (e.g., the first to sixth gate contacts GC1 to GC6), for gating the gate structures, and the plurality of gate contact vias (e.g., the first to sixth gate contact vias VG1 to VG6) disposed in the plurality of gate contacts. The plurality of gate contacts (e.g., the first to sixth gate contacts GC1 to GC6) and the plurality of gate contact vias (e.g., the first to sixth gate contact vias VG1 to VG6) may extend in the third direction z.

The metal lines (e.g., the first_first to first_seventh metal lines M1_1 to M1_7), which are disposed to be adjacent to each other in the second direction y, may be spaced apart from each other by 1 CPP. As an example, the first_first metal line M1_1 and the first_third metal line M1_3 adjacent to each other may be spaced apart from each other by 1 CPP.

For example, assume that the first_first metal line M1_1 and the first_third metal line M1_3 are adjacent to each other. When the distance between the center line of the first_first metal line M1_1 extending in the first direction x and the center line of the first_third metal line M1_3 extending in the first direction x is 1 CPP, it means that the other metal line is not disposed between the first_first metal line M1_1 and the first_third metal line M13.

Cross-sectional views of the layout diagrams of FIGS. 10 to 13 will be described with reference to FIGS. 18 to 23. In order to avoid duplicate descriptions, description will be made with reference to the layout diagram of FIG. 10.

Figure 18:
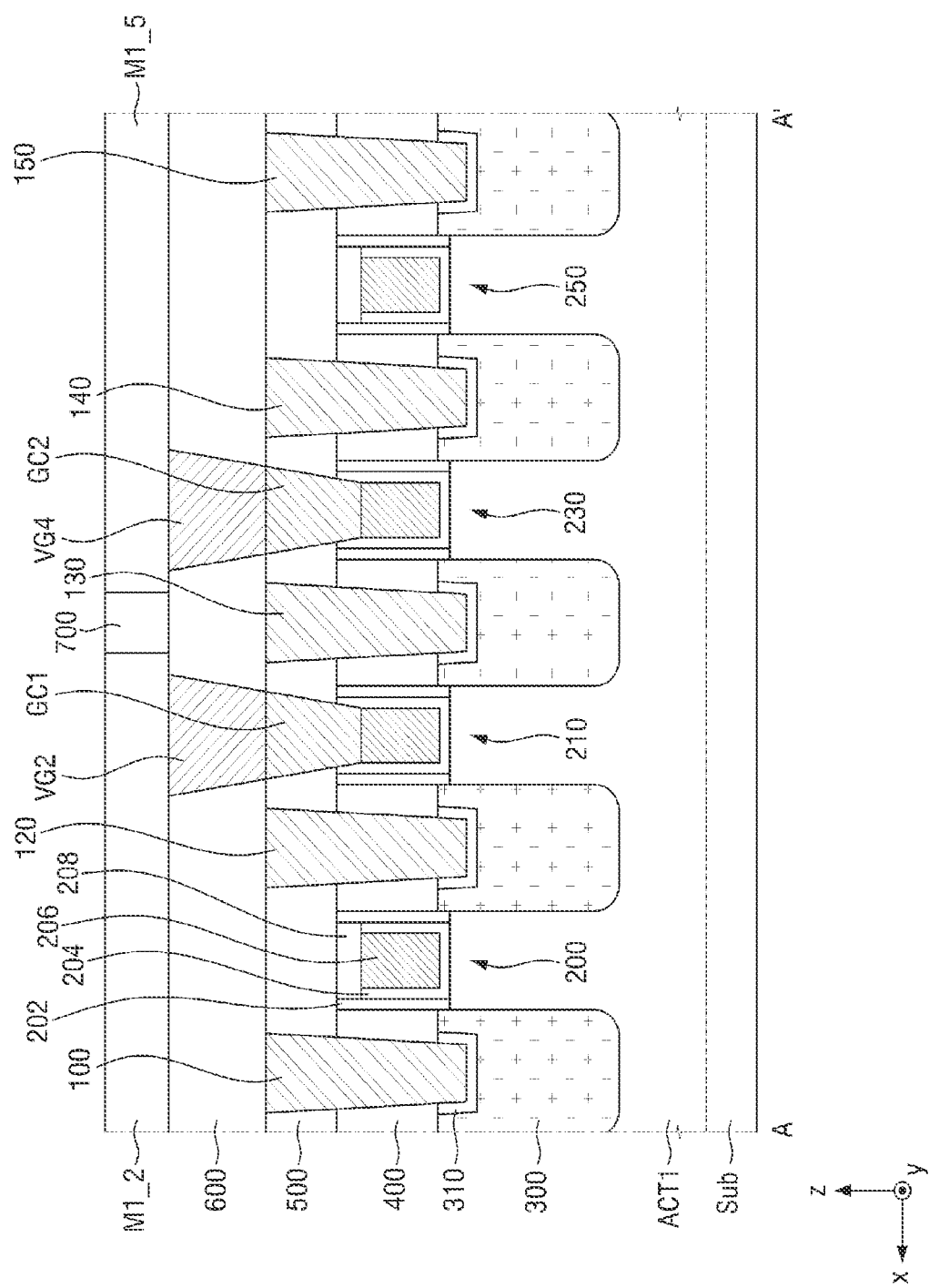
FIGS. 18 and 19 are cross-sectional views taken along line A-A' of FIG. 10.
Figure 19:
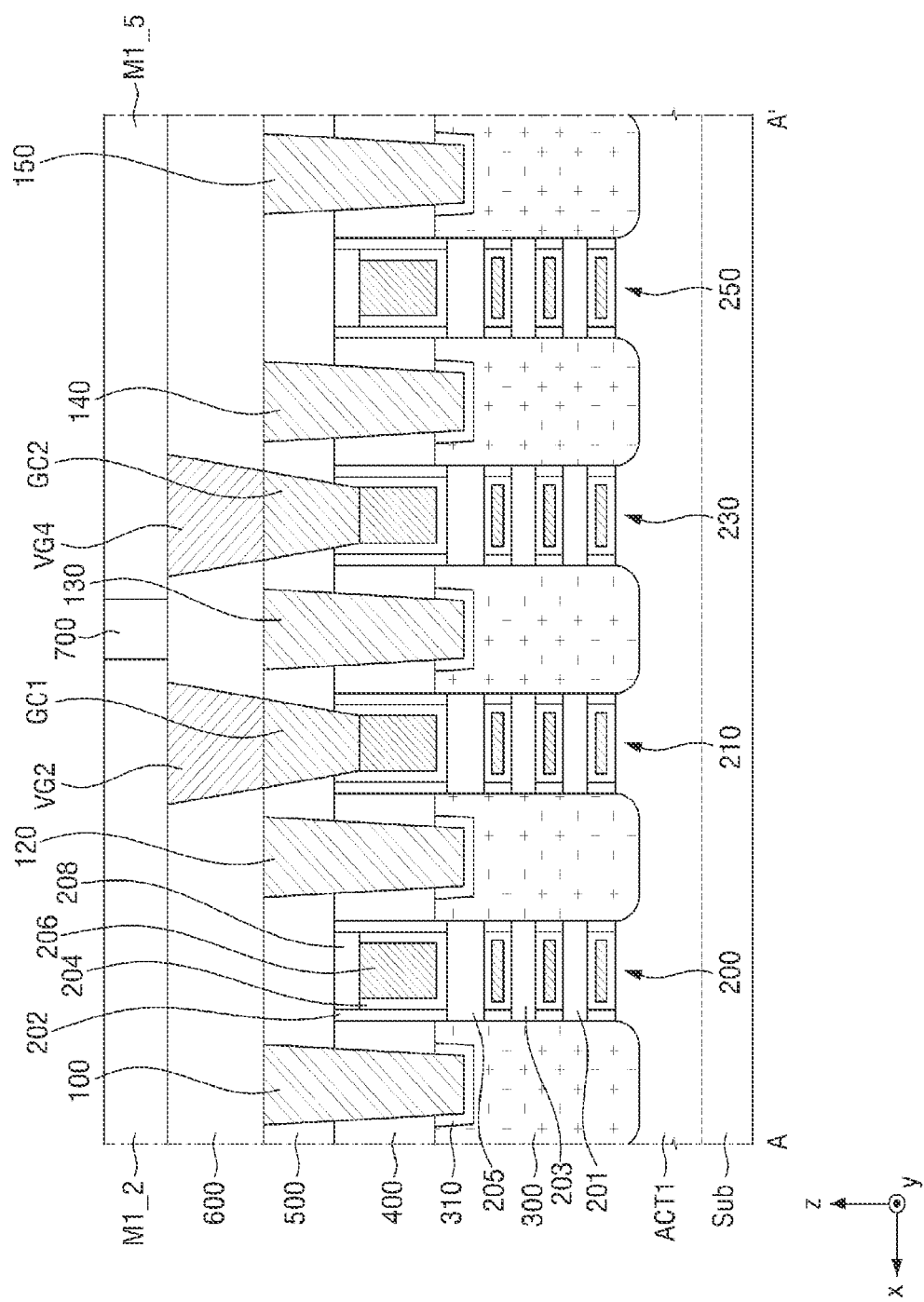
Figure 20:
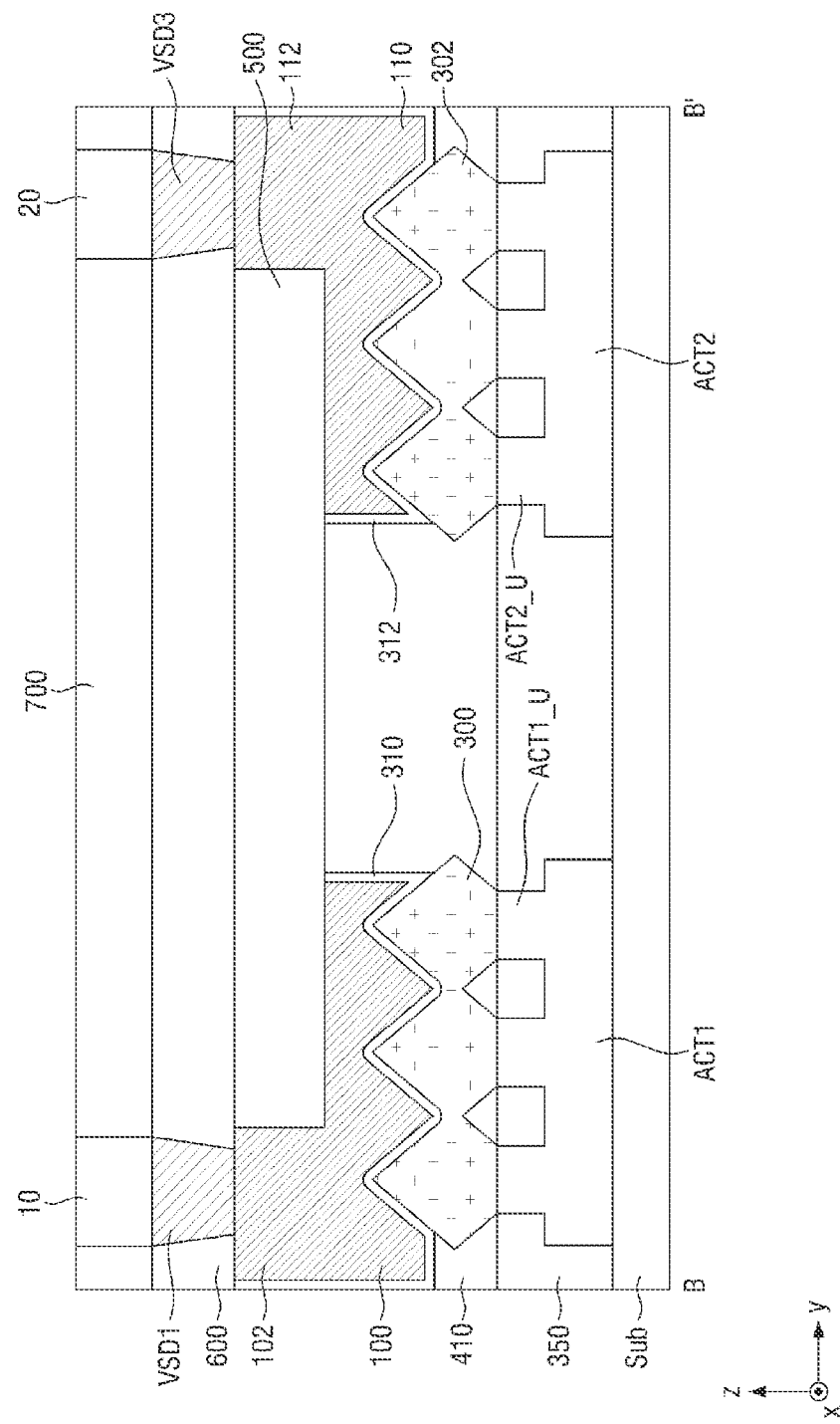
FIGS. 20 and 21 are cross-sectional views taken along line B-B' of FIG. 10.
Figure 21:
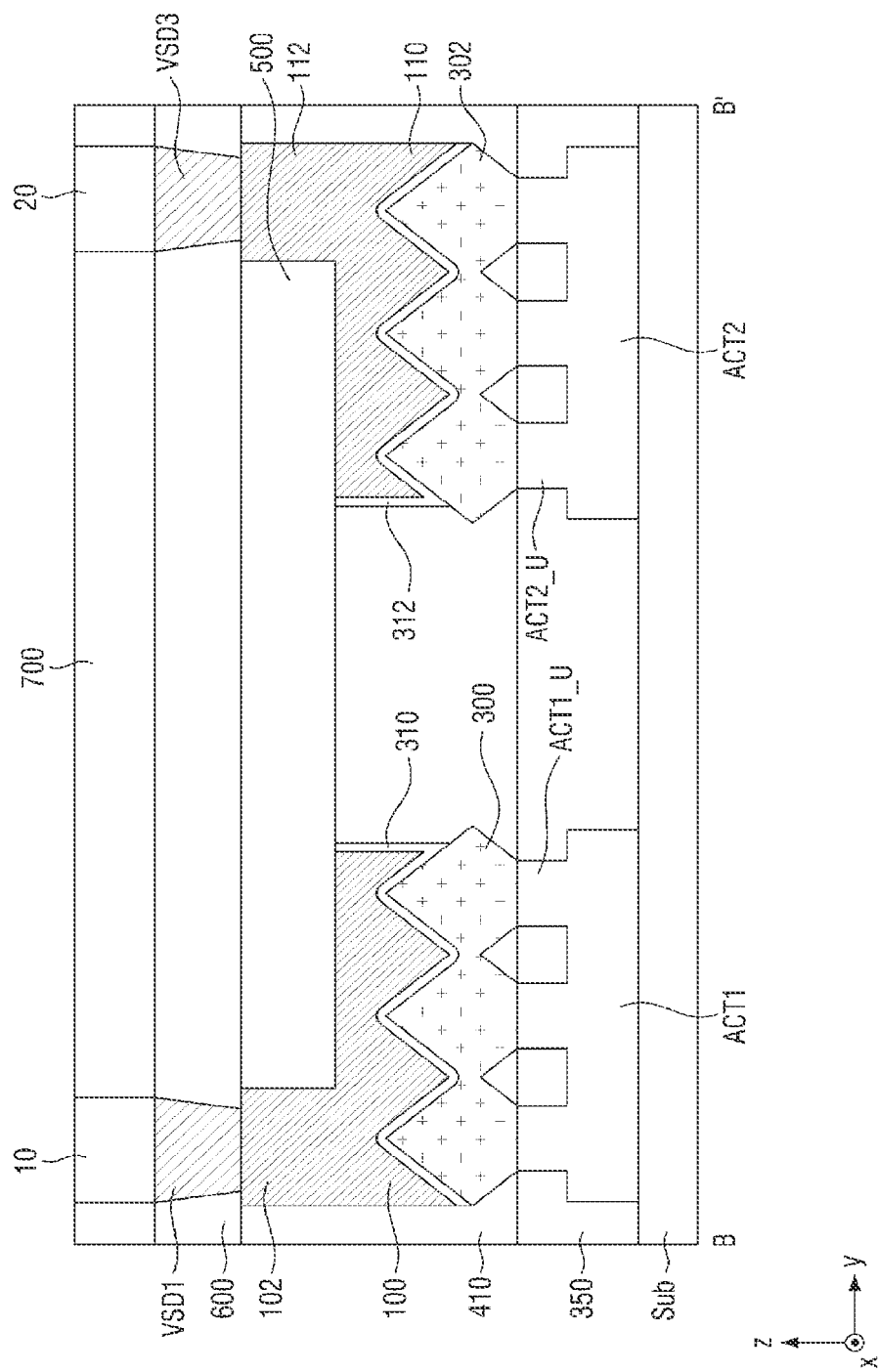
Figure 22:
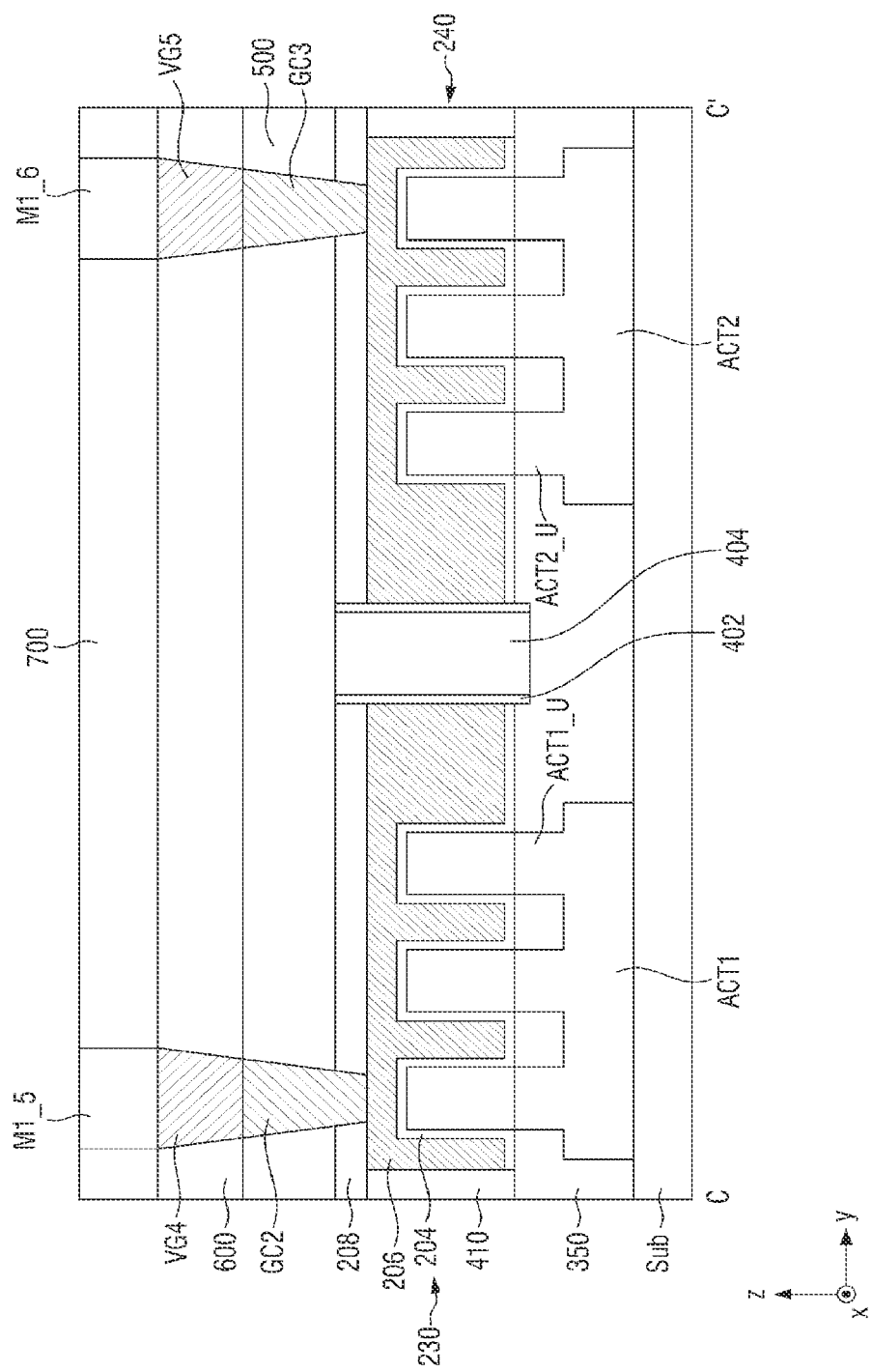
FIGS. 22 and 23 are cross-sectional views taken along line C-C' of FIG. 10.
Figure 23:
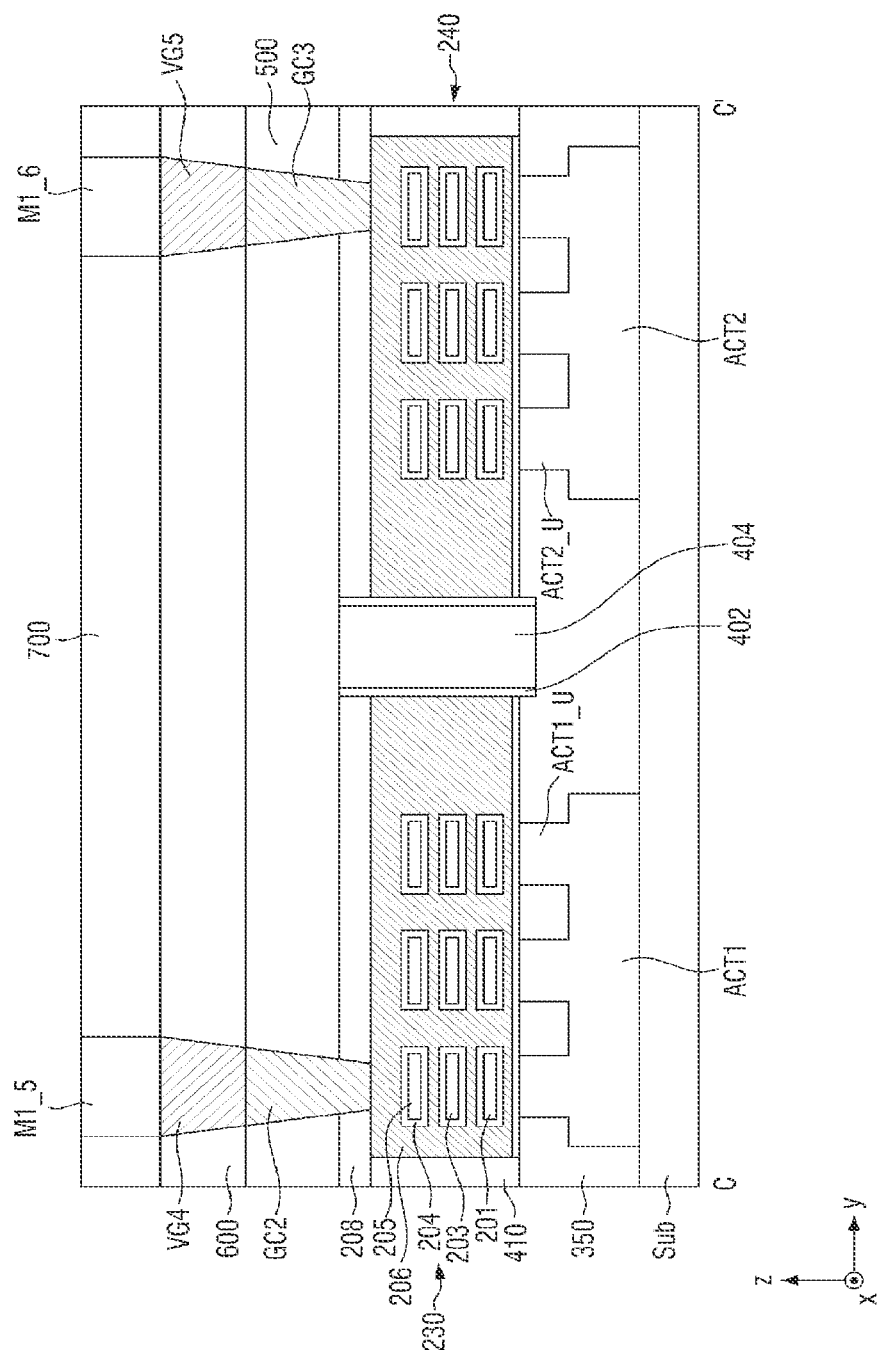

FIGS. 18 and 19 are cross-sectional views taken along line A-A' of FIG. 10. FIGS. 20 and 21 are cross-sectional views taken along line B-B' of FIG. 10. FIGS. 22 and 23 are cross-sectional views taken along line C-C' of FIG. 10.

Referring to FIG. 18, the semiconductor integrated circuit including the integrated circuit according to some example embodiments may have a fin-type transistor (FinFET) structure including a channel region of a fin-type pattern shape.

The fin-type transistor according to some example embodiments may be formed above a substrate Sub and on the active region (e.g., the first active region ACT1) disposed on the substrate Sub.

The substrate Sub may be a silicon substrate or a silicon-on-insulator (SOI). Alternatively, the substrate Sub may include silicon germanium, silicon germanium on insulator (SGOI), indium antimonide, lead tellurium compound, indium arsenide, indium phosphide, gallium arsenide, and/or gallium antimonide, but the present disclosure is not limited thereto.

The first active region ACT1 may be defined along the first direction x. The first active region ACT1 may be defined by a deep trench. The first active region ACT1 may be a region in which a p-type transistor is formed. For example, the first active region ACT1 may include a well region doped with n-type impurities. The first active region ACT1 may protrude from the substrate Sub. The first active region ACT1 may include an epitaxial layer grown from the substrate Sub.

The fin-type transistor according to some example embodiments includes the plurality of gate structures (e.g., the first gate structure 200, the second gate structure 210, the fourth gate structure 230, and the sixth gate structure 250), a source/drain region 300, a silicide layer 310, a first interlayer insulating film 400, and a second interlayer insulating film 500.

Each of the plurality of gate structures (e.g., the first gate structure 200, the second gate structure 210, the fourth gate structure 230, and the sixth gate structure 250) may include a gate spacer 202, a gate insulating film 204, a gate electrode 206, and a capping pattern 208.

The structure of each of the plurality of gate structures is not limited to that illustrated in this drawing.

The plurality of gate structures (e.g., the first gate structure 200, the second gate structure 210, the fourth gate structure 230, and the sixth gate structure 250) and the source/drain region 300 may extend in the second direction y on the first active region ACT1.

The gate spacer 202 may extend in the third direction z along both sidewalls of the gate insulating film 204. The gate insulating film 204 may be disposed between the gate electrode 206 and the gate spacer 202 and below the capping pattern 208. The capping pattern 208 may be disposed on each of the gate electrode 206 and the gate insulating film 204. The gate spacer 202, the gate insulating film 204, and the capping pattern 208 may include an insulating material.

The source/drain region 300 may be formed by removing a portion of the first active region ACT1 to form a recess and then filling the recess through an epitaxial process. The source/drain region 300 may be formed on the first active region ACT1. The source/drain region 300 may be doped with impurities of a conductivity type which is different from that of the semiconductor pattern formed on the first active region ACT1.

The fin-type transistor according to some example embodiments further includes a plurality of gate contacts (e.g., the first gate contact GC1 and the second gate contact GC2), a plurality of gate contact vias (e.g., the second gate contact via VG2 and the fourth gate contact via VG4), a plurality of source/drain contacts (e.g., the first source/drain contact 100, the third source/drain contact 120, the fifth source/drain contact 140, and the sixth source/drain contact 150), a third interlayer insulating film 600, a fourth interlayer insulating film 700, and a plurality of metal lines (e.g., the first_second metal line M1_2 and the first_fifth metal line M1_5) in order to receive electric signals.

The silicide layer 310 may be disposed between the source/drain region 300 and each of the plurality of source/drain contacts (e.g., the first source/drain contact 100, the third source/drain contact 120, the fifth source/drain contact 140, and the sixth source/drain contact 150).

The plurality of source/drain contacts (e.g., the first source/drain contact 100, the third source/drain contact 120, the fifth source/drain contact 140, and the sixth source/drain contact 150) may be electrically connected to each other through the source/drain region 300 and the silicide layer 310. Each of the plurality of source/drain contacts (e.g., the first source/drain contact 100, the third source/drain contact 120, the fifth source/drain contact 140, and the sixth source/drain contact 150) may be formed in the third direction z and may extend in the second direction y.

The plurality of gate contacts (e.g., the first gate contact GC1 and the second gate contact GC2) may be electrically connected to the gate structures (e.g., the second gate structure 210 and the fourth gate structure 230), respectively. The plurality of gate contact vias (e.g., the second gate contact via VG2 and the fourth gate contact via VG4) may be electrically connected to the plurality of gate contacts (e.g., the first gate contact GC1 and the second gate contact GC2), respectively. The plurality of gate contact vias (e.g., the second gate contact via VG2 and the fourth gate contact via VG4) may be electrically connected to the metal lines (e.g., the first_second metal line M1_2 and the first_fifth metal line M1_5), respectively.

The first interlayer insulating film 400 may surround the plurality of gate structures (e.g., the first gate structure 200, the second gate structure 210, the fourth gate structure 230, and the sixth gate structure 250) and the plurality of source/drain contacts (e.g., the first source/drain contact 100, the third source/drain contact 120, the fifth source/drain contact 140, and the sixth source/drain contact 150).

The second interlayer insulating film 500 may be formed on the first interlayer insulating film 400. The second interlayer insulating film 500 may surround the plurality of source/drain contacts (e.g., the first source/drain contact 100, the third source/drain contact 120, the fifth source/drain contact 140, and the sixth source/drain contact 150).

The third interlayer insulating film 600 may be formed on the second interlayer insulating film 500. The third interlayer insulating film 600 may surround the plurality of gate contact vias (e.g., the second gate contact via VG2 and the fourth gate contact via VG4).

The fourth interlayer insulating film 700 may be formed on the third interlayer insulating film 600. The fourth interlayer insulating film 700 may surround the metal lines (e.g., the first_second metal line M1_2 and the first_fifth metal line M1_5).

The first to fourth interlayer insulating films 400 and 700 may include an insulating material.

Referring to FIG. 19, the semiconductor integrated circuit including the integrated circuit according to some example embodiments may have a multi-bridge channel field effect transistor (MBCFET) structure including a plurality of nanowires. Descriptions overlapping with FIG. 18 will be omitted, and the description will be mainly focused on the differences.

A first nanowire 201, a second nanowire 203, and a third nanowire 205 may be sequentially disposed to be spaced apart from each other on the substrate Sub or the first active region ACT1 in the third direction z. The first to third nanowires 201 to 205 may extend in the second direction y.

The gate electrode 206, the gate insulating film 204 surrounding the gate electrode 206, and the gate spacer 202 formed on sidewalls of the gate insulating film 204 may surround each of the first to third nanowires 201 to 205.

The gate spacer 202 is illustrated as being formed of a single layer, but the present disclosure is not limited thereto. That is, in some example embodiments, the gate spacer 202 may be formed of multiple films.

The gate insulating film 204 may be disposed between the gate electrode 206 and the gate spacer 202, between the gate electrode 206 and the third nanowire 205, between the gate electrode 206 and the second nanowire 203, between the gate electrode 206 and the first nanowire 201, and between the gate electrode 206 and the first active region ACT1.

The source/drain region 300 may be disposed on at least one side of each of the first to third nanowires 201 to 205. In addition, the source/drain region 300 may be in contact with each of the first to third nanowires 201 to 205.

Referring to FIG. 20, a plurality of source/drain regions 300 and 302 may be formed on the first active region ACT1 and the second active region ACT2, respectively, disposed on the substrate SUB. Descriptions overlapping with the above descriptions will be omitted.

At least a portion of the plurality of source/drain regions 300 and 302 may be included in the source/drain region of the plurality of transistors. The source/drain region 300 formed on the first active region ACT1 and the source/drain region 302 formed on the second active region ACT2 may be doped with impurities of different conductivity types.

A cell isolation film 350 may be formed on the substrate Sub. The cell isolation film 350 may fill a deep trench separating the first active region ACT1 from the second active region ACT2. The cell isolation film 350 may extend in the first direction x. The cell isolation film 350 may include an insulating material.

A source/drain contact cut pattern 410 may be disposed on the cell isolation film 350. The source/drain contact cut pattern 410 may extend in the first direction x. The source/drain contact cut pattern 410 may include an insulating material.

The source/drain contact cut pattern 410 may cut the source/drain contacts at the boundary of the cells. The source/drain contact cut pattern 410 may be in contact with the source/drain contacts (e.g., the first source/drain contact 100 and the second source/drain contact 110).

A first source/drain upper contact 102 is formed on the first source/drain contact 100, and the first source/drain upper contact 102 and the first source/drain contact 100 may fill a trench defined by the silicide layer 310.

Similarly, a second source/drain upper contact 112 is formed on the second source/drain contact 110, and the second source/drain upper contact 112 and the second source/drain contact 110 may fill a trench defined by a silicide layer 312.

The second interlayer insulating film 500 is disposed between the first source/drain upper contact 102, the first source/drain contact 100, the second source/drain upper contact 112, and the second source/drain contact 110. The second interlayer insulating film 500 may be disposed on the first interlayer insulating film.

The first source/drain contact via VSD1 may be disposed on the first source/drain upper contact 102. In addition, the third source/drain contact via VSD3 may be disposed on the second source/drain upper contact 112.

The power rail 10 may be disposed on the first source/drain contact via VSD1, and the ground rail 20 may be disposed on the third source/drain contact via VSD3.

The third interlayer insulating film 600 may be disposed on the second interlayer insulating film 500, and the fourth interlayer insulating film 700 may be disposed on the third interlayer insulating film 600.

With reference to FIG. 21, the difference from FIG. 20 will be mainly described. In FIG. 21, the silicide layers 310 and 312 may be formed only between the source/drain regions 300 and 302 unlike in FIG. 20. That is, the silicide layer 310 may not be formed on an outer sidewall of each of the first source/drain contact 100 and the first source/drain upper contact 102 in the first direction x. In addition, the silicide layer 312 may not be formed on an outer sidewall of each of the second source/drain contact 110 and a second source/drain upper contact 112 in the first direction x.

Referring to FIG. 22, the semiconductor integrated circuit including the integrated circuit according to some example embodiments may have a fin-type transistor (FinFET) structure including a channel region of a fin-type pattern shape. Hereinafter, the description overlapping with FIG. 18 will be omitted.

The fin-type transistor according to some example embodiments may be formed above the substrate Sub and on the active regions (e.g., the first active region ACT1 and the second active region ACT2) disposed on the substrate Sub.

A first active upper region ACT1_U may be formed on the first active region ACT1. In addition, a second active upper region ACT2_U may be formed on the second active region ACT2. The gate insulating film 204 may be formed along the first active upper region ACT1_U and the second active upper region ACT2_U. In addition, the gate insulating film 204 may also be formed in a region in which the gate electrode 206 meets the cell isolation film 350.

The gate electrode 206 may be formed on the gate insulating film 204. The gate electrode 206 may be cut by a gate cut pattern 404 and a gate cut pattern spacer 402 formed on sidewalls of the gate cut pattern 404. In addition, the capping pattern 208 on the gate electrode 206 may also be cut by the gate cut pattern 404 and the gate cut pattern spacer 402 formed on the sidewalls of the gate cut pattern 404. The gate cut pattern 404 and the gate cut pattern spacer 402 may include an insulating material.

The second gate contact GC2 and the third gate contact GC3 may be electrically connected to the gate electrode 206 through the capping pattern 208. The fourth gate contact via VG4 and the fifth gate contact via VG5 may be electrically connected to the second gate contact GC2 and the third gate contact GC3, respectively. The first_fifth metal line M1_5 is disposed on the fourth gate contact via VG4 so that the inverted scan active signal Se may be applied to the gate electrode 206 disposed on the first active region ACT1. In addition, the first_sixth metal line M1_6 is disposed on the fifth gate contact via VG5 so that the scan active signal Se may be applied to the gate electrode 206 disposed on the second active region ACT2.

The second interlayer insulating film 500 is formed on the capping pattern 208, the gate cut pattern 404, and the gate cut pattern spacer 402, the third interlayer insulating film 600 is formed on the second interlayer insulating film 500, and the fourth interlayer insulating film 700 is formed on the third interlayer insulating film 600.

Referring to FIG. 23, the semiconductor integrated circuit including the integrated circuit according to some example embodiments may have an MBCFET structure including a plurality of nanowires. Description will be mainly focused on the differences from FIG. 22.

In FIG. 23, the first to third nanowires 201 to 205 may be included on each of the first active upper region ACT1_U and the second active upper region ACT2_U unlike in FIG. 22. Each of the nanowires is surrounded by the gate electrode 206 and the gate insulating film 204.

An enlarged top view as viewed from the top when the source/drain contact is cut, and an enlarged top view as viewed from the top when the gate structure is cut will be described with reference to FIGS. 24 to 27.

Figure 24:
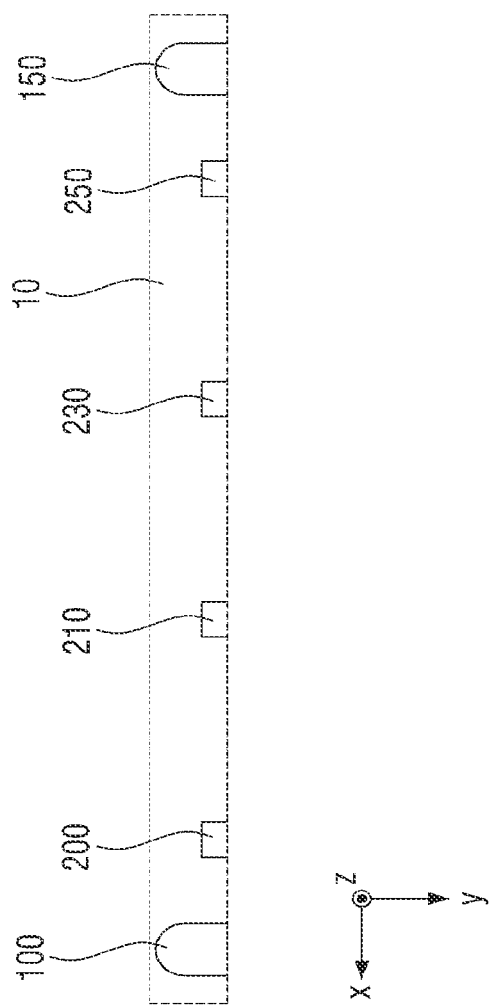
FIGS. 24 and 25 are enlarged views for describing a region SDTR shown in FIG. 10 according to some example embodiments.
Figure 25:
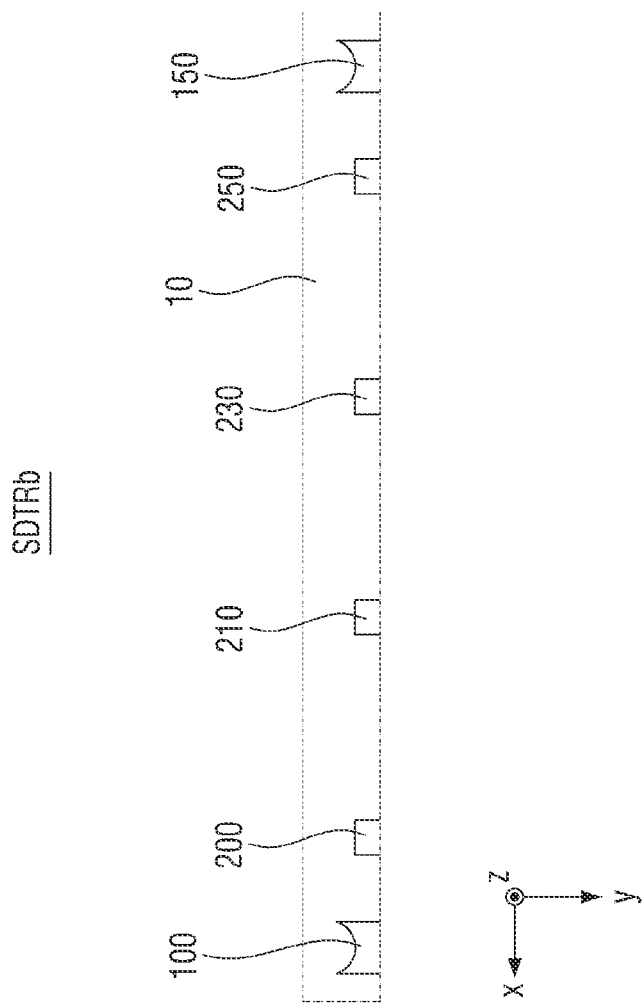
Figure 26:
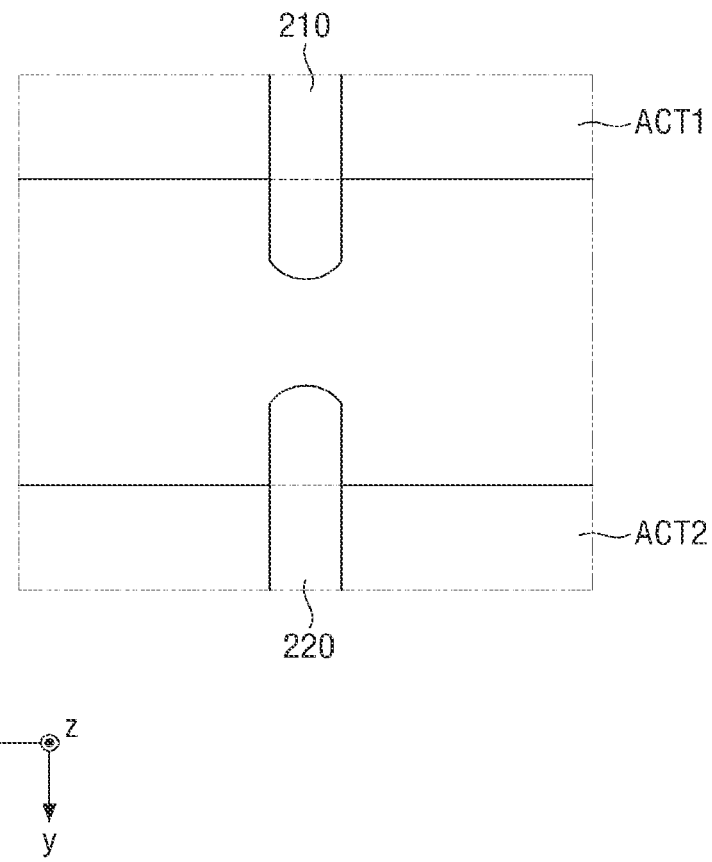
FIGS. 26 and 27 are enlarged views for describing a region GTR shown in FIG. 10 according to some example embodiments.
Figure 27:
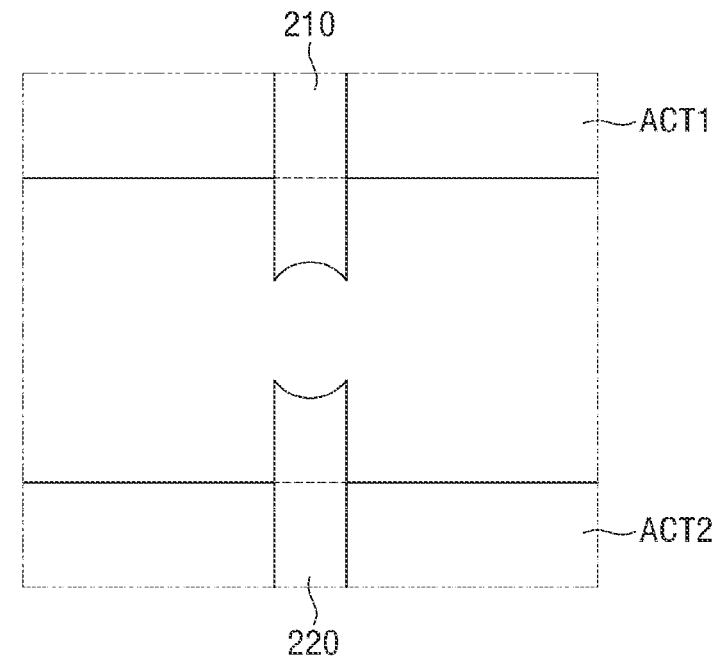

FIGS. 24 and 25 are enlarged views for describing a region SDTR shown in FIG. 10. FIGS. 26 and 27 are enlarged views for describing a region GTR shown in FIG. 10.

Referring to FIG. 24, a region SDTRa of the region SDTR is illustrated in which the previously cut first source/drain contact 100 and sixth source/drain contact 150 are disposed on the layout diagram.

The cut portions of the first source/drain contact 100 and the sixth source/drain contact 150 may have a convex shape. The cut portion of each of the first source/drain contact 100 and the sixth source/drain contact 150 may be an end thereof in the second direction y.

On the other hand, referring to FIG. 25, a cross-sectional view is illustrated in which the first and sixth source/drain contacts 100 and 150 are cut after being formed in the second direction y across both the first active region and the second active region. That is, a region SDTRb of the region SDTR is illustrated.

The cut portions of the first source/drain contact 100 and the sixth source/drain contact 150 may have a concave shape. The cut portion of each of the first source/drain contact 100 and the sixth source/drain contact 150 may be an end thereof in the second direction y.

Referring to FIG. 26, a region GTRa of the region GTR is illustrated in which the previously cut second gate structure 210 and third gate structure 220 are disposed on the layout diagram.

The cut portions of the second gate structure 210 and the third gate structure 220 facing each other have a convex shape. The cut portions of the second gate structure 210 and the third gate structure 220 facing each other may be ends of the second gate structure 210 and the third gate structure 220, respectively.

On the other hand, referring to FIG. 27, a cross-sectional view is illustrated in which the second gate structure 210 and the third gate structure 220 are cut after being continuously formed in the second direction y across both the first active region and the second active region. That is, a region GTRb of the region GTR is illustrated.

The cut portions of the second gate structure 210 and the third gate structure 220 may have a convex shape. The cut portions of the second gate structure 210 and the third gate structure 220 facing each other may be ends of the second gate structure 210 and the third gate structure 220, respectively. The second gate structure 210 and the third gate structure 220 formed continuously in the second direction y across both the first active region and the second active region may be formed by cutting like being punched with a punch.

FIG. 28 is a circuit diagram illustrating the scan circuit S_C shown in FIG. 8.

Referring to FIG. 28, unlike the scan circuit S_C(R3_1) shown in FIG. 9, the circuit that receives the data signal D may be configured as a first tri-state inverter TRI1.

That is, a scan circuit S_C(R3_2) including the integrated circuit according to some example embodiments may invert and output the data signal D under the control of the scan active signal. The description of the tri-state inverter is overlapped with the description of FIG. 1, and thus the description thereof will be omitted.

Figure 29:
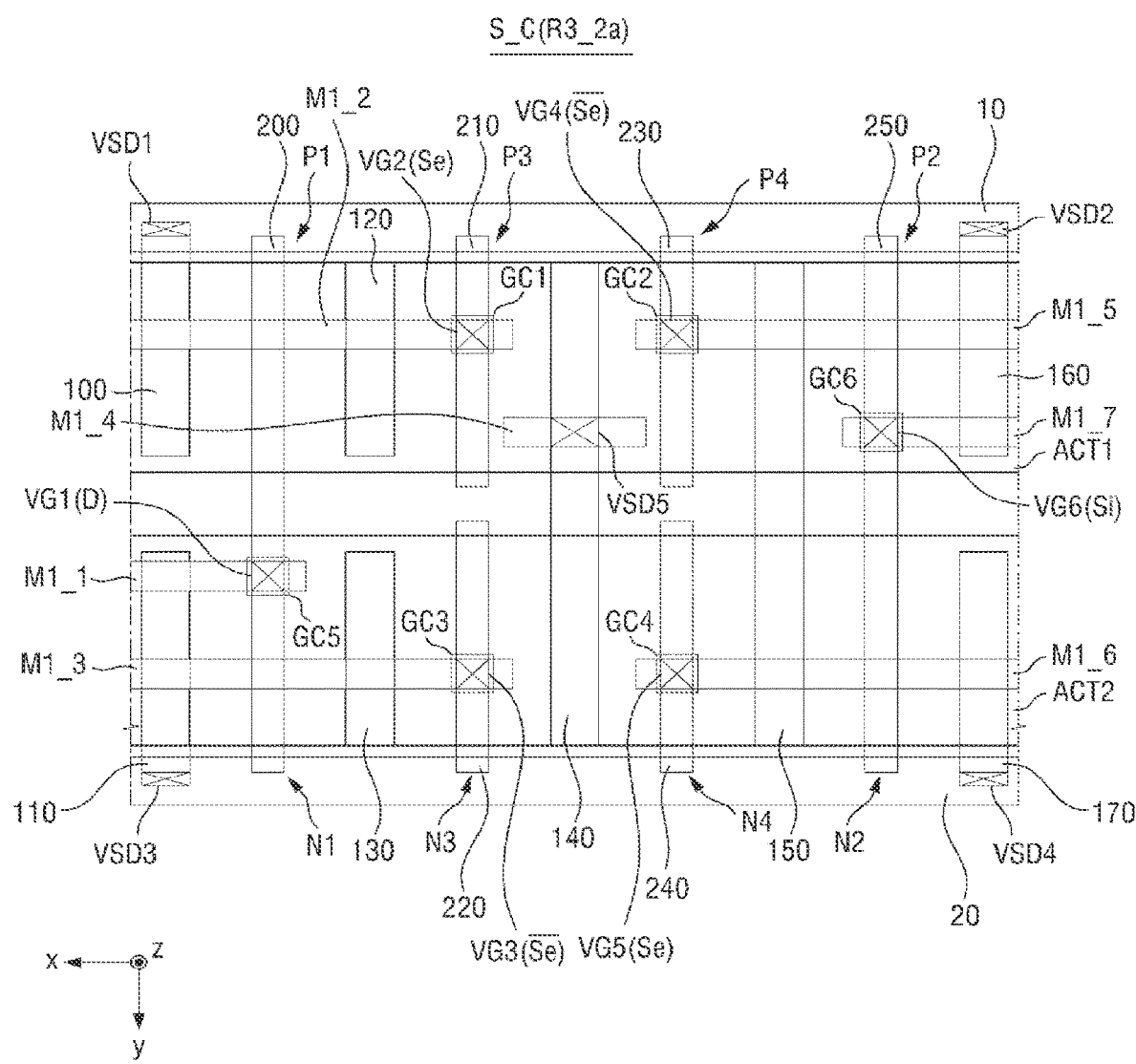
FIGS. 29 to 31 are layout diagrams of FIG. 28 according to some example embodiments.
Figure 30:
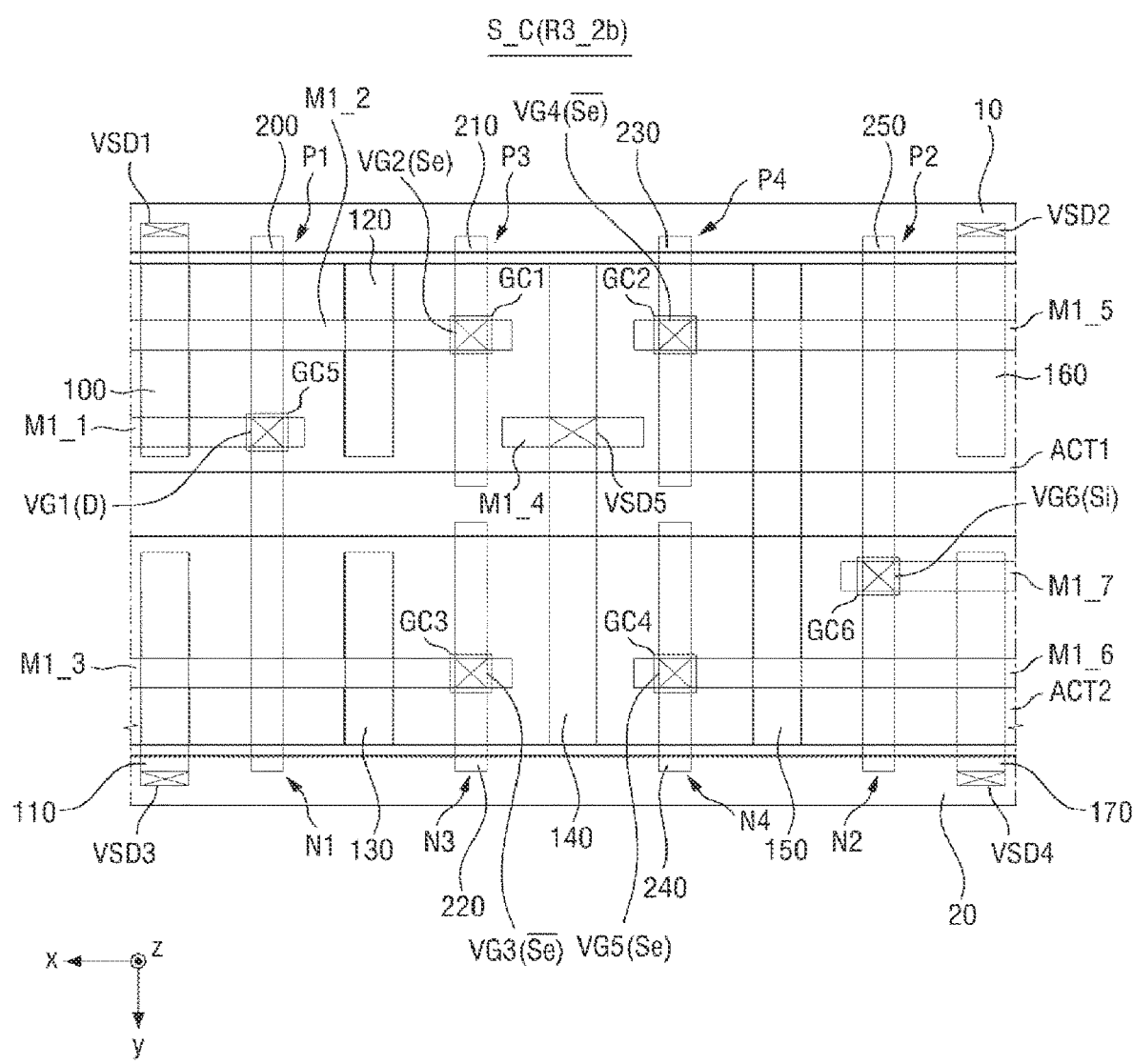
Figure 31:
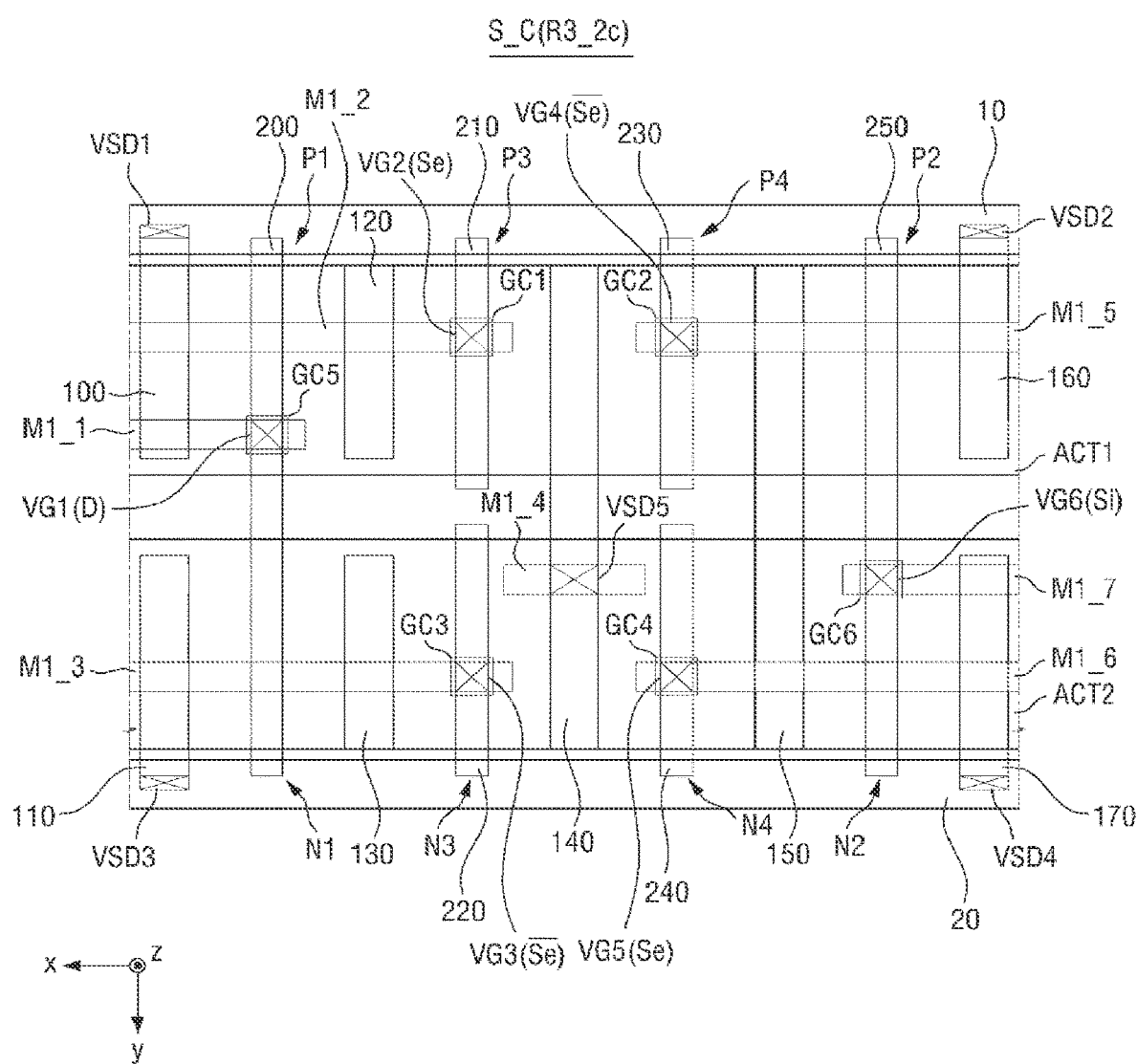

FIGS. 29 to 31 are layout diagrams according to some example embodiments exemplarily illustrating FIG. 28. Hereinafter, in order to avoid duplicate descriptions, the common parts of FIGS. 29 to 31 are described only through FIG. 29, and only the differences will be briefly described with reference to the corresponding drawings.

Referring to FIG. 29, first to fourth PMOS transistors P1 to P4 may be formed on a first active region ACT1 extending in a first direction x. Further, first to fourth NMOS transistors N1 to N4 may be formed on a second active region ACT2 extending in the first direction x and disposed to be spaced apart from the first active region ACT1 in a second direction y.

A power rail 10 may be disposed at an upper portion of the first active region ACT1 in the second direction y. In addition, a ground rail 20 may be disposed at a lower portion of the second active region ACT2 in the second direction y.

A scan circuit S_C(R3_2a) including the integrated circuit according to some example embodiments may include a plurality of gate structures and a plurality of source/drain contacts extending in the second direction y and disposed to be spaced apart from each other in the first direction x.

For example, a first source/drain contact 100 and a second source/drain contact 110 may be disposed on the first active region ACT1 and the second active region ACT2, respectively, to be spaced apart from each other in the second direction y. That is, the first source/drain contact 100 may be connected to the power rail 10 through a first source/drain contact via VSD1 to supply the power voltage to the first PMOS transistor P1. In addition, the second source/drain contact 110 may be connected to the ground rail 20 through a third source/drain contact via VSD3 to ground the first NMOS transistor N1.

A first gate structure 200 is disposed to be spaced apart from the first and second source/drain contacts 100 and 110 in the first direction x. The first gate structure 200 may be disposed on the first active region ACT1 and the second active region ACT2.

A third source/drain contact 120 and a fourth source/drain contact 130 may be disposed on the first active region ACT1 and the second active region ACT2, respectively, to be spaced apart from each other in the second direction y and to be spaced apart from the first gate structure 200 in the first direction x.

A second gate structure 210 may be disposed on the first active region ACT1 to be spaced apart from the third source/drain contact 120 and the fourth source/drain contact 130 in the first direction x. In addition, a third gate structure 220 may be disposed on the second active region ACT2 to be spaced apart from the third source/drain contact 120 and the fourth source/drain contact 130 in the first direction x.

A fifth source/drain contact 140 may be disposed to extend in the second direction y and to be spaced apart from the second gate structure 210 and the third gate structure 220 in the first direction x. A drain of the third PMOS transistor P3 may be connected to a drain of the third NMOS transistor N3 through the fifth source/drain contact 140. In addition, a drain of the fourth PMOS transistor P4 may be connected to a source of the fourth NMOS transistor N4 through the fifth source/drain contact 140. That is, the drain of the third PMOS transistor P3, the drain of the third NMOS transistor N3, the drain of the fourth PMOS transistor P4, and the source of the fourth NMOS transistor N4 may be connected to each other through the fifth source/drain contact 140. By connecting a plurality of transistors through one source/drain contact (e.g., the fifth source/drain contact 140), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A fourth gate structure 230 may be disposed on the first active region ACT1 to be spaced apart from the fifth source/drain contact 140 in the first direction x. In addition, a fifth gate structure 240 may be disposed on the second active region ACT2 to be spaced apart from the fifth source/drain contact 140 in the first direction x.

A sixth source/drain contact 150 may be disposed to be spaced apart from the fourth gate structure 230 and the fifth gate structure 240 in the first direction x. The sixth source/drain contact 150 may extend in the second direction y and may be disposed on the first active region ACT1 and the second active region ACT2. That is, a source of the fourth PMOS transistor P4 and a drain of the fourth NMOS transistor N4 may be connected to each other through the sixth source/drain contact 150. In addition, a drain of the second PMOS transistor P2 may be connected to a drain of the second NMOS transistor N2 through the sixth source/drain contact 150. That is, the source of the fourth PMOS transistor P4, the drain of the fourth NMOS transistor N4, the drain of the second PMOS transistor P2, and the drain of the second NMOS transistor N2 may be connected to each other through the sixth source/drain contact 150. By connecting a plurality of transistors through one source/drain contact (e.g., the sixth source/drain contact 150), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A sixth gate structure 250 may be disposed on the first active region ACT1 and the second active region ACT2 to be spaced apart from the sixth source/drain contact 150 in the first direction x. In addition, a seventh source/drain contact 160 may be disposed on the first active region ACT1 to be spaced apart from the sixth gate structure 250 in the first direction x. The seventh source/drain contact 160 may be connected to the power rail 10 through a second source/drain contact via VSD2 to supply the power voltage to the second PMOS transistor P2. In addition, an eighth source/drain contact 170 may be disposed on the second active region ACT2 to be spaced apart from the sixth gate structure 250 in the first direction x. The eighth source/drain contact 170 may be connected to the ground rail 20 through a fourth source/drain contact via VSD4 to ground the second NMOS transistor N2.

Next, the structure and operation to which the signal is applied, together with structures extending in a third direction z, will be described.

A fifth gate contact GC5 extending in the third direction z may be disposed on the first gate structure 200. In addition, a first gate contact via VG1 extending in the third direction z may be disposed on the fifth gate contact GC5. The first gate contact via VG1 may be connected to a first_first metal line M1_1 extending in the first direction x. That is, the first gate structure 200 may be electrically connected to the first_first metal line M1_1, the first gate contact via VG1, and the fifth gate contact GC5 to receive the data signal D.

Thus, the first PMOS transistor P1 and the first NMOS transistor N1 may be gated through the data signal D.

The fifth gate contact GC5 and the first gate contact via VG1, which are electrically connected to the first gate structure 200, are illustrated in this drawing as being disposed on the first active region ACT1, but are not limited thereto, and may be disposed on the second active region ACT2 as illustrated in FIGS. 30 and 31.

A first gate contact GC1 extending in the third direction z may be disposed on the second gate structure 210. In addition, a second gate contact via VG2 extending in the third direction z may be disposed on the first gate contact GC1. The second gate contact via VG2 may be connected to a first_second metal line M1_2 extending in the first direction x. That is, the second gate structure 210 may be electrically connected to the first_second metal line M1_2, the second gate contact via VG2, and the first gate contact GC1 to receive the scan active signal Se. Thus, the third PMOS transistor P3 may be gated through the scan active signal Se.

The positions of the first gate contact GC1 and the second gate contact via VG2, which are electrically connected to the second gate structure 210, are not limited thereto.

A third gate contact GC3 extending in the third direction z may be disposed on the third gate structure 220. In addition, a third gate contact via VG3 extending in the third direction z may be disposed on the third gate contact GC3. The third gate contact via VG3 may be connected to a first_third metal line M1_3 extending in the first direction x. That is, the third gate structure 220 may be electrically connected to the first_third metal line M1_3, the third gate contact via VG3, and the third gate contact GC3 to receive the inverted active signal Se. Thus, the third NMOS transistor N3 may be gated through the inverted active signal Se.

The positions of the third gate contact GC3 and the third gate contact via VG3, which are electrically connected to the third gate structure 220, are not limited thereto.

A second gate contact GC2 extending in the third direction z may be disposed on the fourth gate structure 230. In addition, a fourth gate contact via VG4 extending in the third direction z may be disposed on the second gate contact GC2. The fourth gate contact via VG4 may be connected to a first_fifth metal line M1_5 extending in the first direction x. That is, the fourth gate structure 230 may be electrically connected to the first_fifth metal line M1_5, the fourth gate contact via VG4, and the second gate contact GC2 to receive the inverted active signal Se. Thus, the fourth PMOS transistor P4 may be gated through the inverted active signal Se.

The positions of the second gate contact GC2 and the fourth gate contact via VG4, which are electrically connected to the fourth gate structure 230, are not limited thereto.

A fourth gate contact GC4 extending in the third direction z may be disposed on the fifth gate structure 240. In addition, a fifth gate contact via VG5 extending in the third direction z may be disposed on the fourth gate contact GC4. The fifth gate contact via VG5 may be connected to a first_sixth metal line M1_6 extending in the first direction x. That is, the fifth gate structure 240 is electrically connected to the first_sixth metal line M1_6, the fifth gate contact via VG5, and the fourth gate contact GC4 to receive the scan active signal Se. Thus, the fourth NMOS transistor N4 may be gated through the scan active signal Se.

The positions of the fourth gate contact GC4 and the fifth gate contact via VG5, which are electrically connected to the fifth gate structure 240, are not limited thereto.

A sixth gate contact GC6 extending in the third direction z may be disposed on the sixth gate structure 250. In addition, a sixth gate contact via VG6 extending in the third direction z may be disposed on the sixth gate contact GC6. The sixth gate contact via VG6 may be connected to a first_seventh metal line M1_7 extending in the first direction x. That is, the sixth gate structure 250 may be electrically connected to the first_seventh metal line M1_7, the sixth gate contact via VG6, and the sixth gate contact GC6 to receive the scan input signal Si. Thus, the second PMOS transistor P2 and the second NMOS transistor N2 may be gated through the scan input signal Si.

The sixth gate contact GC6 and the sixth gate contact via VG6, which are electrically connected to the sixth gate structure 250, are illustrated in this drawing as being disposed on the second active region ACT2, but are not limited thereto, and may be disposed on the first active region ACT1 as illustrated in FIGS. 30 and 31.

A fifth source/drain contact via VSD5 extending in the third direction z may be disposed on the fifth source/drain contact 140. In addition, a first_fourth metal line M1_4 extending in the first direction x may be disposed on the fifth source/drain contact via VSD5 and may be connected to the outside.

The fifth source/drain contact via VSD5, which is electrically connected to the fifth source/drain contact 140, is illustrated in this drawing as being disposed on the first active region ACT1, but is not limited thereto, and may be disposed on the second active region ACT2 as illustrated in FIG. 31.

The plurality of gate structures (e.g., the first to sixth gate structures 200 to 250) and the plurality of source/drain contacts (e.g., the first to eighth source/drain contacts 100 to 170), which are disposed to be adjacent to each other in the first direction x, may be spaced apart from each other by 1 CPP. As an example, the first gate structure 200 and the first source/drain contact 100 adjacent to each other may be spaced apart from each other by 1 CPP.

For example, assume that the first gate structure 200 and the first source/drain contact 100 are adjacent to each other. When the distance between a center line of the first gate structure 200 extending in the second direction y and a center line of the first source/drain contact 100 extending in the second direction y is 1 CPP, it means that the other gate structure or source/drain contact is not disposed between the first gate structure 200 and the first source/drain contact 100.

Further, the metal lines (e.g., the first_first to first_seventh metal lines M1_1 to M1_7), which are disposed to be adjacent to each other in the second direction y, may be spaced apart from each other by 1 CPP. As an example, the first_first metal line M1_1 and the first_second metal line M1_2 adjacent to each other may be spaced apart from each other by 1 CPP.

For example, assume that the first_first metal line M1_1 and the first_second metal line M1_2 are adjacent to each other. When the distance between a center line of the first_first metal line M1_1 extending in the first direction x and a center line of the first_second metal line M1_2 extending in the first direction x is 1 CPP, it means that the other metal line is not disposed between the first_first metal line M1_1 and the first_second metal line M1_2.

FIG. 32 is a circuit diagram illustrating the scan circuit S_C shown in FIG. 8.

Referring to FIG. 32, unlike the scan circuit S_C(R3_1) shown in FIG. 9, the circuit that receives the scan input signal Si may be configured as a second tri-state inverter TRI2.

That is, a scan circuit S_C(R3_3) including the integrated circuit according to some example embodiments may invert and output the scan input signal Si under the control of the scan active signal. The description of the tri-state inverter is overlapped with the description of FIG. 1, and thus the description thereof will be omitted.

Figure 33:
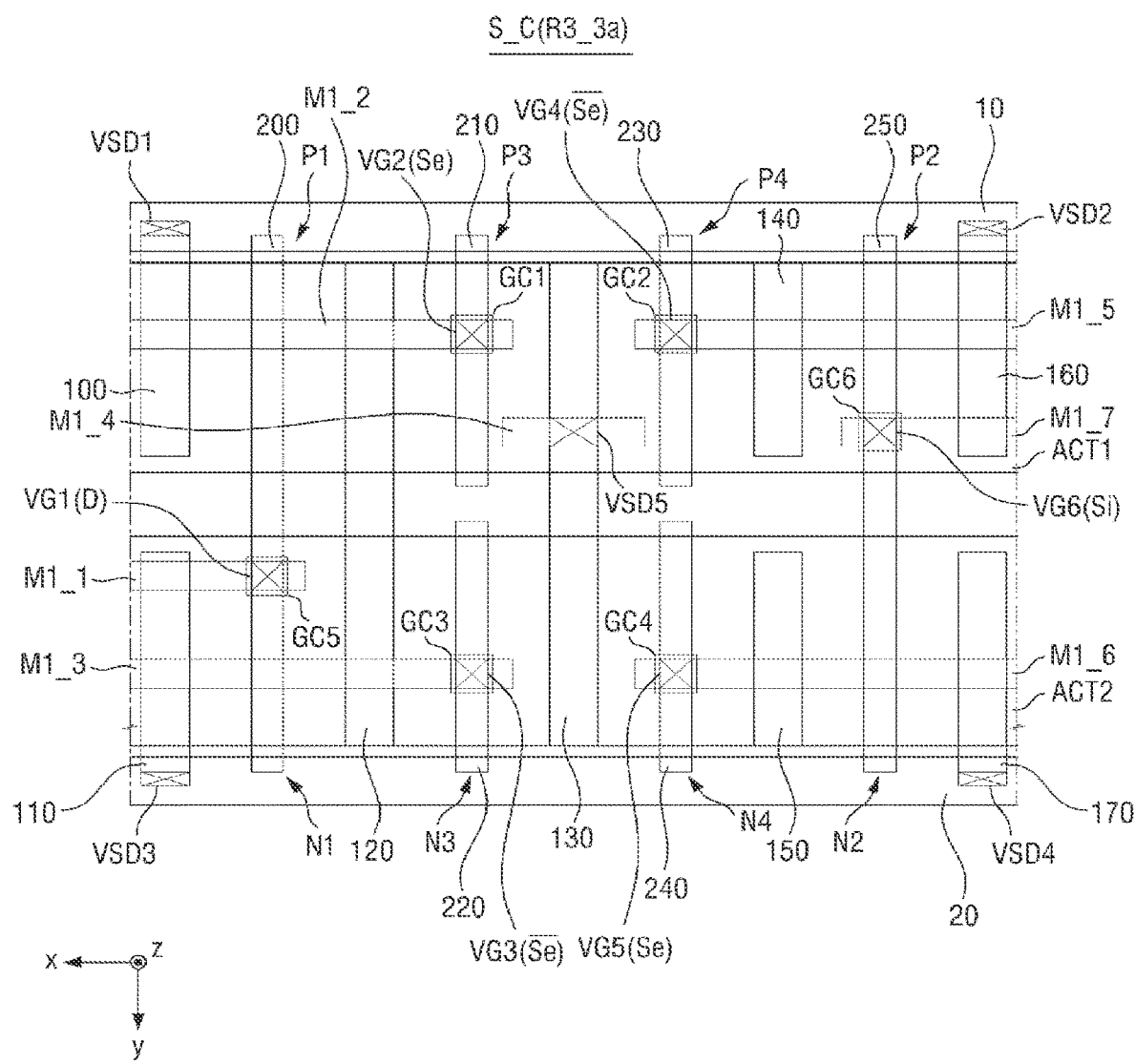
FIGS. 33 to 35 are layout diagrams of FIG. 32 according to some example embodiments.
Figure 34:
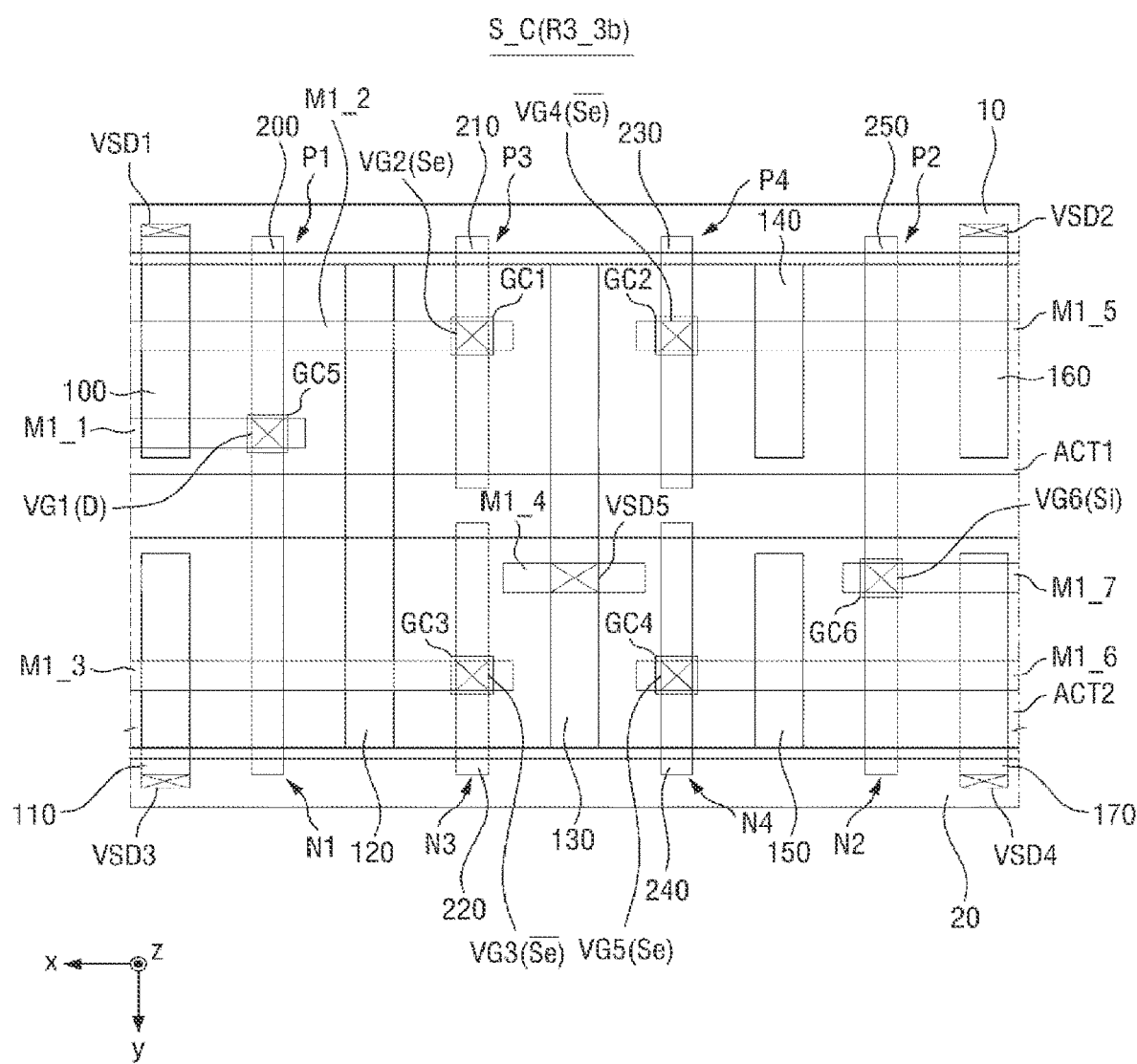
Figure 35:
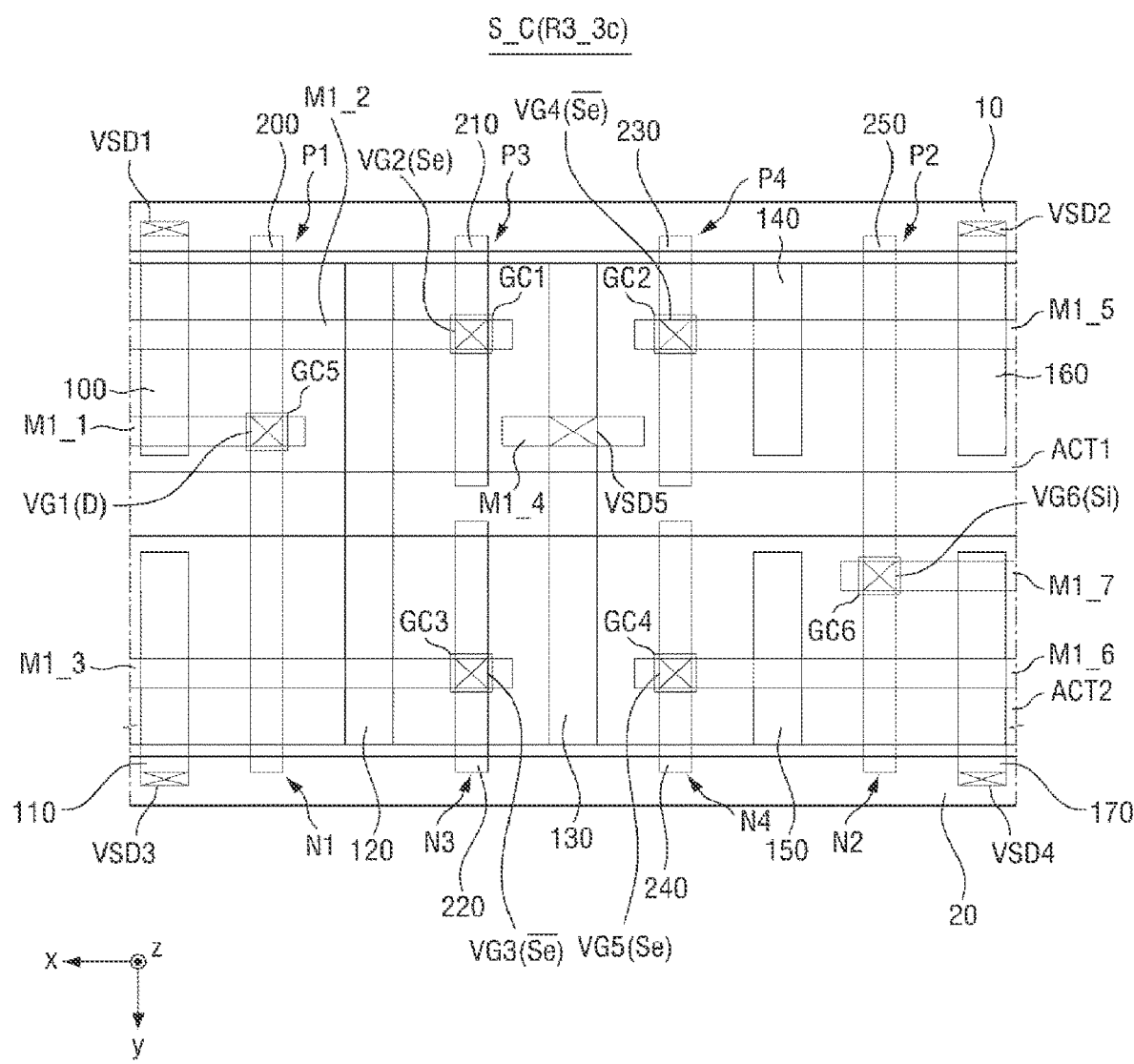

FIGS. 33 to 35 are layout diagrams according to some example embodiments exemplarily illustrating FIG. 32. Hereinafter, in order to avoid duplicate descriptions, the common parts of FIGS. 33 to 35 are described only through FIG. 33, and only the differences will be briefly described with reference to the corresponding drawings.

Referring to FIG. 33, first to fourth PMOS transistors P1 to P4 may be formed on a first active region ACT1 extending in a first direction x. Further, first to fourth NMOS transistors N1 to N4 may be formed on a second active region ACT2 extending in the first direction x and disposed to be spaced apart from the first active region ACT1 in a second direction y.

A power rail 10 may be disposed at an upper portion of the first active region ACT1 in the second direction y. In addition, a ground rail 20 may be disposed at a lower portion of the second active region ACT2 in the second direction y.

A scan circuit S_C(R3_3a) including the integrated circuit according to some example embodiments may include a plurality of gate structures and a plurality of source/drain contacts extending in the second direction y and disposed to be spaced apart from each other in the first direction x.

For example, a first source/drain contact 100 and a second source/drain contact 110 may be disposed on the first active region ACT1 and the second active region ACT2, respectively, to be spaced apart from each other in the second direction y. That is, the first source/drain contact 100 may be connected to the power rail 10 through a first source/drain contact via VSD1 to supply the power voltage to the first PMOS transistor P1. In addition, the second source/drain contact 110 may be connected to the ground rail 20 through a third source/drain contact via VSD3 to ground the first NMOS transistor N1.

A first gate structure 200 is disposed to be spaced apart from the first and second source/drain contacts 100 and 110 in the first direction x. The first gate structure 200 may be disposed on the first active region ACT1 and the second active region ACT2.

A third source/drain contact 120 may be disposed to be spaced apart from the first gate structure 200 in the first direction x. The third source/drain contact 120 may extend in the second direction y and may be disposed on the first active region ACT1 and the second active region ACT2. That is, a drain of the first PMOS transistor P1 and a drain of the first NMOS transistor N1 may be connected to each other through the third source/drain contact 120. In addition, a source of the third PMOS transistor P3 may be connected to a drain of the third NMOS transistor N3 through the third source/drain contact 120. That is, the drain of the first PMOS transistor P1, the drain of the first NMOS transistor N1, the source of the third PMOS transistor P3 and the drain of the third NMOS transistor N3 may be connected to each other through the third source/drain contact 120. By connecting a plurality of transistors through one source/drain contact (e.g., the third source/drain contact 120), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A second gate structure 210 may be disposed on the first active region ACT1 to be spaced apart from the third source/drain contact 120 in the first direction x. In addition, a third gate structure 220 may be disposed on the second active region ACT2 to be spaced apart from the third source/drain contact 120 in the first direction x.

A fourth source/drain contact 130 may be disposed to extend in the second direction y and to be spaced apart from the second gate structure 210 and the third gate structure 220 in the first direction x. A drain of the third PMOS transistor P3 may be connected to a source of the third NMOS transistor N3 through the fourth source/drain contact 130. In addition, a drain of the fourth PMOS transistor P4 may be connected to a source of the fourth NMOS transistor N4 through the fourth source/drain contact 130. That is, the drain of the third PMOS transistor P3, the source of the third NMOS transistor N3, the drain of the fourth PMOS transistor P4, and the source of the fourth NMOS transistor N4 may be connected to each other through the fourth source/drain contact 130. By connecting a plurality of transistors through one source/drain contact (e.g., the fourth source/drain contact 130), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A fourth gate structure 230 may be disposed on the first active region ACT1 to be spaced apart from the fourth source/drain contact 130 in the first direction x. In addition, a fifth gate structure 240 may be disposed on the second active region ACT2 to be spaced apart from the fourth source/drain contact 130 in the first direction x.

A fifth source/drain contact 140 and a sixth source/drain contact 150 may be disposed to be spaced apart from the fourth gate structure 230 and the fifth gate structure 240 in the first direction x. The fifth source/drain contact 140 may extend in the second direction y and may be disposed on the first active region ACT1. The sixth source/drain contact 150 may extend in the second direction y and may be disposed on the second active region ACT2.

A sixth gate structure 250 may be disposed on the first active region ACT1 and the second active region ACT2 to be spaced apart from the fifth source/drain contact 140 and the sixth source/drain contact 150 in the first direction x. In addition, a seventh source/drain contact 160 may be disposed on the first active region ACT1 to be spaced apart from the sixth gate structure 250 in the first direction x. The seventh source/drain contact 160 may be connected to the power rail 10 through a second source/drain contact via VSD2 to supply the power voltage to the second PMOS transistor P2. In addition, an eighth source/drain contact 170 may be disposed on the second active region ACT2 to be spaced apart from the sixth gate structure 250 in the first direction x. The eighth source/drain contact 170 may be connected to the ground rail 20 through a fourth source/drain contact via VSD4 to ground the second NMOS transistor N2.

Next, the structure and operation in which the signal is applied, together with structures extending in a third direction z, will be described.

A fifth gate contact GC5 extending in the third direction z may be disposed on the first gate structure 200. In addition, a first gate contact via VG1 extending in the third direction z may be disposed on the fifth gate contact GC5. The first gate contact via VG1 may be connected to a first_first metal line M1_1 extending in the first direction x. That is, the first gate structure 200 may be electrically connected to the first_first metal line M1_1, the first gate contact via VG1, and the fifth gate contact GC5 to receive the data signal D. Thus, the first PMOS transistor P1 and the first NMOS transistor N1 may be gated through the data signal D.

The fifth gate contact GC5 and the first gate contact via VG1, which are electrically connected to the first gate structure 200, are illustrated in this drawing as being disposed on the second active region ACT2, but are not limited thereto, and may be disposed on the first active region ACT1 as illustrated in FIGS. 34 and 35.

A first gate contact GC1 extending in the third direction z may be disposed on the second gate structure 210. In addition, a second gate contact via VG2 extending in the third direction z may be disposed on the first gate contact GC1. The second gate contact via VG2 may be connected to a first_second metal line M1_2 extending in the first direction x. That is, the second gate structure 210 may be electrically connected to the first_second metal line M1_2, the second gate contact via VG2, and the first gate contact GC1 to receive the scan active signal Se. Thus, the third PMOS transistor P3 may be gated through the scan active signal Se.

The positions of the first gate contact GC1 and the second gate contact via VG2, which are electrically connected to the second gate structure 210, are not limited thereto.

A third gate contact GC3 extending in the third direction z may be disposed on the third gate structure 220. In addition, a third gate contact via VG3 extending in the third direction z may be disposed on the third gate contact GC3. The third gate contact via VG3 may be connected to a first_third metal line M1_3 extending in the first direction x. That is, the third gate structure 220 may be electrically connected to the first_third metal line M1_3, the third gate contact via VG3, and the third gate contact GC3 to receive the inverted active signal Se. Thus, the third NMOS transistor N3 may be gated through the inverted active signal Se.

The positions of the third gate contact GC3 and the third gate contact via VG3, which are electrically connected to the third gate structure 220, are not limited thereto.

A second gate contact GC2 extending in the third direction z may be disposed on the fourth gate structure 230. In addition, a fourth gate contact via VG4 extending in the third direction z may be disposed on the second gate contact GC2. The fourth gate contact via VG4 may be connected to a first_fifth metal line M1_5 extending in the first direction x. That is, the fourth gate structure 230 may be electrically connected to the first_fifth metal line M1_5, the fourth gate contact via VG4, and the second gate contact GC2 to receive the inverted active signal Se. Thus, the fourth PMOS transistor P4 may be gated through the inverted active signal Se.

The positions of the second gate contact GC2 and the fourth gate contact via VG4, which are electrically connected to the fourth gate structure 230, are not limited thereto.

A fourth gate contact GC4 extending in the third direction z may be disposed on the fifth gate structure 240. In addition, a fifth gate contact via VG5 extending in the third direction z may be disposed on the fourth gate contact GC4. The fifth gate contact via VG5 may be connected to a first_sixth metal line M1_6 extending in the first direction x. That is, the fifth gate structure 240 is electrically connected to the first_sixth metal line M1_6, the fifth gate contact via VG5, and the fourth gate contact GC4 to receive the scan active signal Se. Thus, the fourth NMOS transistor N4 may be gated through the scan active signal Se.

The positions of the fourth gate contact GC4 and the fifth gate contact via VG5, which are electrically connected to the fifth gate structure 240, are not limited thereto.

A sixth gate contact GC6 extending in the third direction z may be disposed on the sixth gate structure 250. In addition, a sixth gate contact via VG6 extending in the third direction z may be disposed on the sixth gate contact GC6. The sixth gate contact via VG6 may be connected to a first_seventh metal line M1_7 extending in the first direction x. That is, the sixth gate structure 250 may be electrically connected to the first_seventh metal line M1_7, the sixth gate contact via VG6, and the sixth gate contact GC6 to receive the scan input signal Si. Thus, the second PMOS transistor P2 and the second NMOS transistor N2 may be gated through the scan input signal Si.

The sixth gate contact GC6 and the sixth gate contact via VG6, which are electrically connected to the sixth gate structure 250, are illustrated in this drawing as being disposed on the first active region ACT1, but are not limited thereto, and may be disposed on the second active region ACT2 as illustrated in FIGS. 34 and 35.

A fifth source/drain contact via VSD5 extending in the third direction z may be disposed on the fourth source/drain contact 130. In addition, a first_fourth metal line M1_4 extending in the first direction x may be disposed on the fifth source/drain contact via VSD5 and may be connected to the outside.

The fifth source/drain contact via VSD5, which is electrically connected to the fourth source/drain contact 130, is illustrated in this drawing as being disposed on the first active region ACT1, but is not limited thereto, and may be disposed on the second active region ACT2 as illustrated in FIG. 34.

The plurality of gate structures (e.g., the first to sixth gate structures 200 to 250) and the plurality of source/drain contacts (e.g., the first to eighth source/drain contacts 100 to 170), which are disposed to be adjacent to each other in the first direction x, may be spaced apart from each other by 1 CPP. As an example, the first gate structure 200 and the first source/drain contact 100 adjacent to each other may be spaced apart from each other by 1 CPP.

For example, assume that the first gate structure 200 and the first source/drain contact 100 are adjacent to each other. When the distance between a center line of the first gate structure 200 extending in the second direction y and a center line of the first source/drain contact 100 extending in the second direction y is 1 CPP, it means that the other gate structure or source/drain contact is not disposed between the first gate structure 200 and the first source/drain contact 100.

Further, the metal lines (e.g., the first_first to first_seventh metal lines M1_1 to M1_7), which are disposed to be adjacent to each other in the second direction y, may be spaced apart from each other by 1 CPP. As an example, the first_first metal line M1_1 and the first_second metal line M1_2 adjacent to each other may be spaced apart from each other by 1 CPP.

For example, assume that the first_first metal line M1_1 and the first_second metal line M1_2 are adjacent to each other. When the distance between a center line of the first_first metal line M1_1 extending in the first direction x and a center line of the first_second metal line M1_2 extending in the first direction x is 1 CPP, it means that the other metal line is not disposed between the first_first metal line M1_1 and the first_second metal line M1_2.

Referring to FIG. 8 again, the master latch M_L may include a first transmission unit TSU1, a first latch unit LU1, and a first inverter INV'.

The master latch M_L may store the data signal D input through the signal node SN and output the data signal D to a first master latch node MLN1. In more detail, the master latch M_L may output the input data signal D based on a first clock signal En and a second clock signal (En) which is the inverted first clock signal.

The first transmission unit TSU1 of the master latch M_L may be configured as a transmission gate including the integrated circuit according to some example embodiments or may be configured as a tri-state inverter. The first latch unit LU1 of the master latch M_L may be configured as a transmission gate including the integrated circuit according to some example embodiments or may be configured as a tri-state inverter.

Hereinafter, the master latch M_L including the integrated circuit according to some example embodiments will be described with reference to FIGS. 36 to 44.

Figure 36:
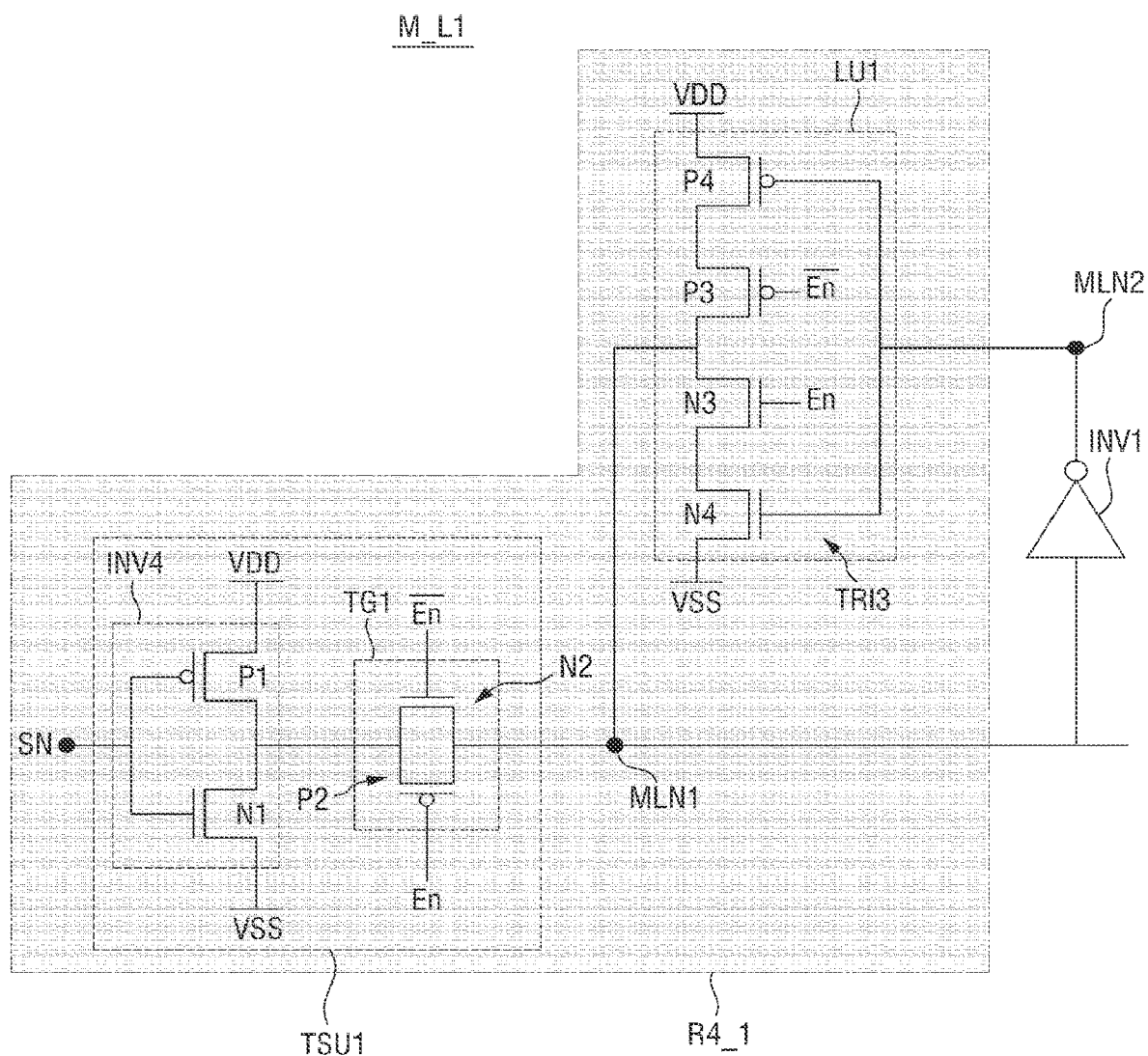
FIG. 36 is a circuit diagram illustrating the master latch M_L shown in FIG. 8 according to some example embodiments.

FIG. 36 is a circuit diagram illustrating the master latch M_L shown in FIG. 8. For reference, the description of the slave latch S_L overlaps the description of the master latch M_L, and thus the master latch M_L will be described as an example. Of course, the description of the master latch M_L may also be applied to the slave latch S_L.

Referring to FIG. 36, the first transmission unit TSU1 includes a fourth inverter INV4 and a first transmission gate TG1, and the first latch unit LU1 includes a third tri-state inverter TRI3.

The first transmission unit TSU1 including the integrated circuit according to some example embodiments receives the data signal D through the signal node SN and transmits the data signal D to the first master latch node MLN1. In more detail, the signal input to the signal node SN is inverted by the fourth inverter INV4 composed of a first PMOS transistor P1 and a first NMOS transistor N1. In addition, the inverted signal of the signal input to the signal node SN may be output to the first master latch node MLN1 by the first transmission gate TG1 composed of a second PMOS transistor P2 and a second NMOS transistor N2.

The third tri-state inverter TRI3 composed of a third PMOS transistor P3, a third NMOS transistor N3, a fourth PMOS transistor P4, and a fourth NMOS transistor N4 may latch the data input to the first master latch node MLN1 under the control of the first clock signal En and the second clock signal En. The description of the tri-state inverter overlaps with the description of FIG. 1, and thus the description thereof will be omitted.

Figure 37:
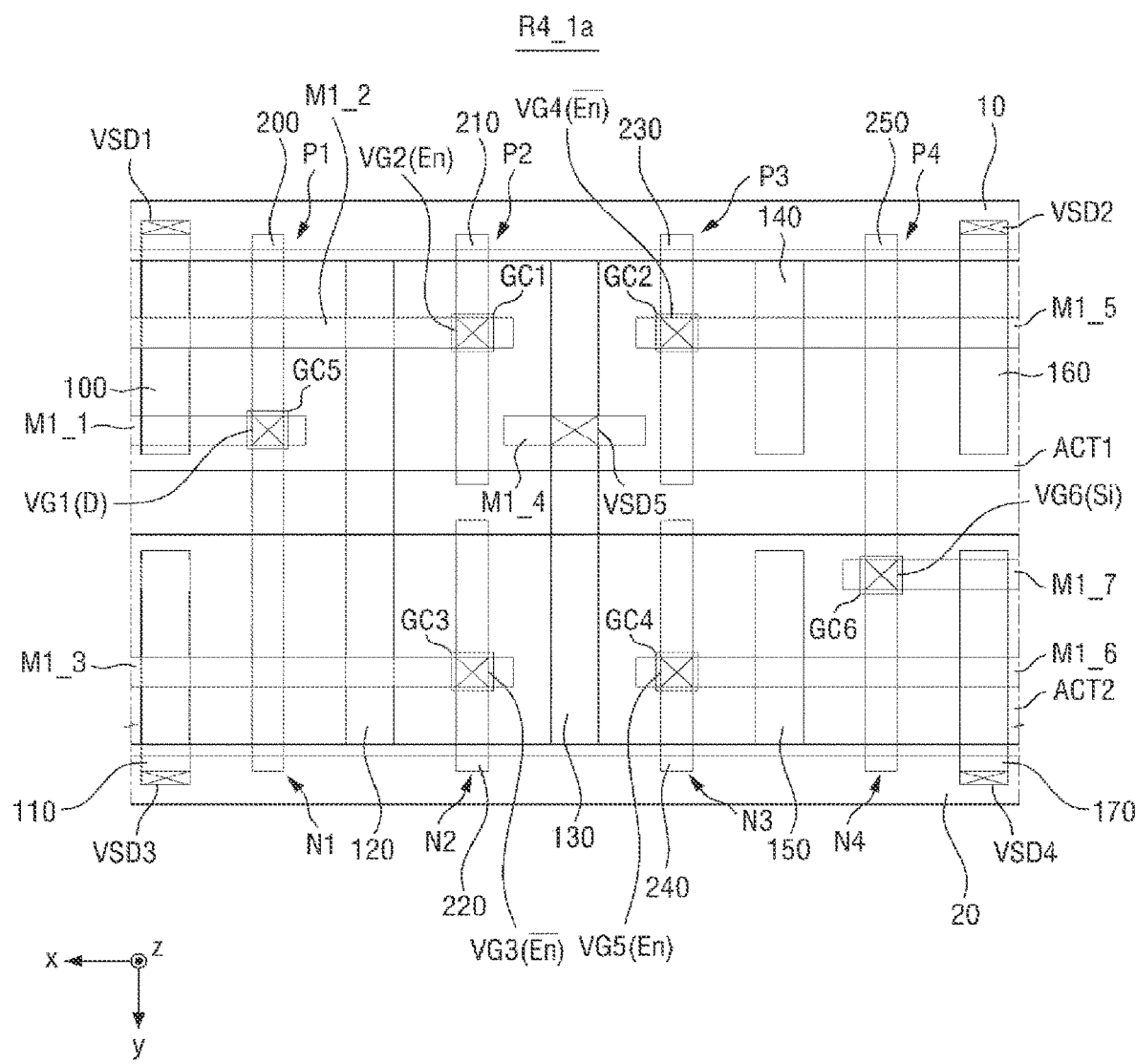
FIGS. 37 and 38 are layout diagrams of FIG. 36 according to some example embodiments.
Figure 38:
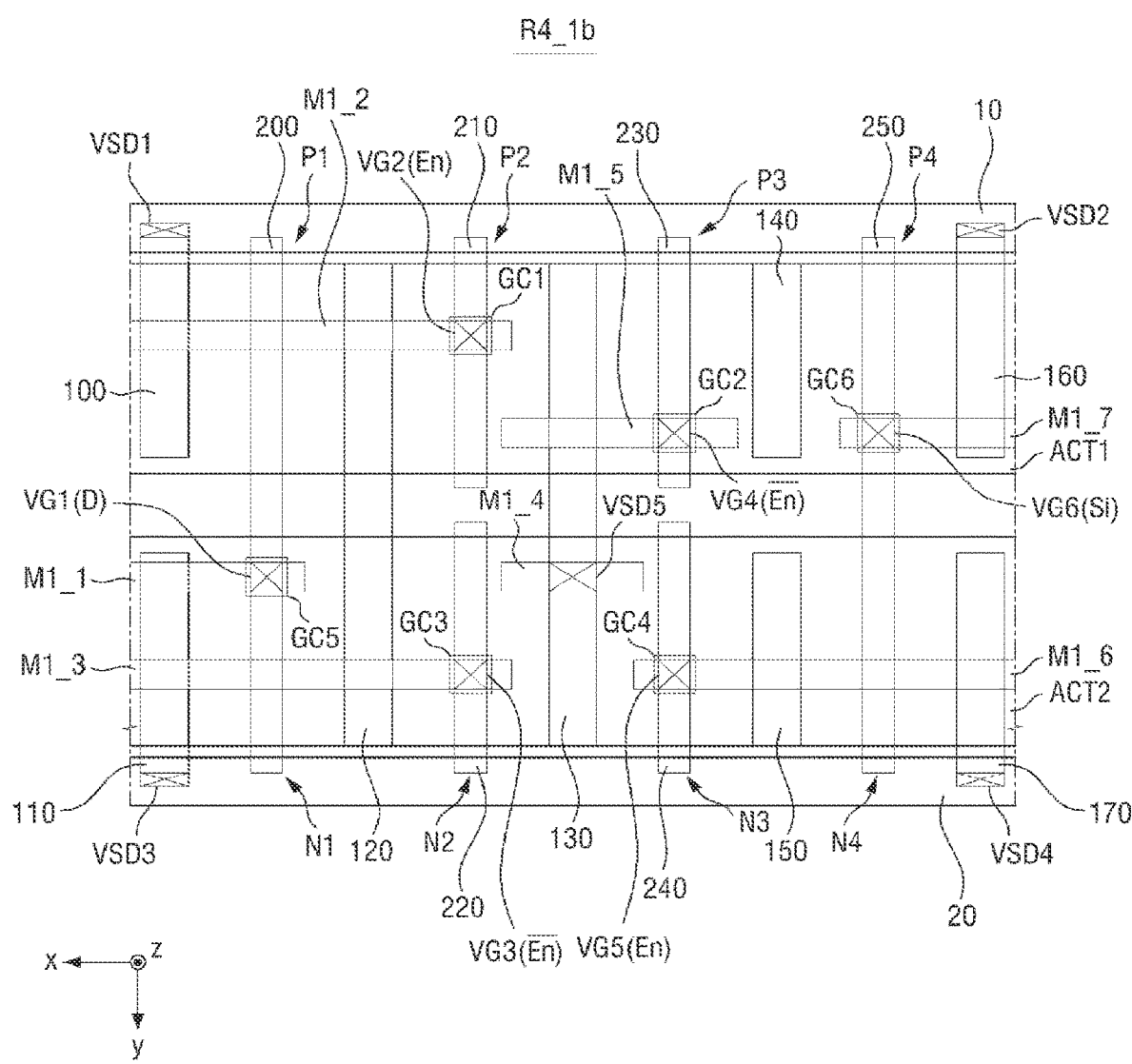

FIGS. 37 and 38 are layout diagrams according to some example embodiments exemplarily illustrating FIG. 36. Hereinafter, in order to avoid duplicate descriptions, the common parts of FIGS. 37 and 38 are described only through FIG. 37, and only the differences will be briefly described with reference to the corresponding drawings. In addition, for simplicity of the description, a layout diagram of a region R4_1 of a master latch M_L1 will be mainly described.

When region R4_1a of the region R4_1 is described with reference to FIG. 37, the first to fourth PMOS transistors P1 to P4 may be disposed on a first active region ACT1 extending in a first direction x. Further, the first to fourth NMOS transistors N1 to N4 may be formed on a second active region ACT2 extending in the first direction x and disposed to be spaced apart from the first active region ACT1 in a second direction y.

A power rail 10 may be disposed at an upper portion of the first active region ACT1 in the second direction y. In addition, a ground rail 20 may be disposed at a lower portion of the second active region ACT2 in the second direction y.

The region R4_1a of the master latch M_L1 including the integrated circuit according to some example embodiments may include a plurality of gate structures and a plurality of source/drain contacts extending in the second direction y and disposed to be spaced apart from each other in the first direction x.

For example, a first source/drain contact 100 and a second source/drain contact 110 may be disposed on the first active region ACT1 and the second active region ACT2, respectively, to be spaced apart from each other in the second direction y. That is, the first source/drain contact 100 may be connected to the power rail 10 through a first source/drain contact via VSD1 to supply the power voltage to the first PMOS transistor P1. In addition, the second source/drain contact 110 may be connected to the ground rail 20 through a third source/drain contact via VSD3 to ground the first NMOS transistor N1.

A first gate structure 200 is disposed to be spaced apart from the first and second source/drain contacts 100 and 110 in the first direction x. The first gate structure 200 may be disposed on the first active region ACT1 and the second active region ACT2.

A third source/drain contact 120 may be disposed to be spaced apart from the first gate structure 200 in the first direction x. The third source/drain contact 120 may extend in the second direction y and may be disposed on the first active region ACT1 and the second active region ACT2. That is, a drain of the first PMOS transistor P1 and a drain of the first NMOS transistor N1 may be connected to each other through the third source/drain contact 120. In addition, a source of the second PMOS transistor P2 may be connected to a drain of the second NMOS transistor N2 through the third source/drain contact 120. That is, the drain of the first PMOS transistor P1, the drain of the first NMOS transistor N1, the source of the second PMOS transistor P2, and the drain of the second NMOS transistor N2 may be connected to each other through the third source/drain contact 120. By connecting a plurality of transistors through one source/drain contact (e.g., the third source/drain contact 120), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A second gate structure 210 may be disposed on the first active region ACT1 to be spaced apart from the third source/drain contact 120 in the first direction x. In addition, a third gate structure 220 may be disposed on the second active region ACT2 to be spaced apart from the third source/drain contact 120 in the first direction x.

A fourth source/drain contact 130 may be disposed to extend in the second direction y and to be spaced apart from the second gate structure 210 and the third gate structure 220 in the first direction x. A drain of the second PMOS transistor P2 may be connected to a source of the second NMOS transistor N2 through the fourth source/drain contact 130. A drain of the third PMOS transistor P3 may be connected to a drain of the third NMOS transistor N3 through the fourth source/drain contact 130. That is, the drain of the second PMOS transistor P2, the source of the second NMOS transistor N2, the drain of the third PMOS transistor P3, and the drain of the third NMOS transistor N3 may be connected to each other through the fourth source/drain contact 130. By connecting a plurality of transistors through one source/drain contact (e.g., the fourth source/drain contact 130), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A fourth gate structure 230 may be disposed on the first active region ACT1 to be spaced apart from the fourth source/drain contact 130 in the first direction x. In addition, a fifth gate structure 240 may be disposed on the second active region ACT2 to be spaced apart from the fourth source/drain contact 130 in the first direction x.

A fifth source/drain contact 140 and a sixth source/drain contact 150 may be disposed to be spaced apart from the fourth gate structure 230 and the fifth gate structure 240 in the first direction x. The fifth source/drain contact 140 may extend in the second direction y and may be disposed on the first active region ACT1. The sixth source/drain contact 150 may extend in the second direction y and may be disposed on the second active region ACT2.

A sixth gate structure 250 may be disposed on the first active region ACT1 and the second active region ACT2 to be spaced apart from the fifth source/drain contact 140 and the sixth source/drain contact 150 in the first direction x. In addition, a seventh source/drain contact 160 may be disposed on the first active region ACT1 to be spaced apart from the sixth gate structure 250 in the first direction x. The seventh source/drain contact 160 may be connected to the power rail 10 through a second source/drain contact via VSD2 to supply the power voltage to the fourth PMOS transistor P4. In addition, an eighth source/drain contact 170 may be disposed on the second active region ACT2 to be spaced apart from the sixth gate structure 250 in the first direction x. The eighth source/drain contact 170 may be connected to the ground rail 20 through a fourth source/drain contact via VSD4 to ground the fourth NMOS transistor N4.

Next, the structure and operation in which the signal is applied, together with structures extending in a third direction z, will be described.

A fifth gate contact GC5 extending in the third direction z may be disposed on the first gate structure 200. In addition, a first gate contact via VG1 extending in the third direction z may be disposed on the fifth gate contact GC5. The first gate contact via VG1 may be connected to a first_first metal line M1_1 extending in the first direction x. That is, the first gate structure 200 may be electrically connected to the first_first metal line M1_1, the first gate contact via VG1, and the fifth gate contact GC5 to receive the data signal D. Thus, the first PMOS transistor P1 and the first NMOS transistor N1 may be gated through the data signal D.

The fifth gate contact GC5 and the first gate contact via VG1, which are electrically connected to the first gate structure 200, are illustrated in this drawing as being disposed on the first active region ACT1, but are not limited thereto, and may be disposed on the second active region ACT2 as illustrated in FIG. 38.

A first gate contact GC1 extending in the third direction z may be disposed on the second gate structure 210. In addition, a second gate contact via VG2 extending in the third direction z may be disposed on the first gate contact GC1. The second gate contact via VG2 may be connected to a first_second metal line M1_2 extending in the first direction x. That is, the second gate structure 210 may be electrically connected to the first_second metal line M1_2, the second gate contact via VG2, and the first gate contact GC1 to receive the first clock signal En. Thus, the second PMOS transistor P2 may be gated through the first clock signal En.

The positions of the first gate contact GC1 and the second gate contact via VG2, which are electrically connected to the second gate structure 210, are not limited thereto.

A third gate contact GC3 extending in the third direction z may be disposed on the third gate structure 220. In addition, a third gate contact via VG3 extending in the third direction z may be disposed on the third gate contact GC3. The third gate contact via VG3 may be connected to a first_third metal line M1_3 extending in the first direction x. That is, the third gate structure 220 may be electrically connected to the first_third metal line M1_3, the third gate contact via VG3, and the third gate contact GC3 to receive the second clock signal En. Thus, the second NMOS transistor N2 may be gated through the second clock signal En.

The positions of the third gate contact GC3 and the third gate contact via VG3, which are electrically connected to the third gate structure 220, are not limited thereto.

A second gate contact GC2 extending in the third direction z may be disposed on the fourth gate structure 230. In addition, a fourth gate contact via VG4 extending in the third direction z may be disposed on the second gate contact GC2. The fourth gate contact via VG4 may be connected to a first_fifth metal line M1_5 extending in the first direction x. That is, the fourth gate structure 230 may be electrically connected to the first_fifth metal line M1_5, the fourth gate contact via VG4, and the second gate contact GC2 to receive the second clock signal En. Thus, the third PMOS transistor P3 may be gated through the second clock signal En.

The positions of the second gate contact GC2 and the fourth gate contact via VG4, which are electrically connected to the fourth gate structure 230, are not limited thereto.

A fourth gate contact GC4 extending in the third direction z may be disposed on the fifth gate structure 240. In addition, a fifth gate contact via VG5 extending in the third direction z may be disposed on the fourth gate contact GC4. The fifth gate contact via VG5 may be connected to a first_sixth metal line M1_6 extending in the first direction x. That is, the fifth gate structure 240 is electrically connected to the first_sixth metal line M1_6, the fifth gate contact via VG5, and the fourth gate contact GC4 to receive the first clock signal En. Thus, the third NMOS transistor N3 may be gated through the first clock signal En.

The positions of the fourth gate contact GC4 and the fifth gate contact via VG5, which are electrically connected to the fifth gate structure 240, are not limited thereto.

A sixth gate contact GC6 extending in the third direction z may be disposed on the sixth gate structure 250. In addition, a sixth gate contact via VG6 extending in the third direction z may be disposed on the sixth gate contact GC6. The sixth gate contact via VG6 may be connected to a first_seventh metal line M1_7 extending in the first direction x. That is, the sixth gate structure 250 may be electrically connected to the first_seventh metal line M1_7, the sixth gate contact via VG6, and the sixth gate contact GC6 to receive a signal at a second master latch node. Thus, the fourth PMOS transistor P4 and the fourth NMOS transistor N4 may be gated through the signal at the second master latch node.

The sixth gate contact GC6 and the sixth gate contact via VG6, which are electrically connected to the sixth gate structure 250, are illustrated in this drawing as being disposed on the second active region ACT2, but are not limited thereto, and may be disposed on the first active region ACT1 as illustrated in FIG. 38.

A fifth source/drain contact via VSD5 extending in the third direction z may be disposed on the fourth source/drain contact 130. In addition, a first_fourth metal line M1_4 extending in the first direction x may be disposed on the fifth source/drain contact via VSD5 and may be connected to the outside.

The fifth source/drain contact via VSD5, which is electrically connected to the fourth source/drain contact 130, is illustrated in this drawing as being disposed on the first active region ACT1, but is not limited thereto, and may be disposed on the second active region ACT2 as illustrated in FIG. 38.

The plurality of gate structures (e.g., the first to sixth gate structures 200 to 250) and the plurality of source/drain contacts (e.g., the first to eighth source/drain contacts 100 to 170), which are disposed to be adjacent to each other in the first direction x, may be spaced apart from each other by 1 CPP. As an example, the first gate structure 200 and the first source/drain contact 100 adjacent to each other may be spaced apart from each other by 1 CPP.

For example, assume that the first gate structure 200 and the first source/drain contact 100 are adjacent to each other. When the distance between a center line of the first gate structure 200 extending in the second direction y and a center line of the first source/drain contact 100 extending in the second direction y is 1 CPP, it means that the other gate structure or source/drain contact is not disposed between the first gate structure 200 and the first source/drain contact 100.

Further, the metal lines (e.g., the first_first to first_seventh metal lines M1_1 to M1_7), which are disposed to be adjacent to each other in the second direction y, may be spaced apart from each other by 1 CPP. As an example, the first_sixth metal line M1_6 and the first_seventh metal line M1_7 adjacent to each other may be spaced apart from each other by 1 CPP.

For example, assume that the first_sixth metal line M1_6 and the first_seventh metal line M1_7 are adjacent to each other. When the distance between a center line of the first_sixth metal line M1_6 extending in the first direction x and a center line of the first_seventh metal line M1_7 extending in the first direction x is 1 CPP, it means that the other metal line is not disposed between the first_sixth metal line M16 and the first_seventh metal line M17.

Figure 39:
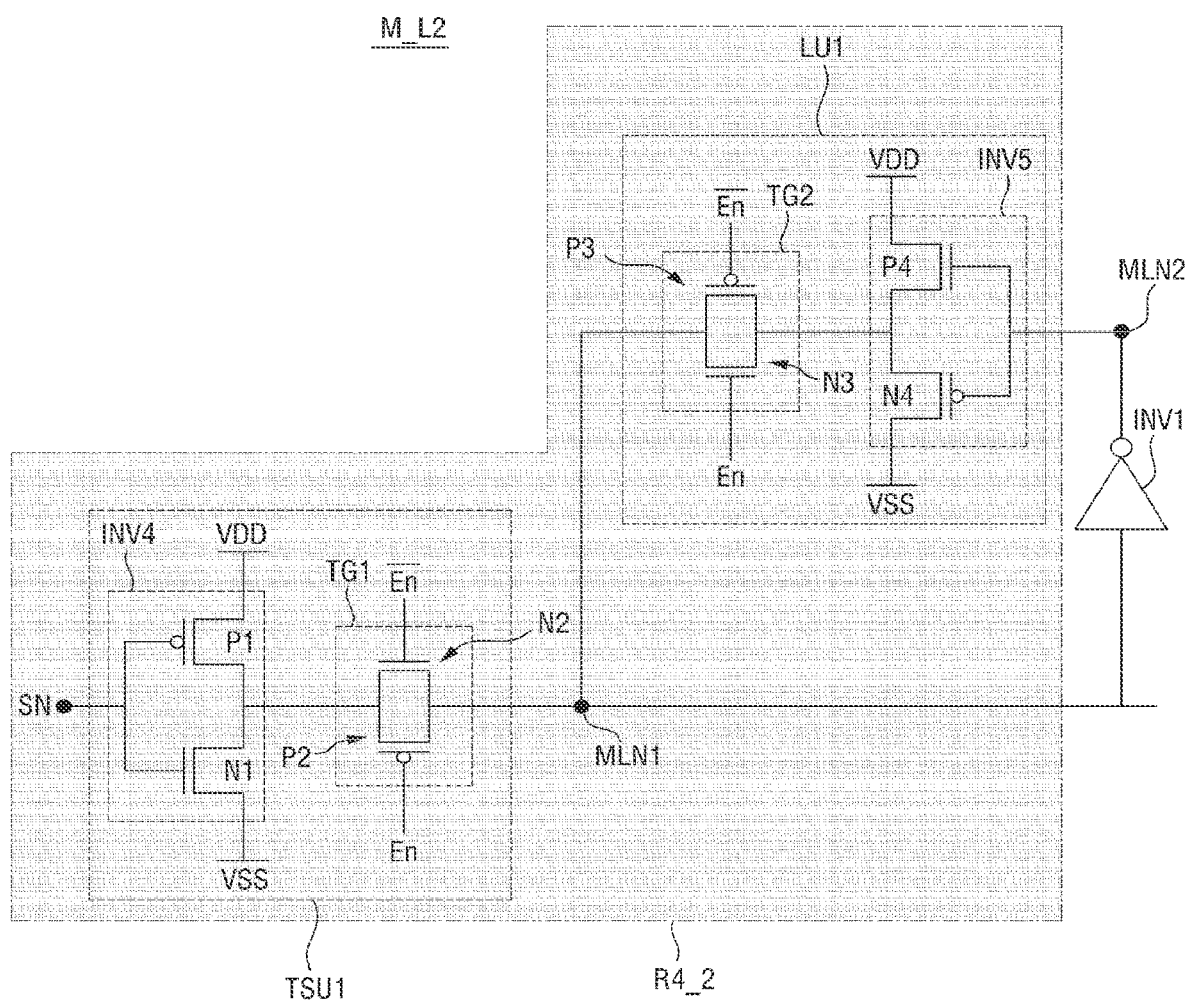
FIG. 39 is a circuit diagram illustrating the master latch M_L shown in FIG. 8 according to some example embodiments.

FIG. 39 is a circuit diagram illustrating the master latch M_L shown in FIG. 8.

When the difference between a master latch M_L2 of FIG. 39 and the master latch M_L1 of FIG. 36 is mainly described with reference to the master latch M_L2 of FIG. 39, the first latch unit LU1 includes a second transmission gate TG2 and a fifth inverter INV5.

The first latch unit LU1 including the integrated circuit according to some example embodiments may latch a signal at the first master latch node MLN1. In more detail, a signal at a second master latch node MLN2 is inverted by the fifth inverter INV5 composed of a fourth PMOS transistor P4 and a fourth NMOS transistor N4. In addition, the signal in which the signal at the second master latch node MLN2 is inverted may be output to the first master latch node MLN1 by the second transmission gate TG2 composed of a third PMOS transistor P3 and a third NMOS transistor N3.

The first latch unit LU1 may latch the data signal D, which is input to the first master latch node MLN1, under the control of the first clock signal En and the second clock signal En.

Figure 40:
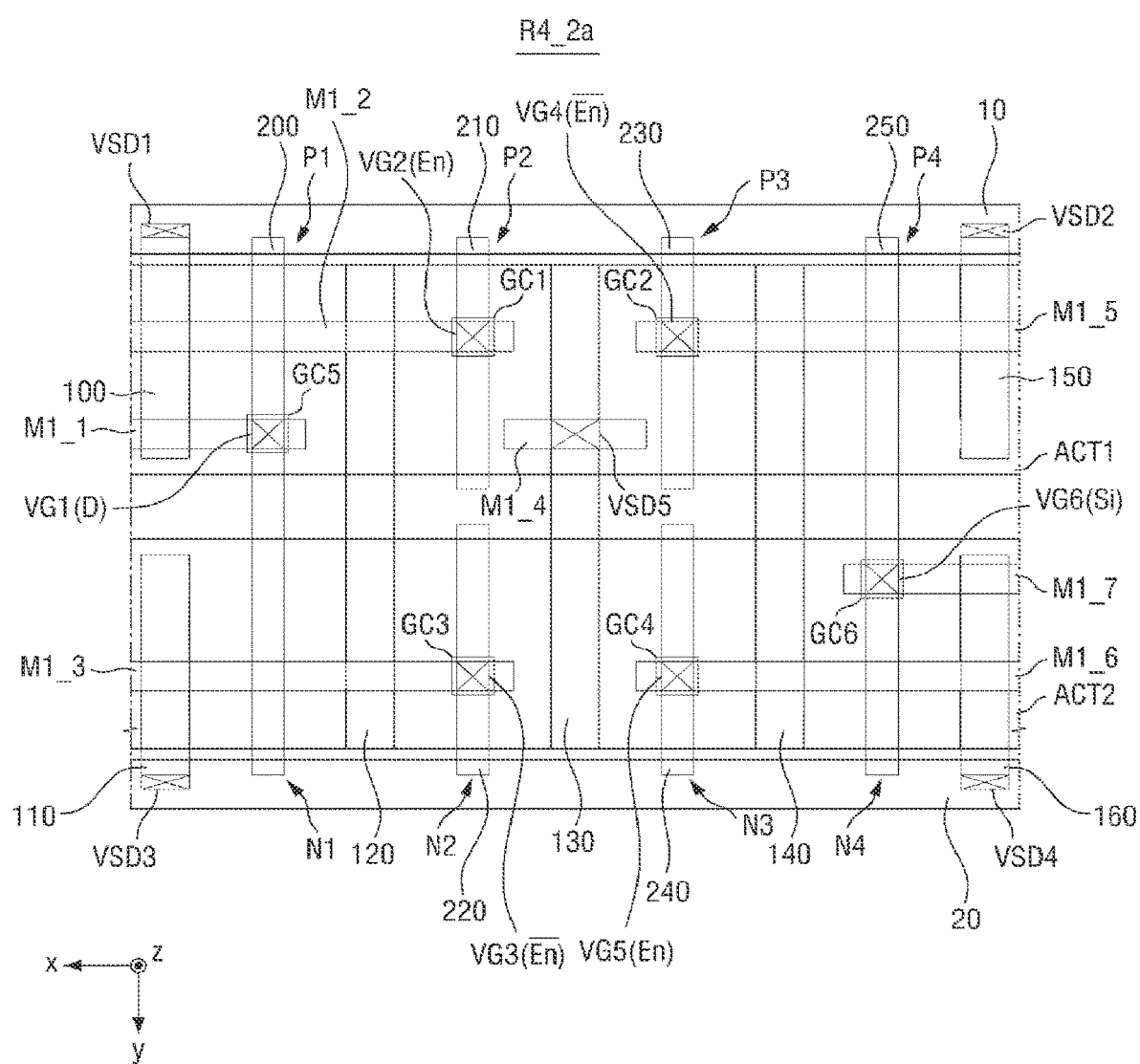
FIGS. 40 and 41 are layout diagrams of FIG. 39 according to some example embodiments.
Figure 41:
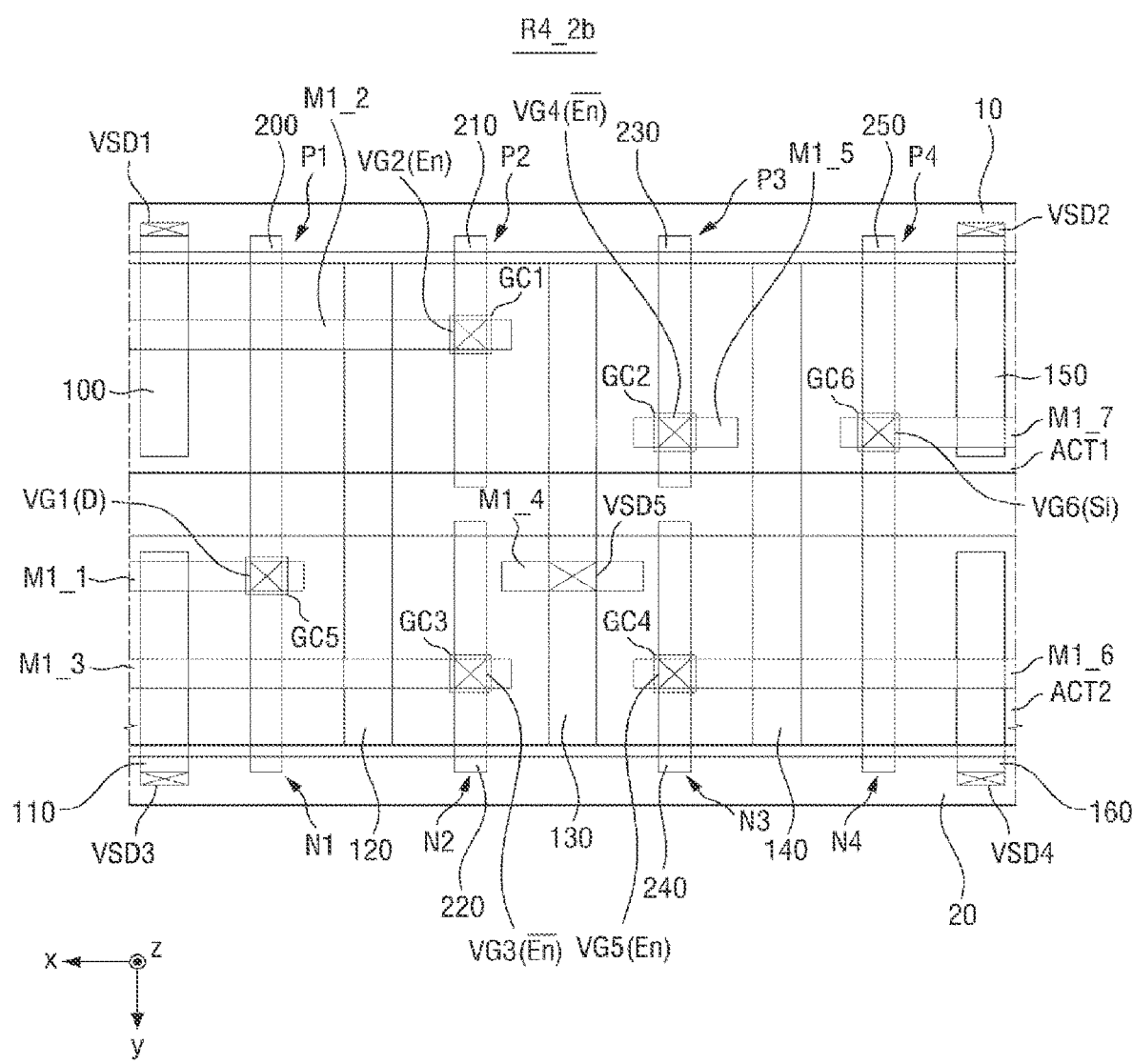

FIGS. 40 and 41 are layout diagrams according to some example embodiments exemplarily illustrating FIG. 39. Hereinafter, in order to avoid duplicate descriptions, the common parts of FIGS. 40 and 41 are described only through FIG. 40, and only the differences will be briefly described with reference to the corresponding drawings. In addition, for simplicity of the description, a layout diagram of a region R4_2 of the master latch M_L2 will be mainly described.

When region R4_2a of the region R4_2 is described with reference to FIG. 40, first to fourth PMOS transistors P1 to P4 may be disposed on a first active region ACT1 extending in a first direction x. Further, first to fourth NMOS transistors N1 to N4 may be formed on a second active region ACT2 extending in the first direction x and disposed to be spaced apart from the first active region ACT1 in a second direction y.

A power rail 10 may be disposed at an upper portion of the first active region ACT1 in the second direction y. In addition, a ground rail 20 may be disposed at a lower portion of the second active region ACT2 in the second direction y.

The region R4_2a of the region R4_2 of the master latch M_L2 including the integrated circuit according to some example embodiments may include a plurality of gate structures and a plurality of source/drain contacts extending in the second direction y and disposed to be spaced apart from each other in the first direction x.

For example, a first source/drain contact 100 and a second source/drain contact 110 may be disposed on the first active region ACT1 and the second active region ACT2, respectively, to be spaced apart from each other in the second direction y. That is, the first source/drain contact 100 may be connected to the power rail 10 through a first source/drain contact via VSD1 to supply the power voltage to the first PMOS transistor P1. In addition, the second source/drain contact 110 may be connected to the ground rail 20 through a third source/drain contact via VSD3 to ground the first NMOS transistor N1.

A first gate structure 200 is disposed to be spaced apart from the first and second source/drain contacts 100 and 110 in the first direction x. The first gate structure 200 may be disposed on the first active region ACT1 and the second active region ACT2.

A third source/drain contact 120 may be disposed to be spaced apart from the first gate structure 200 in the first direction x. The third source/drain contact 120 may extend in the second direction y and may be disposed on the first active region ACT1 and the second active region ACT2. That is, a drain of the first PMOS transistor P1 and a drain of the first NMOS transistor N1 may be connected to each other through the third source/drain contact 120. In addition, a source of the second PMOS transistor P2 may be connected to a drain of the second NMOS transistor N2 through the third source/drain contact 120. That is, the drain of the first PMOS transistor P1, the drain of the first NMOS transistor N1, the source of the second PMOS transistor P2, and the drain of the second NMOS transistor N2 may be connected to each other through the third source/drain contact 120. By connecting a plurality of transistors through one source/drain contact (e.g., the third source/drain contact 120), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A second gate structure 210 may be disposed on the first active region ACT1 to be spaced apart from the third source/drain contact 120 in the first direction x. In addition, a third gate structure 220 may be disposed on the second active region ACT2 to be spaced apart from the third source/drain contact 120 in the first direction x.

A fourth source/drain contact 130 may be disposed to extend in the second direction y and to be spaced apart from the second gate structure 210 and the third gate structure 220 in the first direction x. A drain of the second PMOS transistor P2 may be connected to a source of the second NMOS transistor N2 through the fourth source/drain contact 130. In addition, a drain of the third PMOS transistor P3 may be connected to a source of the third NMOS transistor N3 through the fourth source/drain contact 130. That is, the drain of the second PMOS transistor P2, the source of the second NMOS transistor N2, the drain of the third PMOS transistor P3, and the source of the third NMOS transistor N3 may be connected to each other through the fourth source/drain contact 130. By connecting a plurality of transistors through one source/drain contact (e.g., the fourth source/drain contact 130), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A fourth gate structure 230 may be disposed on the first active region ACT1 to be spaced apart from the fourth source/drain contact 130 in the first direction x. In addition, a fifth gate structure 240 may be disposed on the second active region ACT2 to be spaced apart from the fourth source/drain contact 130 in the first direction x.

A fifth source/drain contact 140 may be disposed to be spaced apart from the fourth gate structure 230 and the fifth gate structure 240 in the first direction x. The fifth source/drain contact 140 may extend in the second direction y and may be disposed on the first active region ACT1 and the second active region ACT2. That is, a source of the third PMOS transistor P3 and a drain of the third NMOS transistor N3 may be connected to each other through the fifth source/drain contact 140. In addition, a drain of the fourth PMOS transistor P4 may be connected to a drain of the fourth NMOS transistor N4 through the fifth source/drain contact 140. That is, the source of the third PMOS transistor P3, the drain of the third NMOS transistor N3, the drain of the fourth PMOS transistor P4, and the drain of the fourth NMOS transistor N4 may be connected to each other through the fifth source/drain contact 140. By connecting a plurality of transistors through one source/drain contact (e.g., the fifth source/drain contact 140), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A sixth gate structure 250 may be disposed on the first active region ACT1 and the second active region ACT2 to be spaced apart from the fifth source/drain contact 140 in the first direction x. Further, a sixth source/drain contact 150 may be disposed on the first active region ACT1 to be spaced apart from the sixth gate structure 250 in the first direction x. The sixth source/drain contact 150 may be connected to the power rail 10 through a second source/drain contact via VSD2 to supply the power voltage to the fourth PMOS transistor P4. In addition, a seventh source/drain contact 160 may be disposed on the second active region ACT2 to be spaced apart from the sixth gate structure 250 in the first direction x. The seventh source/drain contact 160 may be connected to the ground rail 20 through a fourth source/drain contact via VSD4 to ground the fourth NMOS transistor N4.

Next, the structure and operation in which the signal is applied, together with structures extending in a third direction z, will be described.

A fifth gate contact GC5 extending in the third direction z may be disposed on the first gate structure 200. In addition, a first gate contact via VG1 extending in the third direction z may be disposed on the fifth gate contact GC5. The first gate contact via VG1 may be connected to a first_first metal line M1_1 extending in the first direction x. That is, the first gate structure 200 may be electrically connected to the first_first metal line M1_1, the first gate contact via VG1, and the fifth gate contact GC5 to receive the data signal D. Thus, the first PMOS transistor P1 and the first NMOS transistor N1 may be gated through the data signal D.

The fifth gate contact GC5 and the first gate contact via VG1, which are electrically connected to the first gate structure 200, are illustrated in this drawing as being disposed on the first active region ACT1, but are not limited thereto, and may be disposed on the second active region ACT2 as illustrated in FIG. 41.

A first gate contact GC1 extending in the third direction z may be disposed on the second gate structure 210. In addition, a second gate contact via VG2 extending in the third direction z may be disposed on the first gate contact GC1. The second gate contact via VG2 may be connected to a first_second metal line M1_2 extending in the first direction x. That is, the second gate structure 210 may be electrically connected to the first_second metal line M1_2, the second gate contact via VG2, and the first gate contact GC1 to receive the first clock signal En. Thus, the second PMOS transistor P2 may be gated through the first clock signal En.

The positions of the first gate contact GC1 and the second gate contact via VG2, which are electrically connected to the second gate structure 210, are not limited thereto.

A third gate contact GC3 extending in the third direction z may be disposed on the third gate structure 220. In addition, a third gate contact via VG3 extending in the third direction z may be disposed on the third gate contact GC3. The third gate contact via VG3 may be connected to a first_third metal line M1_3 extending in the first direction x. That is, the third gate structure 220 may be electrically connected to the first_third metal line M1_3, the third gate contact via VG3, and the third gate contact GC3 to receive the second clock signal En. Thus, the second NMOS transistor N2 may be gated through the inverted active signal En.

The positions of the third gate contact GC3 and the third gate contact via VG3, which are electrically connected to the third gate structure 220, are not limited thereto.

A second gate contact GC2 extending in the third direction z may be disposed on the fourth gate structure 230. In addition, a fourth gate contact via VG4 extending in the third direction z may be disposed on the second gate contact GC2. The fourth gate contact via VG4 may be connected to a first_fifth metal line M1_5 extending in the first direction x.

That is, the fourth gate structure 230 may be electrically connected to the first_fifth metal line M1_5, the fourth gate contact via VG4, and the second gate contact GC2 to receive the second clock signal En. Thus, the third PMOS transistor P3 may be gated through the second clock signal En.

The positions of the second gate contact GC2 and the fourth gate contact via VG4, which are electrically connected to the fourth gate structure 230, are not limited thereto.

A fourth gate contact GC4 extending in the third direction z may be disposed on the fifth gate structure 240. In addition, a fifth gate contact via VG5 extending in the third direction z may be disposed on the fourth gate contact GC4. The fifth gate contact via VG5 may be connected to a first_sixth metal line M1_6 extending in the first direction x. That is, the fifth gate structure 240 may be electrically connected to the first_sixth metal line M1_6, the fifth gate contact via VG5, and the fourth gate contact GC4 to receive the first clock signal En. Thus, the third NMOS transistor N3 may be gated through the first clock signal En.

The positions of the fourth gate contact GC4 and the fifth gate contact via VG5, which are electrically connected to the fifth gate structure 240, are not limited thereto.

A sixth gate contact GC6 extending in the third direction z may be disposed on the sixth gate structure 250. In addition, a sixth gate contact via VG6 extending in the third direction z may be disposed on the sixth gate contact GC6. The sixth gate contact via VG6 may be connected to a first_seventh metal line M1_7 extending in the first direction x. That is, the sixth gate structure 250 may be electrically connected to the first_seventh metal line M1_7, the sixth gate contact via VG6, and the sixth gate contact GC6 to receive the signal at the second master latch node. Thus, the fourth PMOS transistor P4 and the fourth NMOS transistor N4 may be gated through the signal at the second master latch node.

The sixth gate contact GC6 and the sixth gate contact via VG6, which are electrically connected to the sixth gate structure 250, are illustrated in this drawing as being disposed on the first active region ACT1, but are not limited thereto, and may be disposed on the second active region ACT2 as illustrated in FIG. 41.

A fifth source/drain contact via VSD5 extending in the third direction z may be disposed on the fourth source/drain contact 130. In addition, a first_fourth metal line M1_4 extending in the first direction x may be disposed on the fifth source/drain contact via VSD5 and may be connected to the outside.

The fifth source/drain contact via VSD5, which is electrically connected to the fourth source/drain contact 130, is illustrated in this drawing as being disposed on the first active region ACT1, but is not limited thereto, and may be disposed on the second active region ACT2 as illustrated in FIG. 41.

The plurality of gate structures (e.g., the first to sixth gate structures 200 to 250) and the plurality of source/drain contacts (e.g., the first to seventh source/drain contacts 100 to 160), which are disposed to be adjacent to each other in the first direction x, may be spaced apart from each other by 1 CPP. As an example, the first gate structure 200 and the first source/drain contact 100 adjacent to each other may be spaced apart from each other by 1 CPP.

For example, assume that the first gate structure 200 and the first source/drain contact 100 are adjacent to each other. When the distance between a center line of the first gate structure 200 extending in the second direction y and a center line of the first source/drain contact 100 extending in the second direction y is 1 CPP, it means that the other gate structure or source/drain contact is not disposed between the first gate structure 200 and the first source/drain contact 100.

Further, the metal lines (e.g., the first_first to first_seventh metal lines M1_1 to M1_7), which are disposed to be adjacent to each other in the second direction y, may be spaced apart from each other by 1 CPP. As an example, the first_first metal line M1_1 and the first_third metal line M1_3 adjacent to each other may be spaced apart from each other by 1 CPP.

For example, assume that the first_first metal line M1_1 and the first_third metal line M1_3 are adjacent to each other. When the distance between a center line of the first_first metal line M1_1 extending in the first direction x and a center line of the first_third metal line M1_3 extending in the first direction x is 1 CPP, it means that the other metal line is not disposed between the first_first metal line M1_1 and the first_third metal line M13.

Figure 42:
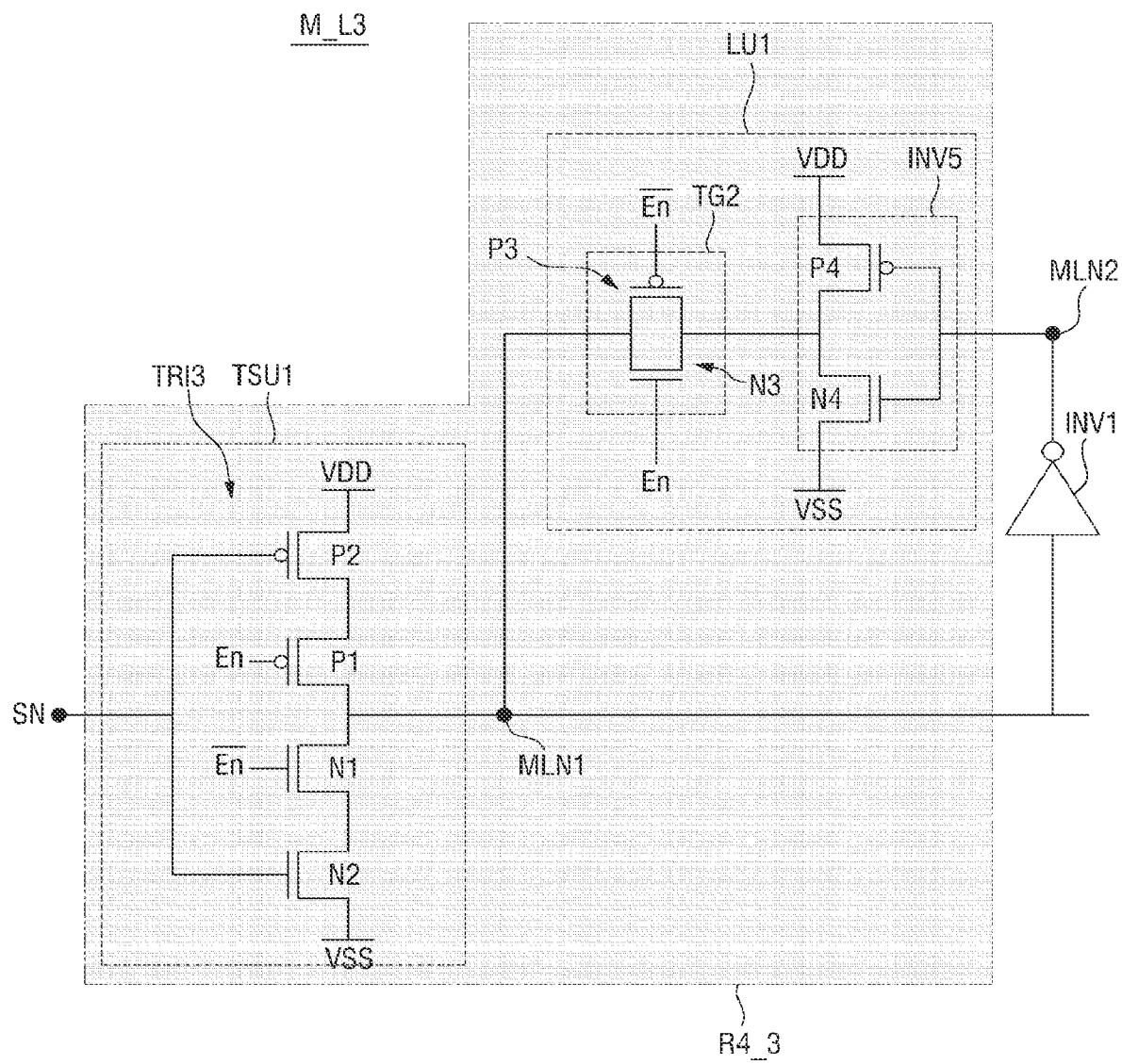
FIG. 42 is a circuit diagram illustrating the master latch M_L shown in FIG. 8 according to some example embodiments.

FIG. 42 is a circuit diagram illustrating the master latch M_L shown in FIG. 8.

When the difference between a master latch M_L3 of FIG. 42 and the master latch M_L2 of FIG. 39 is mainly described with reference to the master latch M_L3 of FIG. 42, the first transmission unit TSU1 includes a third tri-state inverter TRI3.

The third tri-state inverter TRI3 including a first PMOS transistor P1, a first NMOS transistor N1, a second PMOS transistor P2, and a second NMOS transistor N2 may invert the data signal D, which is received from the signal node SN, under the control of the first clock signal En and the second clock signal En.

The first latch unit LU1 is the same as the first latch unit shown in FIG. 40, and thus a description thereof will be omitted.

Figure 43:
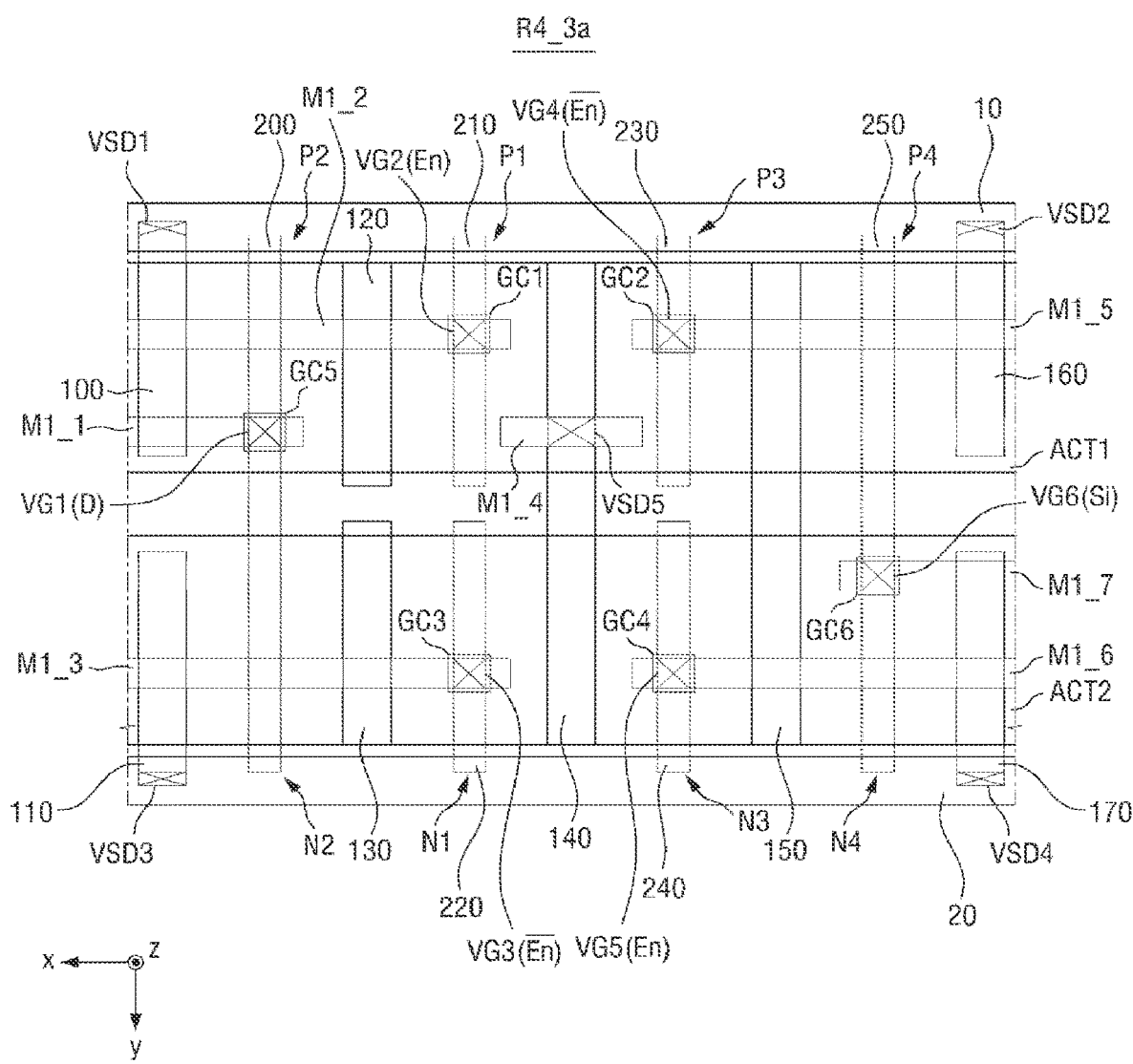
FIGS. 43 and 44 are layout diagrams of FIG. 42 according to some example embodiments.
Figure 44:
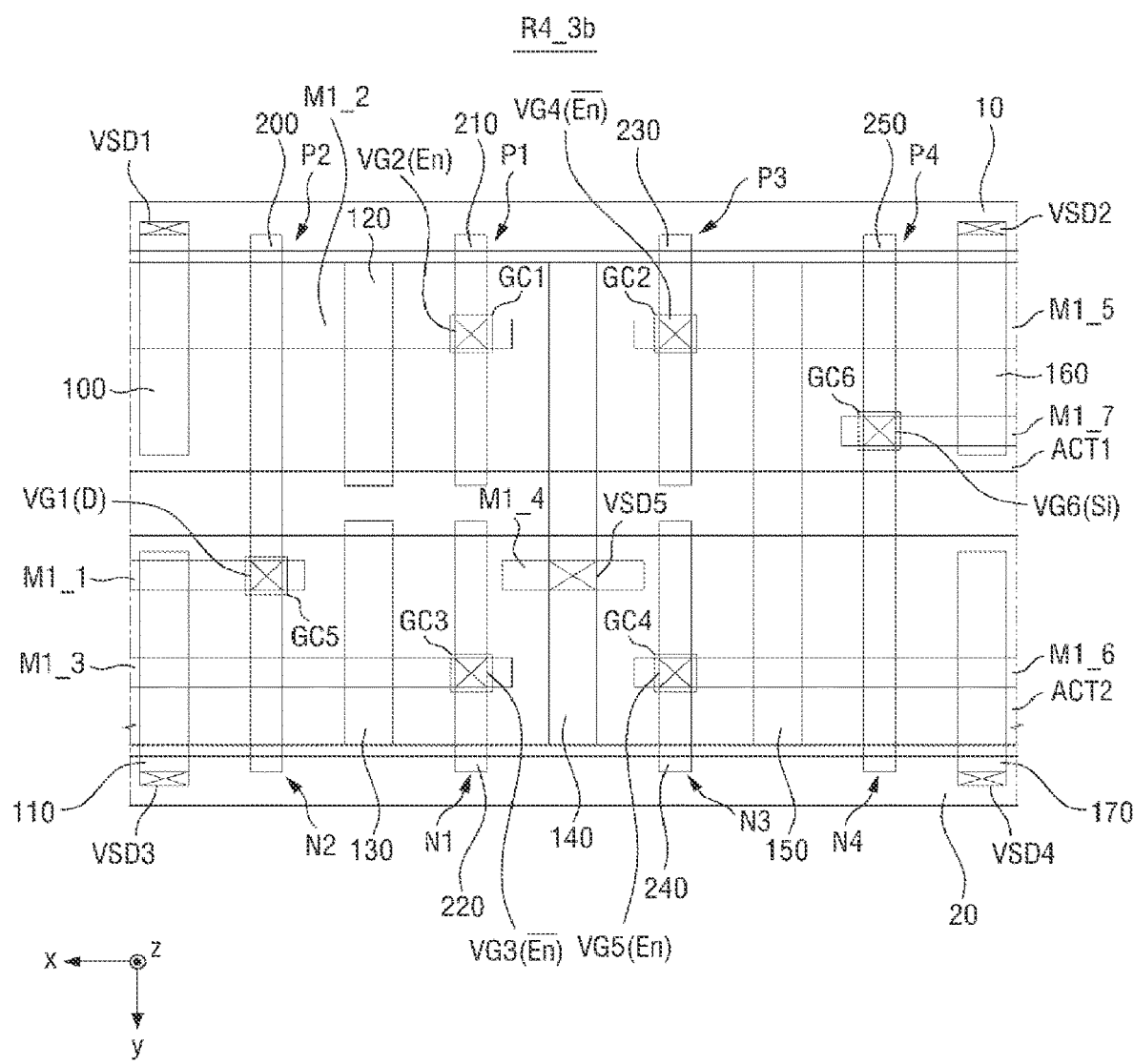

FIGS. 43 and 44 are layout diagrams of FIG. 42 according to some example embodiments. Hereinafter, in order to avoid duplicate descriptions, the common parts of FIGS. 43 and 44 are described only through FIG. 43, and only the differences will be briefly described with reference to the corresponding drawings. In addition, for simplicity of the description, a layout diagram of a region R4_3 of the master latch M_L3 will be mainly described.

When region R4_3a of the region R4_3 is described with reference to FIG. 43, first to fourth PMOS transistors P1 to P4 may be disposed on a first active region ACT1 extending in a first direction x. Further, first to fourth NMOS transistors N1 to N4 may be formed on a second active region ACT2 extending in the first direction x and disposed to be spaced apart from the first active region ACT1 in a second direction y.

A power rail 10 may be disposed at an upper portion of the first active region ACT1 in the second direction y. In addition, a ground rail 20 may be disposed at a lower portion of the second active region ACT2 in the second direction y.

The region R4_3a of the region R4_3 of the master latch M_L3 including the integrated circuit according to some example embodiments may include a plurality of gate structures and a plurality of source/drain contacts extending in the second direction y and disposed to be spaced apart from each other in the first direction x.

For example, a first source/drain contact 100 and a second source/drain contact 110 may be disposed on the first active region ACT1 and the second active region ACT2, respectively, to be spaced apart from each other in the second direction y. That is, the first source/drain contact 100 may be connected to the power rail 10 through a first source/drain contact via VSD1 to supply the power voltage to the second PMOS transistor P2. In addition, the second source/drain contact 110 may be connected to the ground rail 20 through a third source/drain contact via VSD3 to ground the second NMOS transistor N2.

A first gate structure 200 is disposed to be spaced apart from the first and second source/drain contacts 100 and 110 in the first direction x. The first gate structure 200 may be disposed on the first active region ACT1 and the second active region ACT2.

A third source/drain contact 120 and a fourth source/drain contact 130 may be disposed on the first active region ACT1 and the second active region ACT2, respectively, to be spaced apart from each other in the second direction y and to be spaced apart from the first gate structure 200 in the first direction x.

A second gate structure 210 may be disposed on the first active region ACT1 to be spaced apart from the third source/drain contact 120 and the fourth source/drain contact 130 in the first direction x. In addition, a third gate structure 220 may be disposed on the second active region ACT2 to be spaced apart from the third source/drain contact 120 and the fourth source/drain contact 130 in the first direction x.

A fifth source/drain contact 140 may be disposed to extend in the second direction y and to be spaced apart from the second gate structure 210 and the third gate structure 220 in the first direction x. A drain of the first PMOS transistor P1 may be connected to a drain of the first NMOS transistor N1 through the fifth source/drain contact 140. In addition, a drain of the third PMOS transistor P3 may be connected to a source of the third NMOS transistor N3 through the fifth source/drain contact 140. That is, the drain of the first PMOS transistor P1, the drain of the first NMOS transistor N1, the drain of the third PMOS transistor P3, and the source of the third NMOS transistor N3 may be connected to each other through the fifth source/drain contact 140. By connecting a plurality of transistors through one source/drain contact (e.g., the fifth source/drain contact 140), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A fourth gate structure 230 may be disposed on the first active region ACT1 to be spaced apart from the fifth source/drain contact 140 in the first direction x. In addition, a fifth gate structure 240 may be disposed on the second active region ACT2 to be spaced apart from the fifth source/drain contact 140 in the first direction x.

A sixth source/drain contact 150 may be disposed to be spaced apart from the fourth gate structure 230 and the fifth gate structure 240 in the first direction x. The sixth source/drain contact 150 may extend in the second direction y and may be disposed on the first active region ACT1 and the second active region ACT2. That is, a source of the third PMOS transistor P3 and a drain of the third NMOS transistor N3 may be connected to each other through the sixth source/drain contact 150. In addition, a drain of the fourth PMOS transistor P4 may be connected to a drain of the fourth NMOS transistor N4 through the sixth source/drain contact 150. That is, the source of the third PMOS transistor P3, the drain of the third NMOS transistor N3, the drain of the fourth PMOS transistor P4, and the drain of the fourth NMOS transistor N4 may be connected to each other through the sixth source/drain contact 150. By connecting a plurality of transistors through one source/drain contact (e.g., the sixth source/drain contact 150), the height of the integrated circuit according to some example embodiments may be lowered.

Thus, the stability of a process for designing a semiconductor integrated circuit including the integrated circuit according to some example embodiments may be improved. In addition, the degree of freedom of a metal line may be increased, and pin congestion may be reduced.

A sixth gate structure 250 may be disposed on the first active region ACT1 and the second active region ACT2 to be spaced apart from the sixth source/drain contact 150 in the first direction x. In addition, a seventh source/drain contact 160 may be disposed on the first active region ACT1 to be spaced apart from the sixth gate structure 250 in the first direction x. The seventh source/drain contact 160 may be connected to the power rail 10 through a second source/drain contact via VSD2 to supply the power voltage to the fourth PMOS transistor P4. In addition, an eighth source/drain contact 170 may be disposed on the second active region ACT2 to be spaced apart from the sixth gate structure 250 in the first direction x. The eighth source/drain contact 170 may be connected to the ground rail 20 through a fourth source/drain contact via VSD4 to ground the fourth NMOS transistor N4.

Next, the structure and operation in which the signal is applied, together with structures extending in a third direction z, will be described.

A fifth gate contact GC5 extending in the third direction z may be disposed on the first gate structure 200. In addition, a first gate contact via VG1 extending in the third direction z may be disposed on the fifth gate contact GC5. The first gate contact via VG1 may be connected to a first_first metal line M1_1 extending in the first direction x. That is, the first gate structure 200 may be electrically connected to the first_first metal line M1_1, the first gate contact via VG1, and the fifth gate contact GC5 to receive the data signal D. Thus, the second PMOS transistor P2 and the second NMOS transistor N2 may be gated through the data signal D.

The fifth gate contact GC5 and the first gate contact via VG1, which are electrically connected to the first gate structure 200, are illustrated in this drawing as being disposed on the first active region ACT1, but are not limited thereto, and may be disposed on the second active region ACT2 as illustrated in FIG. 44.

A first gate contact GC1 extending in the third direction z may be disposed on the second gate structure 210. In addition, a second gate contact via VG2 extending in the third direction z may be disposed on the first gate contact GC1. The second gate contact via VG2 may be connected to a first_second metal line M1_2 extending in the first direction x. That is, the second gate structure 210 may be electrically connected to the first_second metal line M1_2, the second gate contact via VG2, and the first gate contact GC1 to receive the first clock signal En. Thus, the first PMOS transistor P1 may be gated through the first clock signal En.

The positions of the first gate contact GC1 and the second gate contact via VG2, which are electrically connected to the second gate structure 210, are not limited thereto.

A third gate contact GC3 extending in the third direction z may be disposed on the third gate structure 220. In addition, a third gate contact via VG3 extending in the third direction z may be disposed on the third gate contact GC3. The third gate contact via VG3 may be connected to a first_third metal line M1_3 extending in the first direction x. That is, the third gate structure 220 may be electrically connected to the first_third metal line M1_3, the third gate contact via VG3, and the third gate contact GC3 to receive the second clock signal En. Thus, the first NMOS transistor N1 may be gated through the second clock signal En.

The positions of the third gate contact GC3 and the third gate contact via VG3, which are electrically connected to the third gate structure 220, are not limited thereto.

A second gate contact GC2 extending in the third direction z may be disposed on the fourth gate structure 230. In addition, a fourth gate contact via VG4 extending in the third direction z may be disposed on the second gate contact GC2. The fourth gate contact via VG4 may be connected to a first_fifth metal line M1_5 extending in the first direction x. That is, the fourth gate structure 230 may be electrically connected to the first_fifth metal line M1_5, the fourth gate contact via VG4, and the second gate contact GC2 to receive the second clock signal $\overline{En}$. Thus, the third PMOS transistor P3 may be gated through the second clock signal $\overline{En}$.

The positions of the second gate contact GC2 and the fourth gate contact via VG4, which are electrically connected to the fourth gate structure 230, are not limited thereto.

A fourth gate contact GC4 extending in the third direction z may be disposed on the fifth gate structure 240. In addition, a fifth gate contact via VG5 extending in the third direction z may be disposed on the fourth gate contact GC4. The fifth gate contact via VG5 may be connected to a first_sixth metal line M1_6 extending in the first direction x. That is, the fifth gate structure 240 is electrically connected to the first_sixth metal line M1_6, the fifth gate contact via VG5, and the fourth gate contact GC4 to receive the first clock signal En. Thus, the third NMOS transistor N3 may be gated through the first clock signal En.

The positions of the fourth gate contact GC4 and the fifth gate contact via VG5, which are electrically connected to the fifth gate structure 240, are not limited thereto.

A sixth gate contact GC6 extending in the third direction z may be disposed on the sixth gate structure 250. In addition, a sixth gate contact via VG6 extending in the third direction z may be disposed on the sixth gate contact GC6. The sixth gate contact via VG6 may be connected to a first_seventh metal line M1_7 extending in the first direction x. That is, the sixth gate structure 250 may be electrically connected to the first_seventh metal line M1_7, the sixth gate contact via VG6, and the sixth gate contact GC6 to receive the scan input signal Si. Thus, the fourth PMOS transistor P4 and the fourth NMOS transistor N4 may be gated through the scan input signal Si.

The sixth gate contact GC6 and the sixth gate contact via VG6, which are electrically connected to the sixth gate structure 250, are illustrated in this drawing as being disposed on the first active region ACT1, but are not limited thereto, and may be disposed on the second active region ACT2 as illustrated in FIG. 44.

A fifth source/drain contact via VSD5 extending in the third direction z may be disposed on the fifth source/drain contact 140. In addition, a first_fourth metal line M1_4 extending in the first direction x may be disposed on the fifth source/drain contact via VSD5 and may be connected to the outside.

The fifth source/drain contact via VSD5, which is electrically connected to the fifth source/drain contact 140, is illustrated in this drawing as being disposed on the first active region ACT1, but is not limited thereto, and may be disposed on the second active region ACT2 as illustrated in FIG. 44.

The plurality of gate structures (e.g., the first to sixth gate structures 200 to 250) and the plurality of source/drain contacts (e.g., the first to eighth source/drain contacts 100 to 170), which are disposed to be adjacent to each other in the first direction x, may be spaced apart from each other by 1 CPP. As an example, the first gate structure 200 and the first source/drain contact 100 adjacent to each other may be spaced apart from each other by 1 CPP.

For example, assume that the first gate structure 200 and the first source/drain contact 100 are adjacent to each other. When the distance between a center line of the first gate structure 200 extending in the second direction y and a center line of the first source/drain contact 100 extending in the second direction y is 1 CPP, it means that the other gate structure or source/drain contact is not disposed between the first gate structure 200 and the first source/drain contact 100.

Further, the metal lines (e.g., the first_first to first_seventh metal lines M1_1 to M1_7), which are disposed to be adjacent to each other in the second direction y, may be spaced apart from each other by 1 CPP. As an example, the first_first metal line M1_1 and the first_third metal line M1_3 adjacent to each other may be spaced apart from each other by 1 CPP.

For example, assume that the first_first metal line M1_1 and the first_third metal line M1_3 are adjacent to each other. When the distance between a center line of the first_first metal line M1_1 extending in the first direction x and a center line of the first_third metal line M1_3 extending in the first direction x is 1 CPP, it means that the other metal line is not disposed between the first_first metal line M1_1 and the first_third metal line M13.

In concluding the detailed description, those skilled in the art will appreciate that many variations and modifications may be made to the example embodiments without substantially departing from the principles of the present inventive concepts. Therefore, the disclosed example embodiments are used in a generic and descriptive sense only and not for purposes of limitation.

What is claimed is:

1. An integrated circuit comprising:
   a first inverter including a first p-channel metal-oxide-semiconductor (PMOS) transistor and a first n-channel metal-oxide-semiconductor (NMOS) transistor, which are gated through a first metal line to which a first input voltage is configured to be applied, and configured to output a first inverted voltage by inverting the first input voltage, wherein a drain of the first NMOS transistor and a drain of the first PMOS transistor are routed through a first source/drain contact, a first metal line extends in a first direction, and the first source/drain contact extends in a second direction perpendicular to the first direction;
   a first transmission gate including a second PMOS transistor gated through a second metal line to which a first active voltage is configured to be applied and a second NMOS transistor gated through a third metal line to which a second active voltage is configured to be applied, wherein a source of the second PMOS transistor and a drain of the second NMOS transistor are routed through the first source/drain contact, and a drain of the second PMOS transistor and a source of the second NMOS transistor are routed through a second source/drain contact; and
   a first tri-state inverter including a third PMOS transistor gated through a fourth metal line to which the second active voltage is configured to be applied, a third NMOS transistor gated through a fifth metal line to which the first active voltage is configured to be applied, and a fourth PMOS transistor and a fourth NMOS transistor, which are gated through a sixth metal line to which a second input voltage is configured to be applied, and configured to invert the second input voltage, wherein a drain of the third PMOS transistor and a drain of the third NMOS transistor are routed through the second source/drain contact.

2. The integrated circuit of claim 1, further comprising:
a first active region extending in the first direction and including the first to fourth PMOS transistors;
a second active region extending in the first direction and including the first to fourth NMOS transistors;
a power rail extending in the first direction and configured to supply a power voltage to the first PMOS transistor and the fourth PMOS transistor; and
a ground rail extending in the first direction and configured to supply a ground voltage to the first NMOS transistor and the fourth NMOS transistor,
wherein the first active region and the second active region are spaced apart from each other by a first distance in the second direction intersecting the first direction,
the first active region and the power rail are spaced apart from each other by a second distance in the second direction, and
the second active region and the ground rail are spaced apart from each other by a third distance in the second direction.

3. The integrated circuit of claim 2, wherein the second distance is equal to the third distance.

4. The integrated circuit of claim 2, wherein a sum of the second distance and the third distance is greater than the first distance.

5. The integrated circuit of claim 2, wherein a sum of the second distance and the third distance is less than the first distance.

6. The integrated circuit of claim 1, further comprising:
a first gate contact configured to apply the first input voltage to the first metal line;
a second gate contact configured to apply the first active voltage to the second metal line;
a third gate contact configured to apply the second active voltage to the third metal line;
a fourth gate contact configured to apply the second active voltage to the fourth metal line;
a fifth gate contact configured to apply the first active voltage to the fifth metal line; and
a sixth gate contact configured to apply the second input voltage to the sixth metal line.

7. The integrated circuit of claim 6, wherein heights of the second gate contact and the fourth gate contact in the second direction are equal to each other.

8. The integrated circuit of claim 6, wherein heights of the second gate contact and the fourth gate contact in the second direction are different from each other.

9. The integrated circuit of claim 6, wherein heights of the fourth gate contact and the sixth gate contact in the second direction are different from each other.

10. The integrated circuit of claim 6, wherein heights of the fourth gate contact and the sixth gate contact in the second direction are equal to each other.

11. The integrated circuit of claim 6, wherein heights of the first gate contact and the sixth gate contact in the second direction are different from each other.

12. The integrated circuit of claim 1, further comprising:
a first active region extending in the first direction and including the first to fourth PMOS transistors, wherein a first gate contact configured to apply the first input voltage to the first metal line, a second gate contact configured to apply the first active voltage to the second metal line, and a fourth gate contact configured to apply the second active voltage to the fourth metal line are on the first active region;
a second active region extending in the first direction and including the first to fourth NMOS transistors, wherein a third gate contact configured to apply the second active voltage to the third metal line, a fifth gate contact configured to apply the first active voltage to the fifth metal line, and a sixth gate contact configured to apply the second input voltage to the sixth metal line are on the second active region;
a power rail extending in the first direction and configured to supply a power voltage to the first PMOS transistor and the fourth PMOS transistor; and
a ground rail extending in the first direction and configured to supply a ground voltage to the first NMOS transistor and the fourth NMOS transistor,
wherein the first active region and the power rail are spaced apart from each other by a first distance in the second direction, and
the second active region and the ground rail are spaced apart from each other by a second distance in the second direction.

13. The integrated circuit of claim 12, wherein
the power rail and the first gate contact are spaced apart from each other by a third distance in the second direction,
the power rail and the second gate contact are spaced apart from each other by a fourth distance in the second direction,
the power rail and the fourth gate contact are spaced apart from each other by a fifth distance in the second direction, and
the shortest distance among the third to fifth distances is greater than the first distance.

14. The integrated circuit of claim 12, wherein
the power rail and the third gate contact are spaced apart from each other by a third distance in the second direction,
the power rail and the fifth gate contact are spaced apart from each other by a fourth distance in the second direction,
the power rail and the sixth gate contact are spaced apart from each other by a fifth distance in the second direction, and
the shortest distance among the third to fifth distances is greater than the second distance.

* * * * *